(12) United States Patent
Yoo et al.

(10) Patent No.: US 6,960,484 B2
(45) Date of Patent: Nov. 1, 2005

(54) METHOD OF MANUFACTURING LIQUID CRYSTAL DISPLAY DEVICE

(75) Inventors: Soon-Sung Yoo, Gunpo-si (KR); Youn-Gyoung Chang, Uigwang-si (KR); Heung-Lyul Cho, Suwon-si (KR); Seung-Hee Nam, Daejeon (KR)

(73) Assignee: LG.Philips LCD Co., Ltd., Seoul (KR)

( * ) Notice: Subject to any disclaimer, the term of this patent is extended or adjusted under 35 U.S.C. 154(b) by 20 days.

(21) Appl. No.: 10/733,371

(22) Filed: Dec. 12, 2003

(65) Prior Publication Data

US 2004/0126917 A1 Jul. 1, 2004

(30) Foreign Application Priority Data

Dec. 30, 2002 (KR) .................. 10-2002-0087251

(51) Int. Cl.$^7$ ............................ H01L 21/00; G02F 1/13
(52) U.S. Cl. ................................. 438/30; 349/187
(58) Field of Search ............................ 438/22, 26, 27, 438/28, 29, 30, 38, 106, 116; 349/187, 189

Primary Examiner—Evan Pert
(74) Attorney, Agent, or Firm—McKenna Long & Aldridge LLP

(57) ABSTRACT

A method of manufacturing a liquid crystal display device includes steps of forming a gate line, a gate pad and a gate electrode on a first substrate through a first mask process, forming a data line, a data pad, a source electrode, a drain electrode and an active layer on the first substrate including the gate line, the gate pad and the gate electrode through a second mask process, forming a pixel electrode and a data pad terminal on the first substrate including the data line, the data pad, the source electrode and the drain electrode through a third mask process, forming a passivation layer on an entire surface of the first substrate including the pixel electrode and the data pad terminal, attaching the first substrate including the passivation layer with a second substrate, wherein a gate pad portion including the gate pad and a data pad portion including the data pad are exposed by the second substrate, providing a liquid crystal material into a gap between the first and second substrates, and removing the passivation layer in the gate and data pad portions exposed by the second substrate.

38 Claims, 54 Drawing Sheets ashing

METHOD OF MANUFACTURING LIQUID CRYSTAL DISPLAY DEVICE

This application claims the benefit of Korean Patent Application No. 2002-087251, filed in Korea on Dec. 30, 2002, which is hereby incorporated by reference for all purposes as if fully set forth herein.

BACKGROUND OF THE INVENTION

1. Field of the Invention

The present invention relates to a liquid crystal display (LCD) device and more particularly, to a method of manufacturing the liquid crystal display device.

2. Discussion of the Related Art

A liquid crystal display (LCD) device is driven based on the optical anisotropy and polarization characteristics of a liquid crystal material. In general, the LCD device includes two substrates, which are spaced apart and facing each other, and a liquid crystal layer interposed between the two substrates. Each of the substrates includes an electrode, and the electrodes of each substrate are also facing each other. Voltage is applied to each electrode, and thus an electric field is induced between the electrodes. Alignment of the liquid crystal molecules is changed by the varying intensity or direction of the electric field. The LCD device displays a picture by varying transmittance of the light according to the arrangement of the liquid crystal molecules.

An active matrix liquid crystal display (AMLCD) device, which includes thin film transistors as a switching device for a plurality of pixels, has been widely used due to its high resolution and fast moving images.

A related art LCD device will be described hereafter in detail with reference to figures.

FIG. 1 is a schematic solid view illustrating a related art LCD device. In the LCD device, upper and lower substrates 10 and 30 are spaced apart from and facing each other, and a liquid crystal layer 50 is interposed between the upper substrate 10 and the lower substrate 30.

At least one gate line 32 and at least one data line 34 are formed on the inner surface of the lower substrate 30 (i.e., the side facing the upper substrate 10). The gate line 32 and the date line 34 cross each other to define a pixel region P. A thin film transistor T, as a switching element, is formed at the crossing of the gate line 32 and the data line 34. Although not shown in detail in the figure, the thin film transistor T includes a gate electrode, a source electrode, a drain electrode, and an active layer. A plurality of such thin film transistors T is arranged in a matrix form to correspond to other crossings of gate and data lines. A pixel electrode 46, which is connected to the thin film transistor T, is formed in the pixel region P.

The upper substrate 10 includes a black matrix 14, a color filter layer 12, and a common electrode 16 subsequently on the inside (i.e., the side facing the lower substrate 30). The color filter layer 12 reflects light in a specific wavelength range and includes three sub-color filters of red (R), green (G), and blue (B). The black matrix 14 is disposed between the sub-color filters, and blocks light in an area where liquid crystal molecules are not controlled. Each sub-color filter of the color filter layer 12 corresponds to the pixel electrode 46 at the pixel region P.

Upper and lower polarizers 52 and 54, each of which may be a linear polarizer that transmits only linearly polarized light parallel to its light transmission axis, are arranged over outer surfaces of the upper and lower substrates 10 and 30, respectively. In addition, a backlight is disposed over the outer surface of the lower polarizer 54 as a light source.

The lower substrate 30, which includes the thin film transistors T and the pixel electrodes 46 arranged in the matrix form, may be commonly referred to as an array substrate.

FIG. 2 illustrates a plan view of an array substrate for an LCD device according to the related art. In FIG. 2, a gate line 64 is formed in a first direction and a data line 78 is formed in a second direction crossing the first direction. The gate line 64 and the data line 78 cross each other and define a pixel region P. A thin film transistor T is formed as a switching element at the crossing of the gate and data lines 64 and 78. A pixel electrode 94 is formed in the pixel region P. The thin film transistor T includes a gate electrode 62 that is connected to the gate line 64 and receives scanning signals, a source electrode 74 that is connected to the data line 78 and receives data signals, and a drain electrode 76 that is spaced apart from the source electrode 74. The thin film transistor T further includes an active layer 72 between the gate electrode 62 and the source and drain electrodes 74 and 76. The pixel electrode 94 is connected to the thin film transistor T by contacting the drain electrode 76.

A metal pattern 88 of an island shape overlaps the gate line 64. The metal pattern 88 is made of the same material as the data line 78. The pixel electrode 94 also overlaps the gate line 64, and is connected to the metal pattern 88. Thus, the gate line 64 and the metal pattern 88 form a storage capacitor CST with an insulating layer (not shown) interposed therebetween, wherein the overlapped gate line 64 acts as a first electrode of the storage capacitor $C_{ST}$ and the metal pattern 88 functions as a second electrode of the storage capacitor $C_{ST}$.

Additionally, a gate pad 68 is formed at one end of the gate line 64, and a data pad 82 is formed at one end of the data line 78. A gate pad terminal 96 and a data pad terminal 98, which have an island shape and are made of the same material as the pixel electrode 94, overlap the gate pad 68 and the data pad 82, respectively.

FIGS. 3A to 3E, FIGS. 4A to 4E, and FIGS. 5A to 5E are cross-sectional views illustrating a method of manufacturing an array substrate according to the related art. FIGS. 3A to 3E correspond to cross-sections along the line III–III' of FIG. 2, FIGS. 4A to 4E correspond to cross-sections along the line IV–IV' of FIG. 2, and FIGS. 5A to 5E correspond to cross-sections along the line V–V' of FIG. 2.

As illustrated in FIGS. 3A, 4A and 5A, a gate line 64, a gate electrode 62 and a gate pad 68 are formed on a transparent insulating substrate 60 by depositing a first metal layer and patterning the first metal layer through a first mask process that is a photolithography process utilizing photoresist and a mask. Although not shown in the figures, the gate electrode 62 is extended from the gate line 64 and the gate pad 68 is disposed at one end of the gate line 64.

As illustrated in FIGS. 3B, 4B and 5B, a first insulating layer, an amorphous silicon layer, a doped amorphous silicon layer are subsequently deposited on the substrate 60 including the gate line 64, the gate electrode 62 and the gate pad 68 thereon, and the doped amorphous silicon layer and the amorphous silicon layer are patterned through a second mask process. Thus, a doped amorphous silicon pattern 73a and active layer 72 are formed over the gate electrode 62. The first insulating layer acts as a gate insulating layer 70.

As illustrated in FIGS. 3C, 4C and 5C, a data line 78, a source electrode 74, a drain electrode 76, a metal pattern 80 and a data pad 82 are formed on the substrate 60 including the doped amorphous silicon layer 73a of FIG. 3B and the active layer 72 thereon by depositing a second metal layer and patterning it through a third mask process. The source and drain electrodes 74 and 76 are disposed over the active layer 72, spaced apart. The metal pattern 80 partially overlaps the gate line 64. Although not shown in the figures, the data line 78 crosses the gate line 64 and the data pad 82 is disposed at one end of the data line 78.

Next, the doped amorphous silicon layer 73a of FIG. 3B exposed between the source and drain electrodes 74 and 76 is removed. Thus, an ohmic contact layer 73 is completed and the active layer 72 is exposed. An exposed portion of the active layer 72 becomes a channel ch of a thin film transistor T, which includes the gate electrode 62, the source electrode 74, the drain electrode 76, and the active layer 72.

As illustrated in FIGS. 3D, 4D and 5D, a second insulating layer is formed on the substrate 60 including the thin film transistor T thereon and is patterned with the gate insulating layer 70 through a fourth mask process, thereby forming a passivation layer 84 that has a drain contact hole 86, a capacitor contact hole 88, a gate pad contact hole 90 and a data pad contact hole 92. The drain contact hole 86, the capacitor contact hole 88, the gate pad contact hole 90 and the data pad contact hole 92 expose the drain electrode 76, the metal pattern 80, the gate pad 68 and the data pad 82, respectively.

Next, as illustrated in FIGS. 3E, 4E and 5E, a pixel electrode 94, a gate pad terminal 96 and a data pad terminal 98 are formed on the passivation layer 84 by depositing a transparent conductive material and patterning the transparent conductive material through a fifth mask process. The pixel electrode 94 is connected to not only the drain electrode 76 via the drain contact hole 86 but also to the metal pattern 80 through the capacitor contact hole 88. The gate pad terminal 96 is connected to the gate pad 68 via the gate pad contact hole 90 and the data pad terminal 98 is connected to the data pad 82 through the data pad contact hole 92. The pixel electrode 94 is formed in the pixel region P. The gate line 64 and the metal pattern 80, which overlap each other, form a storage capacitor $C_{ST}$ with the gate insulating layer 70 interposed between the gate line 64 and the metal pattern 80.

The array substrate is manufactured through five mask processes, and the mask process includes several steps of cleaning, coating a photo-resist layer, exposing through a mask, developing the photo-resist layer, and etching. Therefore, fabricating time, costs, and failure may be decreased by reducing the number of the photolithography processes.

SUMMARY OF THE INVENTION

Accordingly, the present invention is directed to a method of manufacturing a liquid crystal display device that substantially obviates one or more problems due to limitations and disadvantages of the related art.

An advantage of the present invention is to provide a method of manufacturing a liquid crystal display device that increases productivity because of shorter processes and lower cost.

Additional features and advantages of the invention will be set forth in the description which follows, and in part will be apparent from the description, or may be learned by practice of the invention. These and other advantages of the invention will be realized and attained by the structure particularly pointed out in the written description and claims hereof as well as the appended drawings.

To achieve these and other advantages and in accordance with the purpose of the present invention, as embodied and broadly described, a method of manufacturing a liquid crystal display device includes forming a gate line, a gate pad and a gate electrode on a first substrate through a first mask process, forming a data line, a data pad, a source electrode, a drain electrode and an active layer on the first substrate including the gate line, the gate pad and the gate electrode through a second mask process, forming a pixel electrode and a data pad terminal on the first substrate including the data line, the data pad, the source electrode and the drain electrode through a third mask process, forming a passivation layer on an entire surface of the first substrate including the pixel electrode and the data pad terminal, attaching the first substrate including the passivation layer with a second substrate, wherein a gate pad portion including the gate pad and a data pad portion including the data pad are exposed by the second substrate, providing a liquid crystal material into a gap between the first and second substrates, and removing the passivation layer in the gate and data pad portions exposed by the second substrate.

In another aspect of the present invention, a method of manufacturing a liquid crystal display device includes forming a gate line, a gate pad and a gate electrode on a first substrate through a first mask process, forming a data line, a data pad, a source/drain pattern and an active layer on the first substrate including the gate line, the gate pad and the gate electrode through a second mask process, forming a pixel electrode, a data buffer pattern and a data pad terminal on the first substrate including the data line, the data pad, the source/drain pattern through a third mask process, and patterning the source/drain pattern by using the pixel electrode and the data buffer pattern as a mask, thereby forming a source electrode and a drain electrode, forming a passivation layer on an entire surface of the first substrate including the pixel electrode, the data buffer pattern and the data pad terminal, attaching the first substrate including the passivation layer with a second substrate, wherein a gate pad portion including the gate pad and a data pad portion including the data pad are exposed by the second substrate, providing a liquid crystal material into a gap between the first and second substrates, and removing the passivation layer in the gate and pad portions exposed by the second substrate.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE ILLUSTRATED EMBODIMENTS

Reference will now be made in detail to embodiments of the present invention, which are illustrated in the accompanying drawings.

Figure 1:
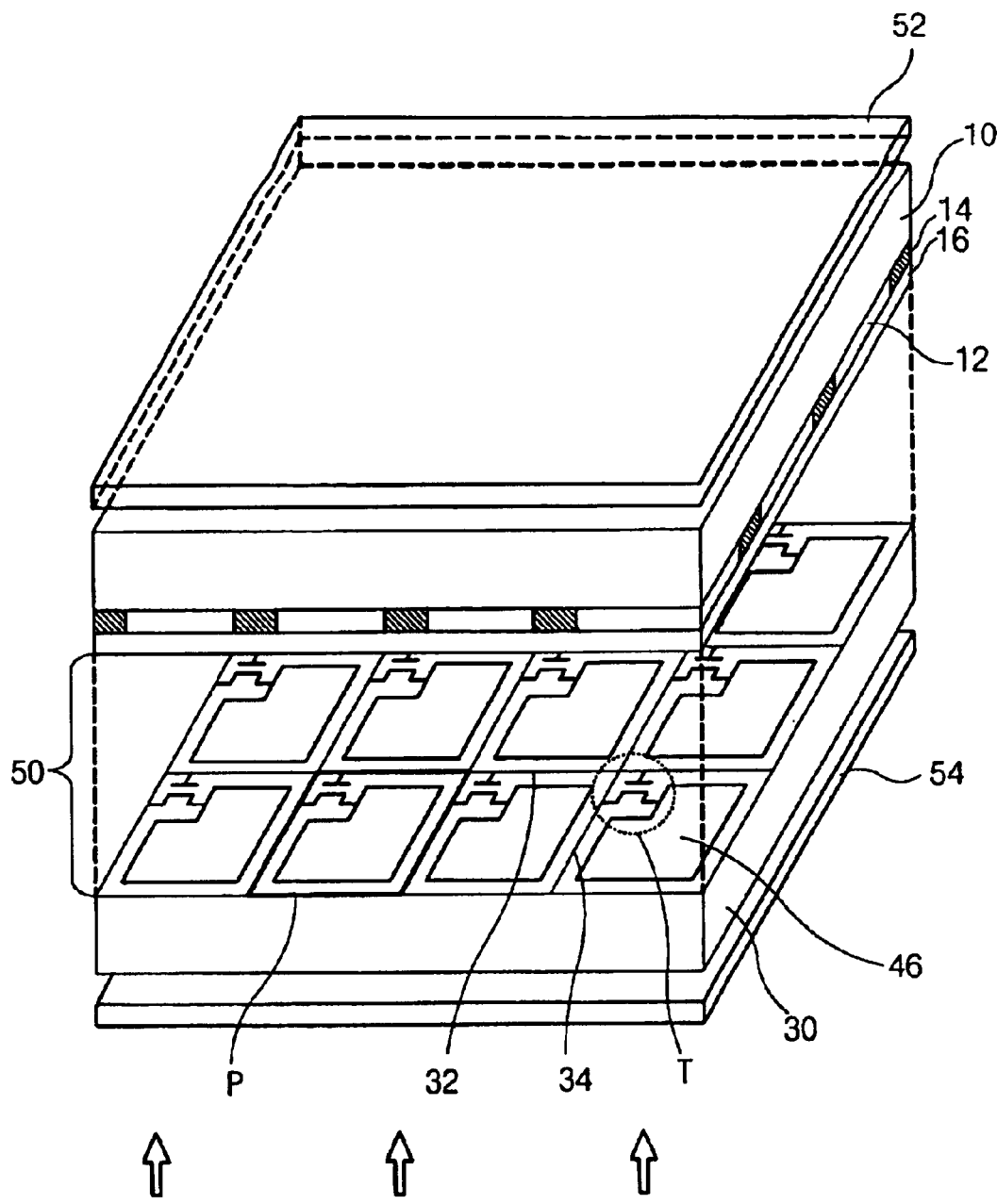
FIG. 1 is a schematic solid view illustrating a related art liquid crystal display device (LCD) device.
Figure 2:
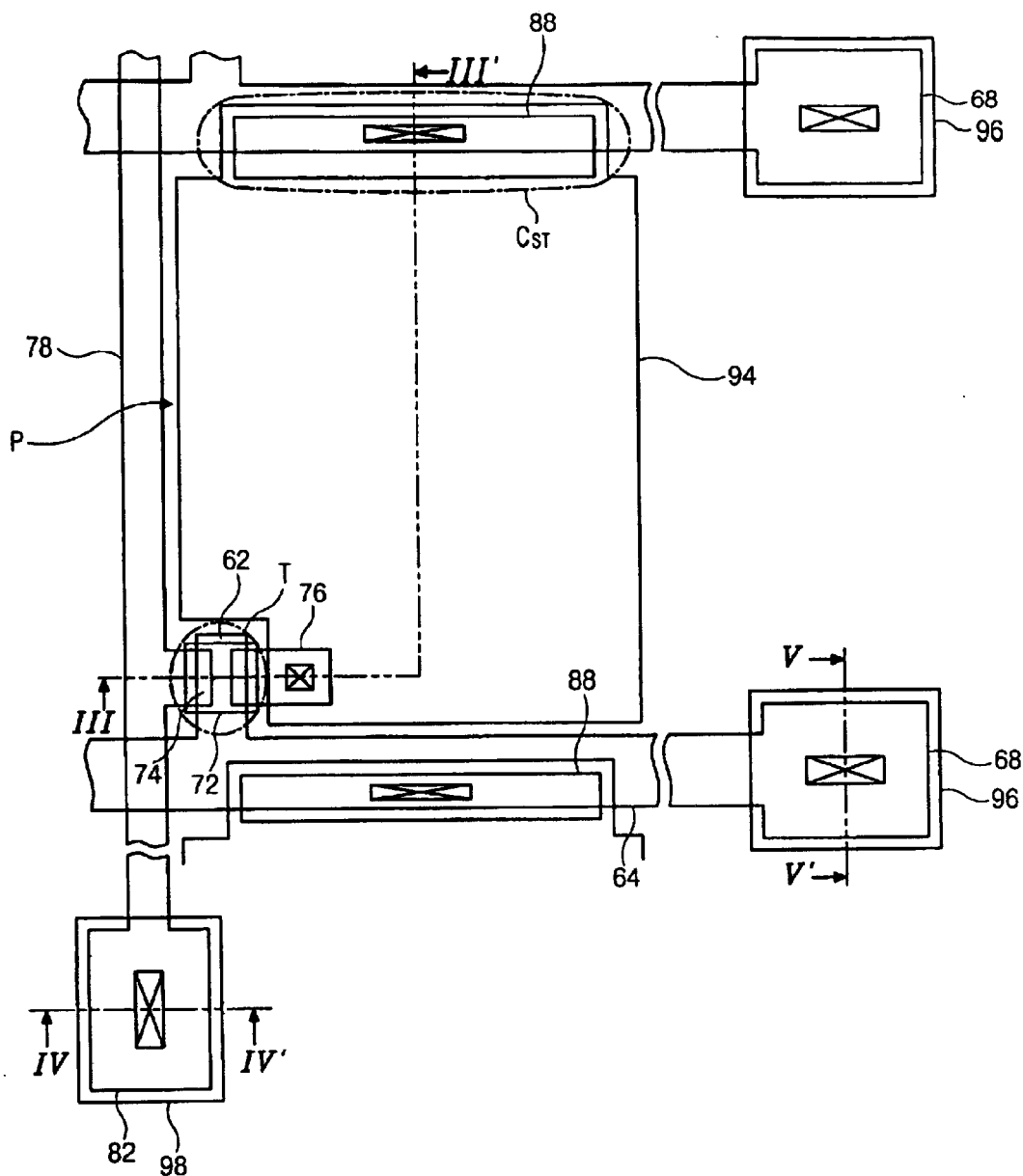
FIG. 2 is a plan view of an array substrate for an LCD device according to the related art.
Figure 3A:
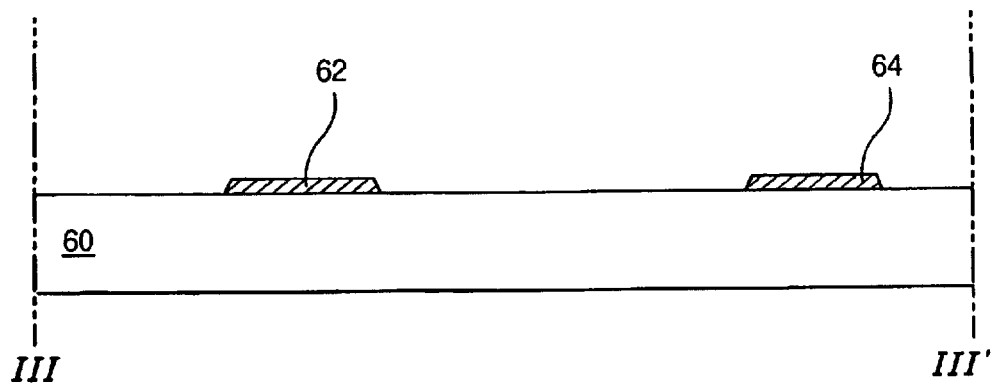
FIGS. 3A to 3E, FIGS. 4A to 4E, and FIGS. 5A to 5E are cross-sectional views illustrating a method of manufacturing an array substrate according to the related art.
Figure 3B:
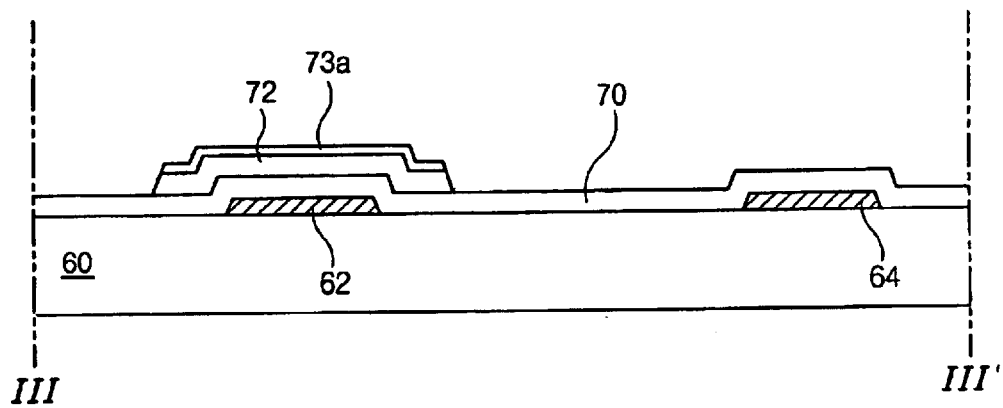
Figure 3C:
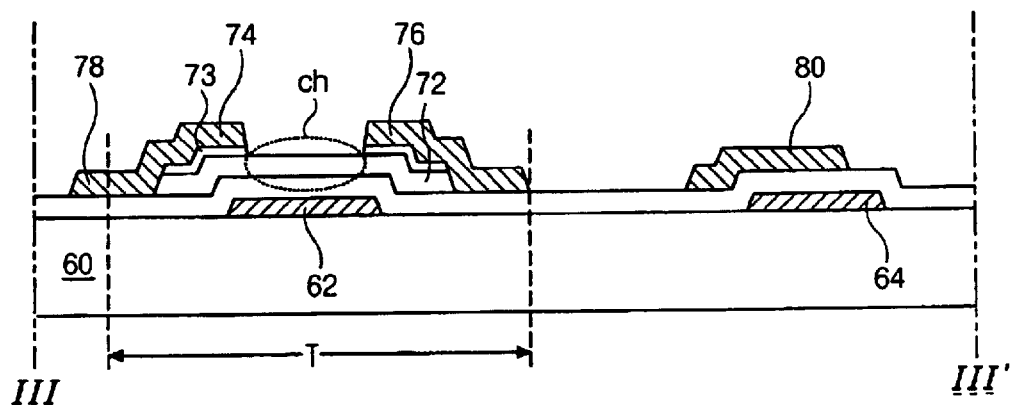
Figure 3D:
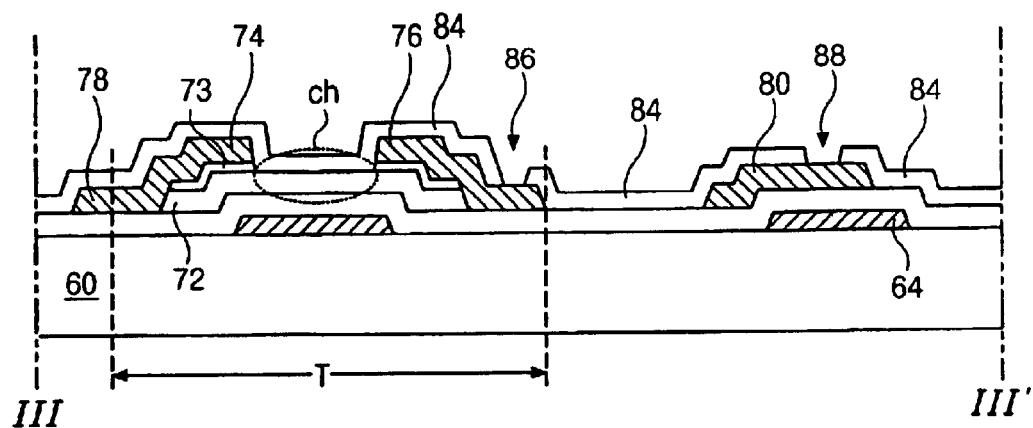
Figure 3E:
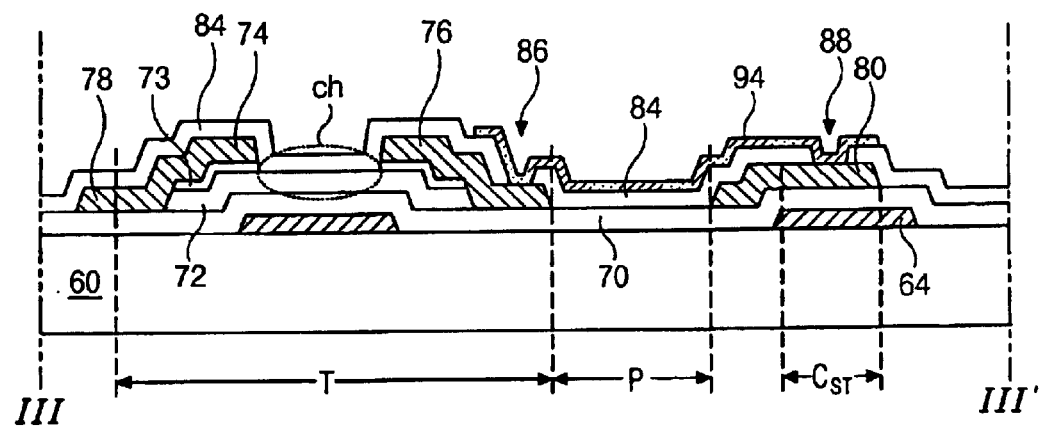
Figure 4A:
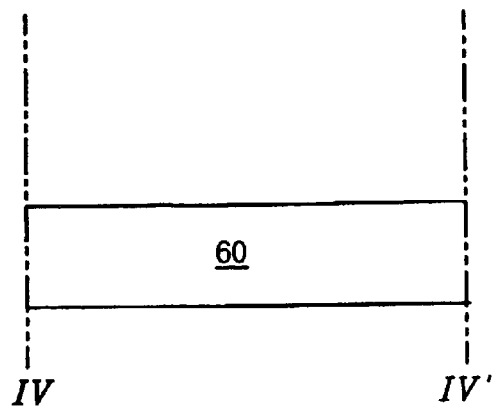
Figure 4B:
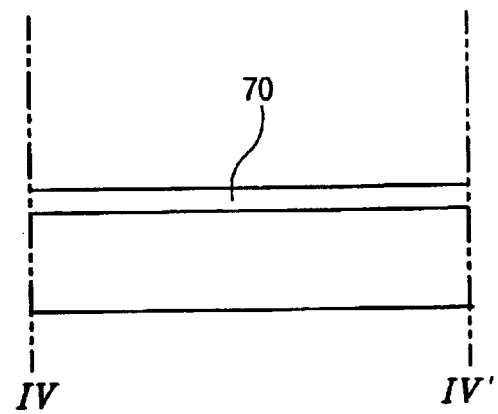
Figure 4C:
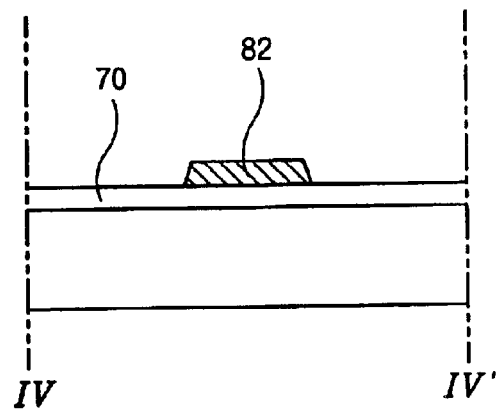
Figure 4D:
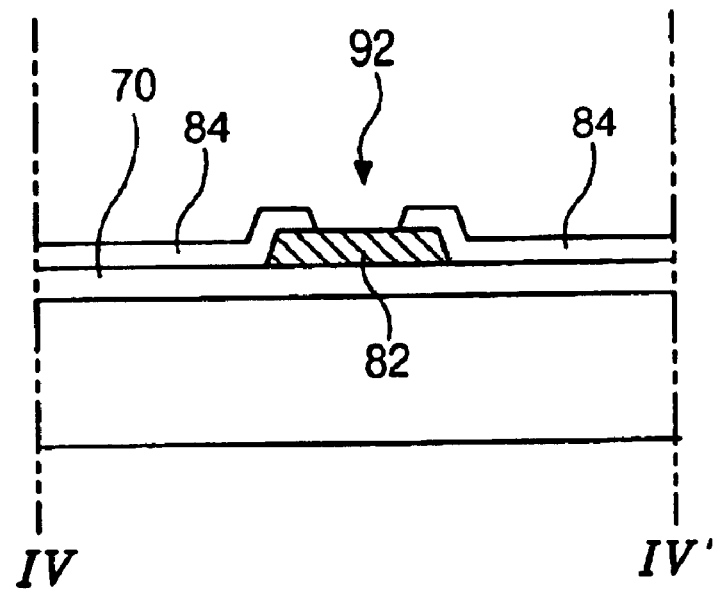
Figure 4E:
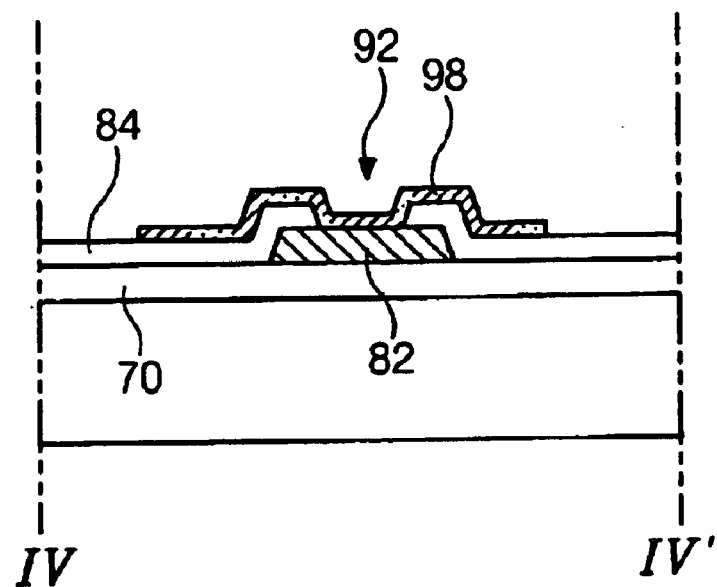
Figure 5A:
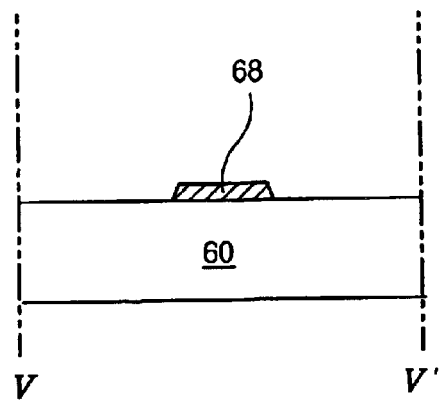
Figure 5B:
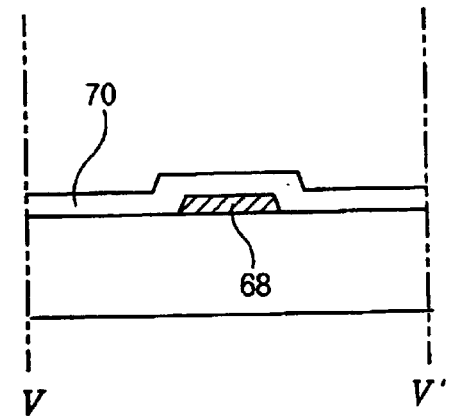
Figure 5C:
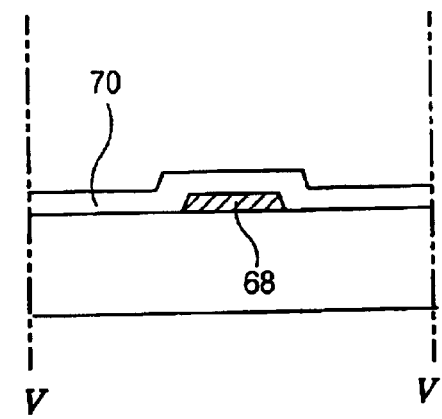
Figure 5D:
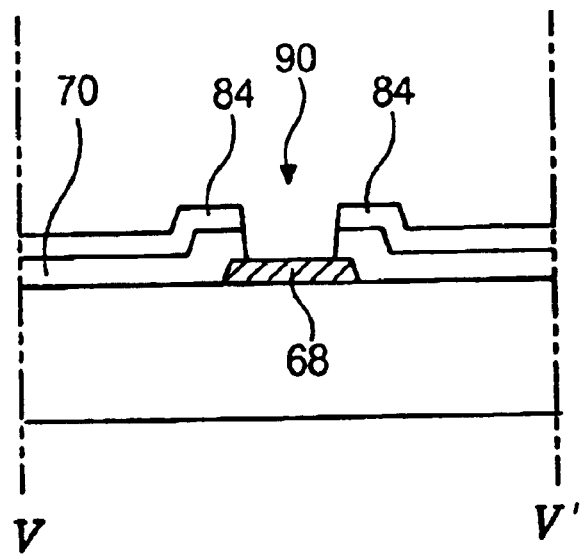
Figure 5E:
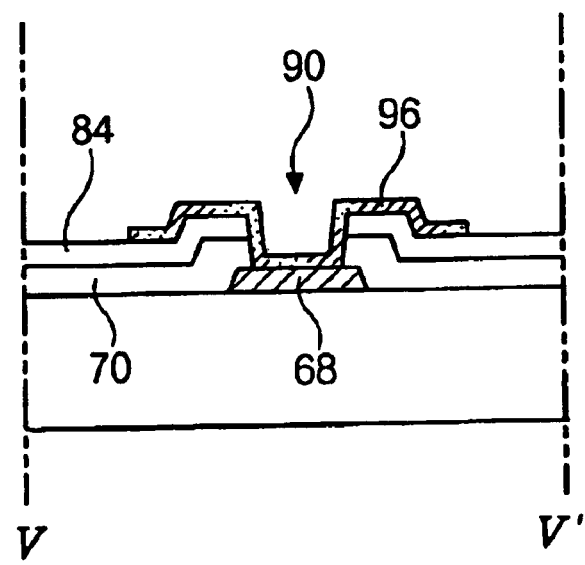
Figure 6A:
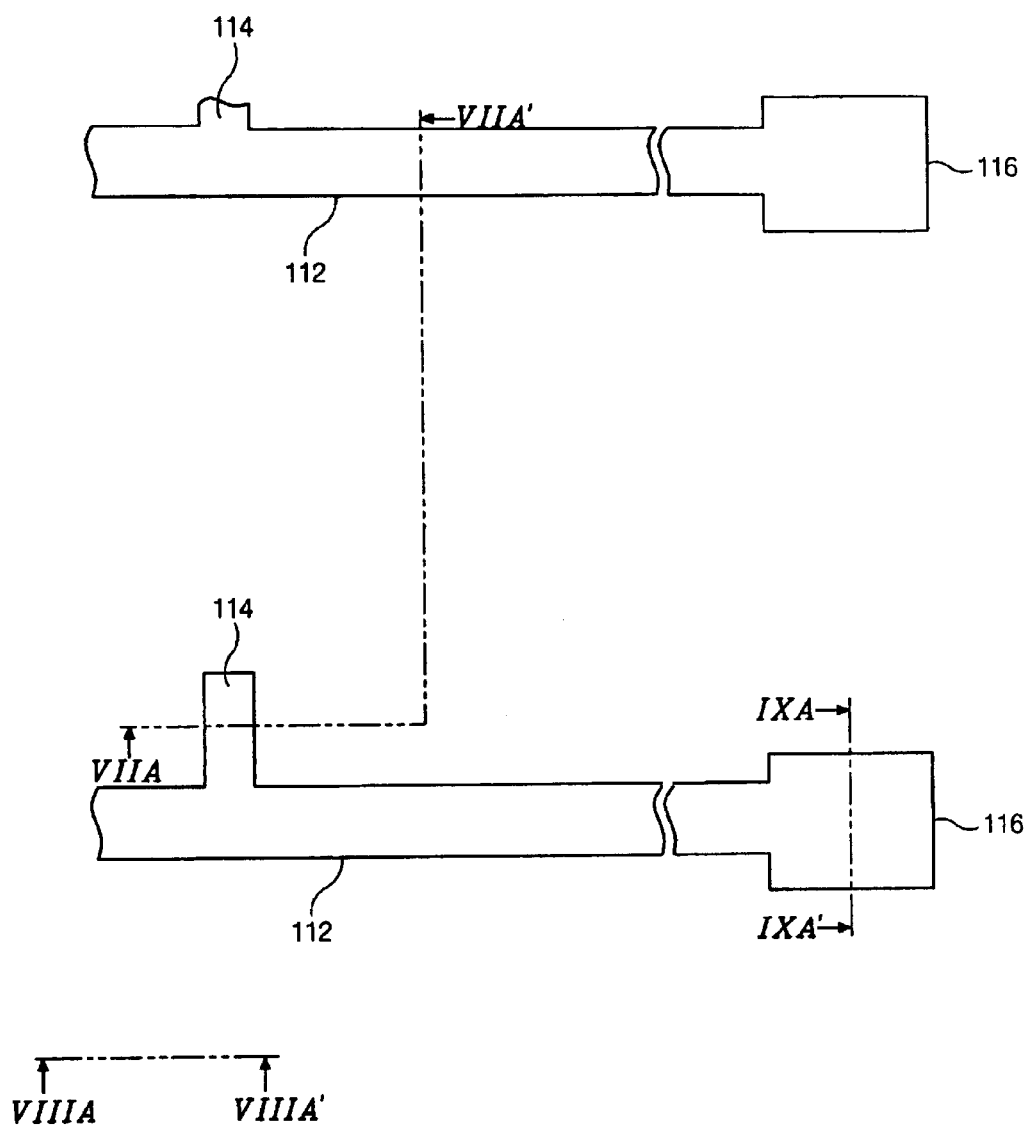
FIGS. 6A to 6C are plan views of showing a fabricating method of an array substrate according to a first embodiment of the present invention.
Figure 6B:
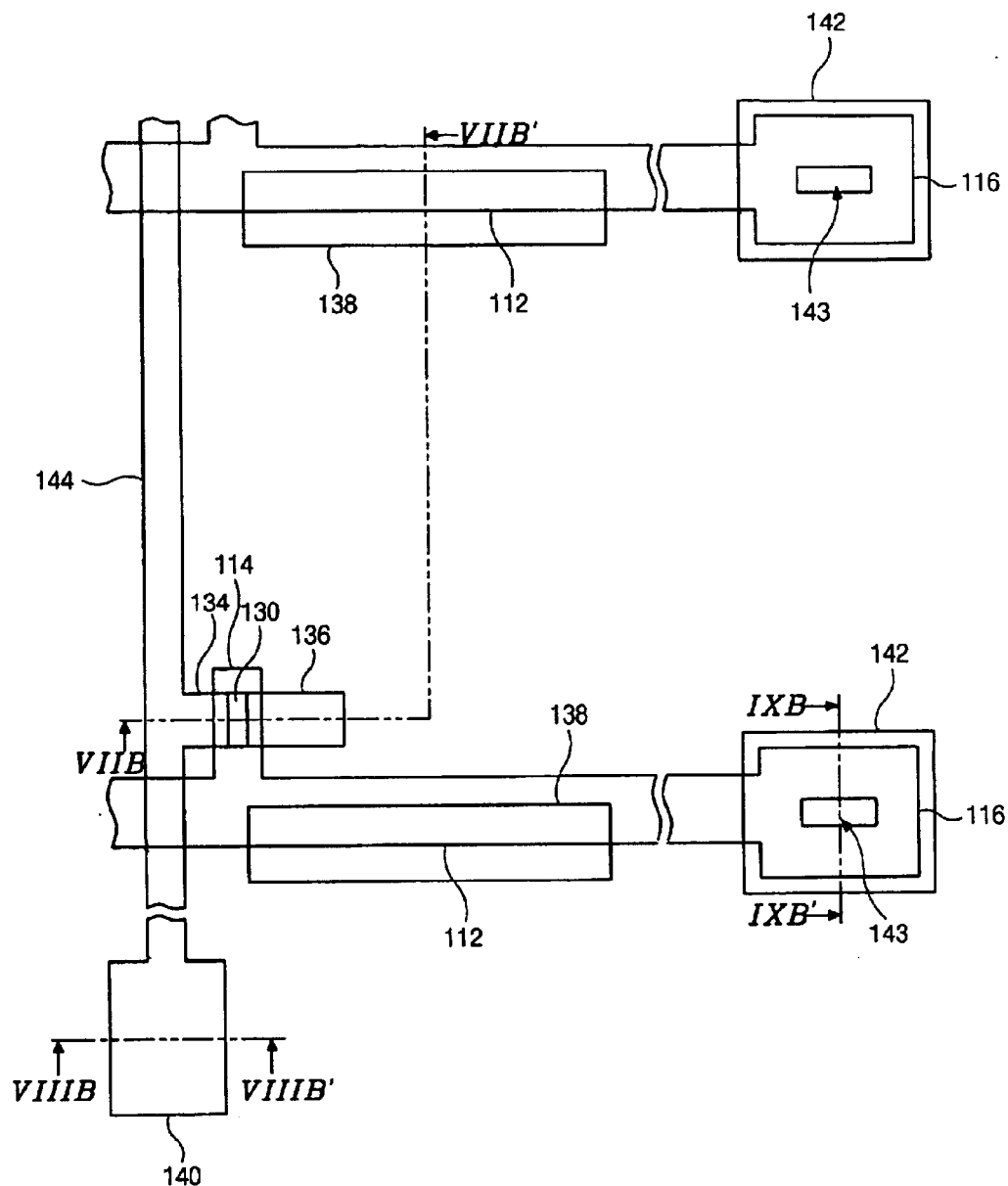
Figure 6C:
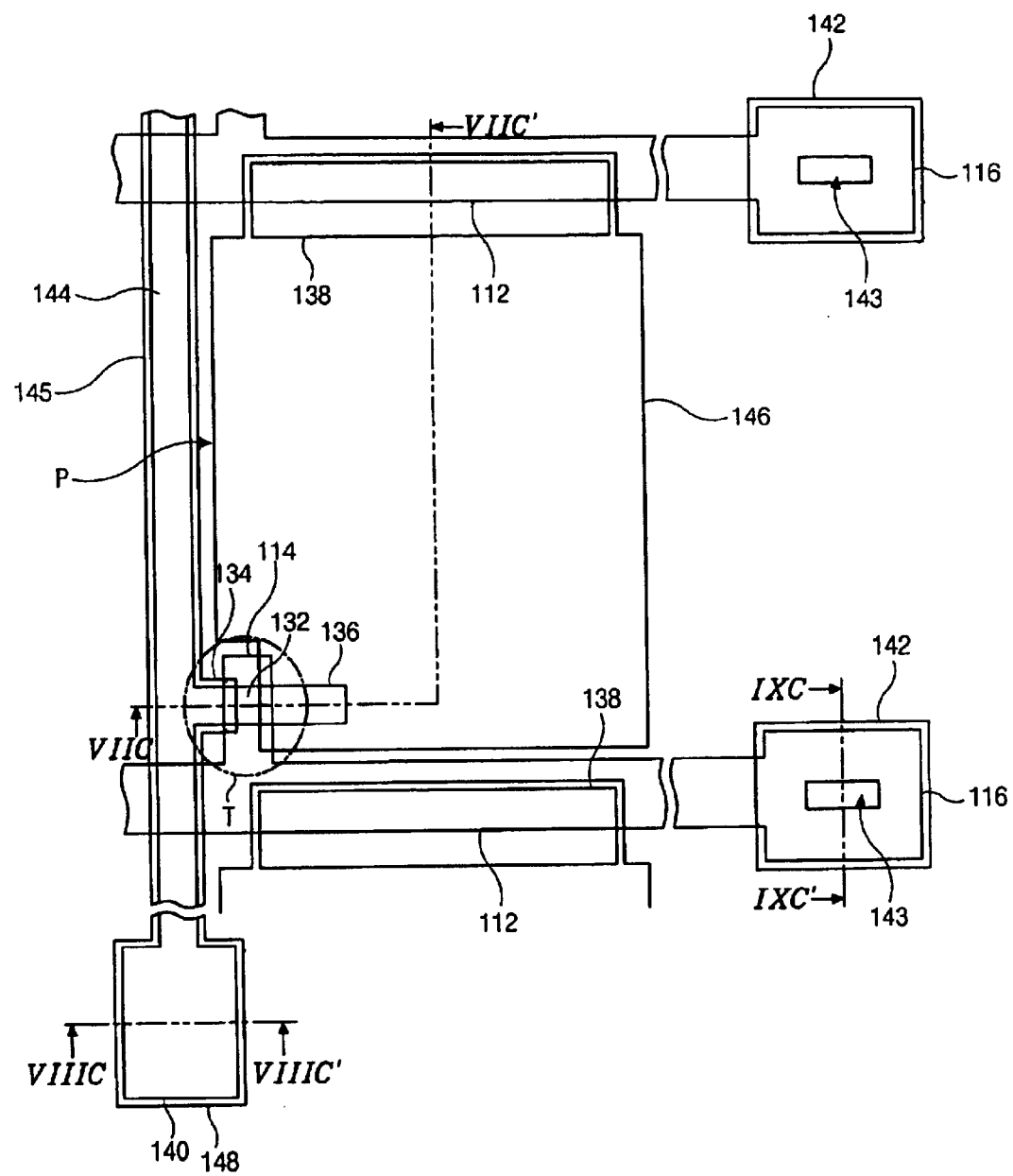

FIGS. 6A to 6C, FIGS. 7A to 7H, FIGS. 8A to 8H, and FIGS. 9A to 9H illustrate a method of manufacturing an array substrate for a liquid crystal display (LCD) device according to a first embodiment of the present invention. FIGS. 6A to 6C are plan views illustrating a fabricating method of the array substrate according to the first embodiment of the present invention. FIGS. 7A to 7H, FIGS. 8A to 8H, and FIGS. 9A to 9H are cross-sectional views illustrating the fabricating method of the array substrate according to the first embodiment of the present invention.

In FIGS. 6A, 7A, 8A and 9A, a gate line 112, a gate electrode 114 and a gate pad 116 are formed on a substrate 110 by depositing a first metal layer and patterning it through a first mask process. The gate line 112 is formed in a first direction, and the gate electrode 114 is extended from the gate line 112. The gate pad 116 is disposed at one end of the gate line 112. A part of the gate line 112 acts as one electrode of a storage capacitor.

The first metal layer has a double-layered structure. A lower layer of the first metal layer is selected from a metal material having a relatively low resistivity, such as aluminum-neodymium (AlNd), and an upper layer of the first metal layer is selected from a transparent conductive material, such as indium-tin-oxide (ITO). Therefore, the gate line 112, the gate electrode 114 and the gate pad 116 have respective first layers 112a, 114a and 116a and respective second layers 112b, 114b and 116b.

Next, as illustrated in FIG. 6B, FIGS. 7B to 7E, FIGS. 8B to 8E, and FIGS. 9B to 9E, an active layer 132, a data line 144, a source electrode 134, a drain electrode 136, a capacitor electrode 138, and a data pad 140 are formed through a second mask process.

The second mask process will be described in detail hereinafter with reference to the drawings.

Figure 7A:
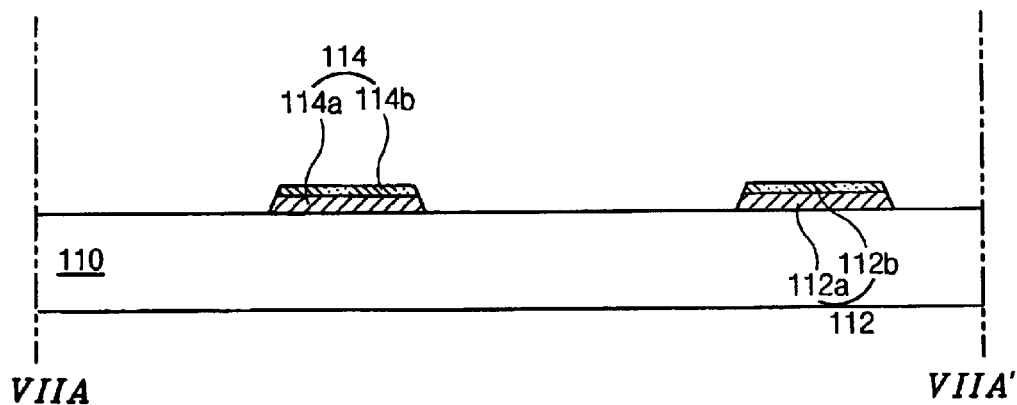
FIGS. 7A to 7H, FIGS. 8A to 8H, and FIGS. 9A to 9H are cross-sectional views illustrating the fabricating method of the array substrate according to the first embodiment of the present invention.
Figure 7B:
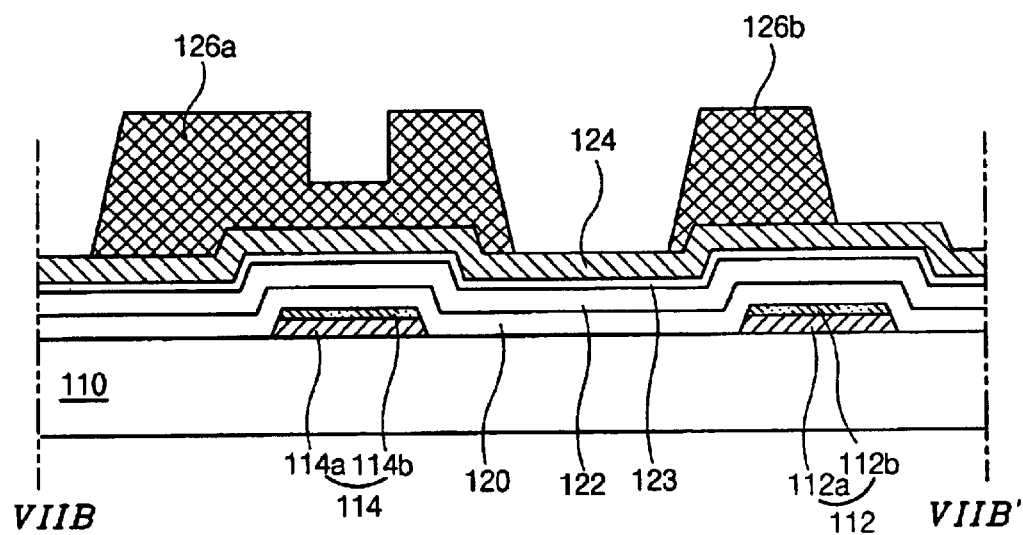
Figure 8A:
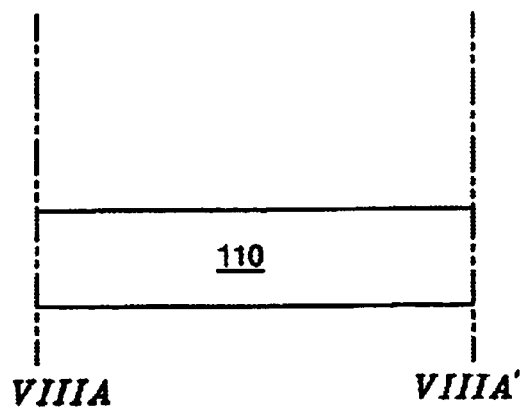
Figure 8B:
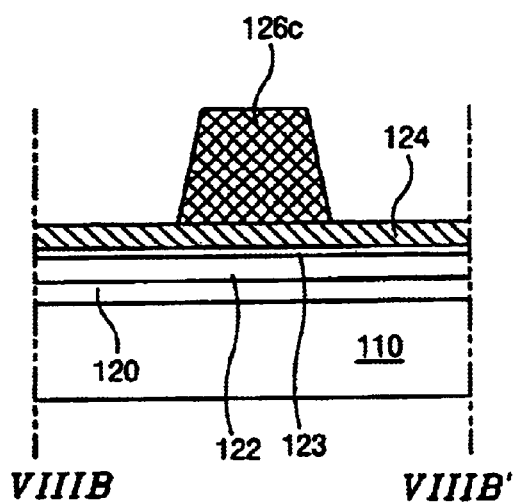
Figure 9A:
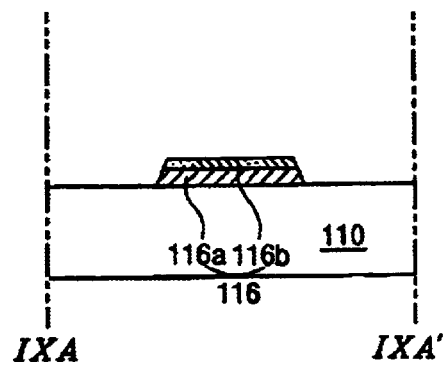
Figure 9B:
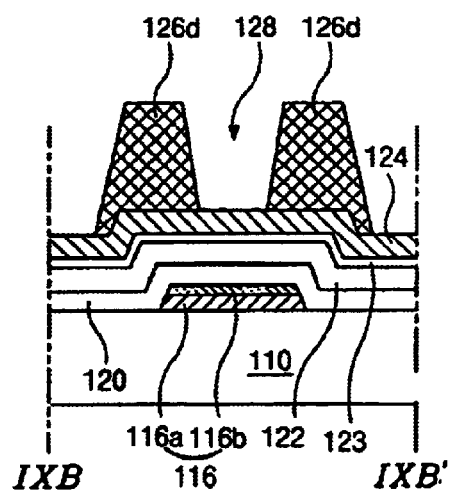

First, as illustrated in FIGS. 7B, 8B, and 9B, a gate insulating layer 120, an amorphous silicon layer 122, a doped amorphous silicon layer 123 and a second metal layer 124 are subsequently deposited on the substrate 110 including the gate line 112, the gate electrode 114 and the gate pad 116 thereon.

Next, a photoresist layer is coated on the second metal layer 124, exposed to light and developed, thereby forming first, second, third and fourth photoresist patterns 126a, 126b, 126c and 126d. The first photoresist pattern 126a corresponds to the gate electrode 114, the second photoresist pattern 126b corresponds to the gate line 114, the third photoresist pattern 126c corresponds to a data pad, which will be formed later, and the fourth photoresist pattern 126d corresponds to the gate pad 116. Although not shown in the figures, the first photoresist pattern 126a and the third photoresist pattern 126c are connected to each other. That is, the third photoresist pattern 126c is disposed at one end of the first photoresist pattern 126a. The first photoresist pattern 126a covers the gate electrode 114 and has a first thickness and a second thickness, wherein the second thickness is thinner than the first thickness and corresponds to the middle portion of the gate electrode 114 due to diffraction exposure. The second, third and the fourth photoresist patterns 126b, 126c and 126d have the same thickness as the first thickness of the first photoresist pattern 126a. The fourth photoresist pattern 126d also includes an opening 128 corresponding to the middle portion of the gate pad 116.

In the diffraction exposure, a halftone mask or a slit mask is used, and thus an expected portion of the photoresist layer is selectively formed thinner than other portions without an additional mask process.

Figure 7C:
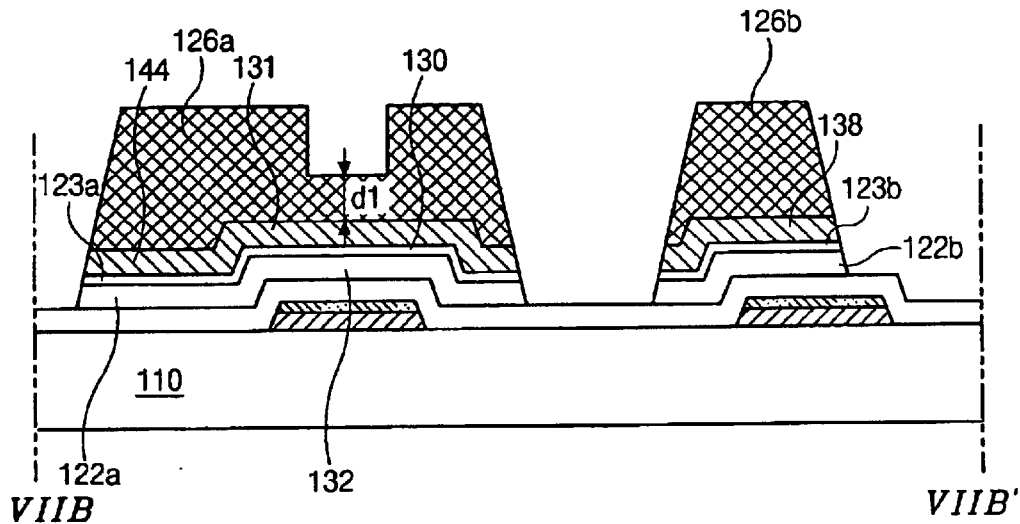
Figure 8C:
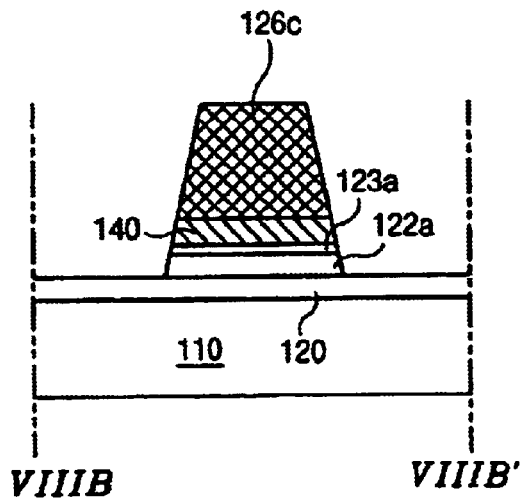
Figure 9C:
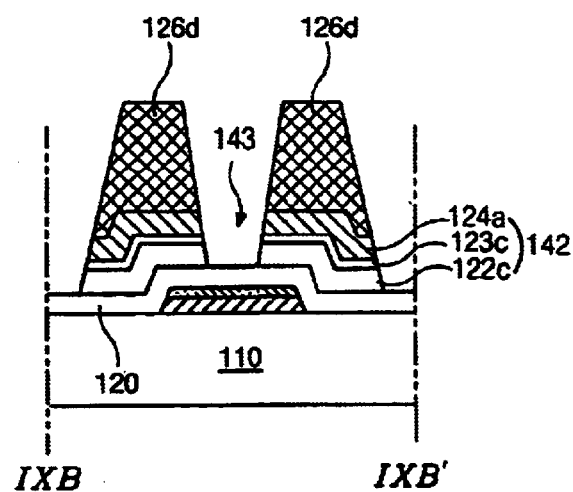

As illustrated in FIGS. 7C, 8C and 9C, the second metal layer 124, the doped amorphous silicon layer 123 and the amorphous silicon layer 122 are patterned by using the first, second, third and fourth photoresist patterns 126a, 126b, 126c and 126d, and thus a data line 144, a source/drain pattern 131, a capacitor electrode 138, a data pad 140, a doped amorphous silicon pattern 130, an active layer 132, and a gate pad buffer pattern 142 are formed. At this time, there exist amorphous silicon layers 122a, 122b and 122c and doped amorphous silicon layers 123a, 123b and 123c under the data line 144, the data pad 140, the capacitor electrode 138, and the gate pad buffer pattern 142. The gate pad buffer pattern 142 has a hole 143 through the doped amorphous silicon layer 123c and the amorphous silicon layer 122c.

Figure 7D:
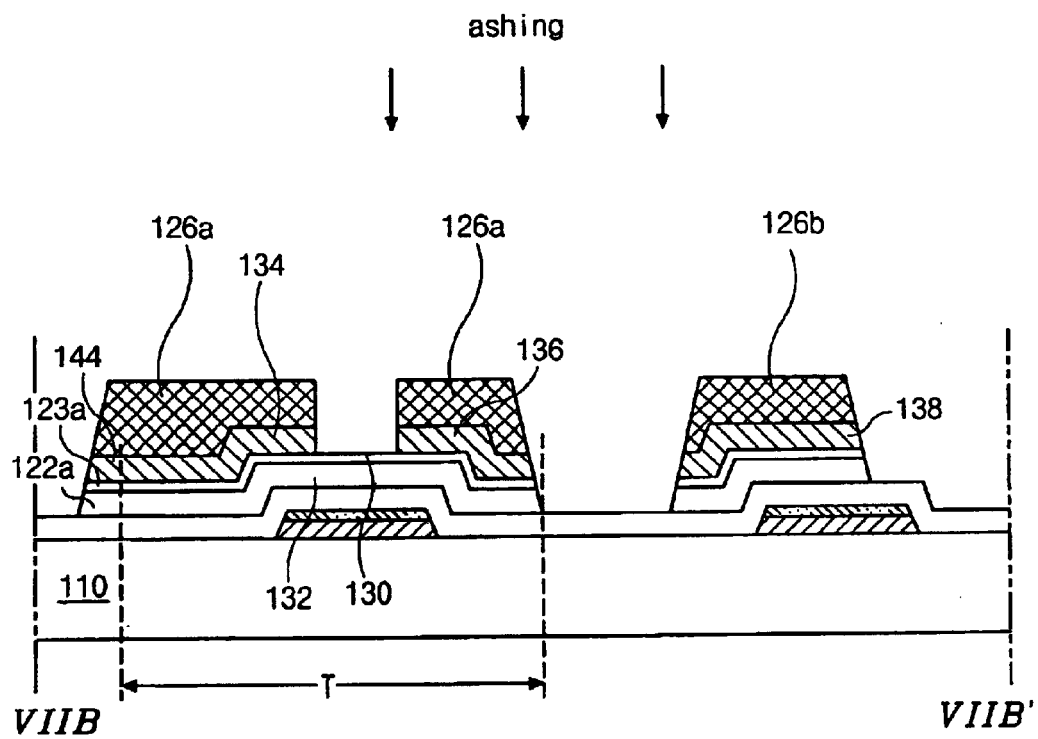
Figure 8D:
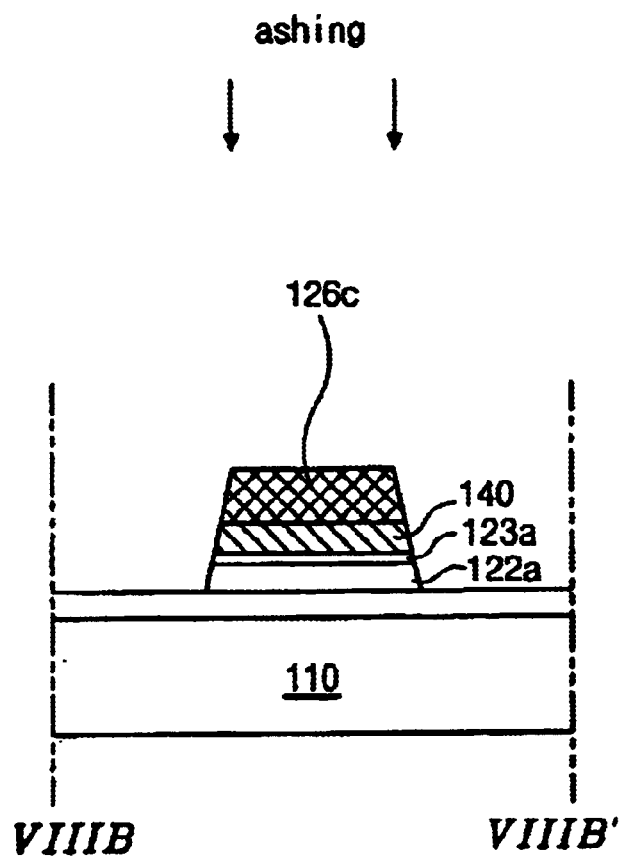
Figure 9D:
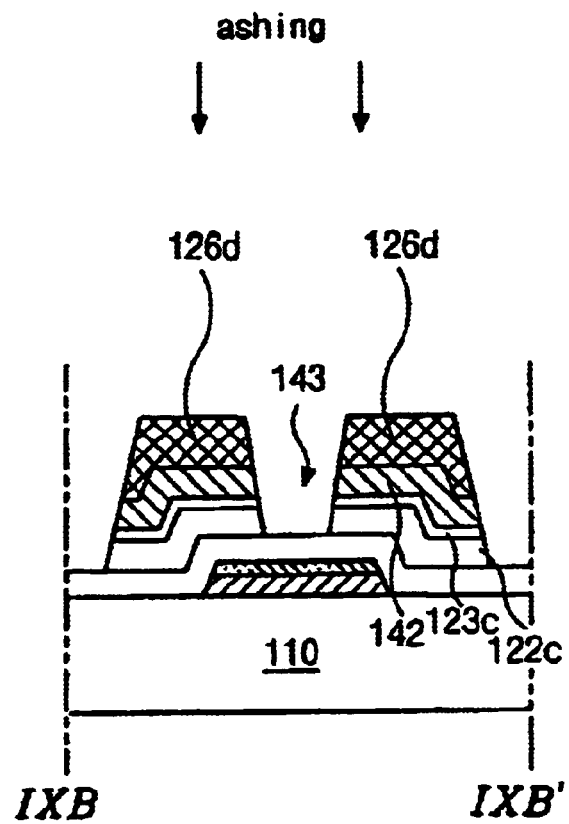

As illustrated in FIGS. 7D, 8D and 9D, the second thickness d1 of the first photoresist pattern 126a of FIG. 7C is removed through an ashing process and the middle portion of the source/drain pattern 131 of FIG. 7C exposed by the first photoresist pattern 126a is removed, thereby forming a source electrode 134 and a drain electrode 136. The source electrode 134 and the drain electrode 136 constitute a thin film transistor T with the gate electrode 114. Here, the first, second, third and fourth photoresist patterns 126a, 126b, 126c and 126d having the first thickness are also removed partially and the first, second, third and fourth photoresist patterns 126a, 126b, 126c and 126d are thinned.

Figure 7E:
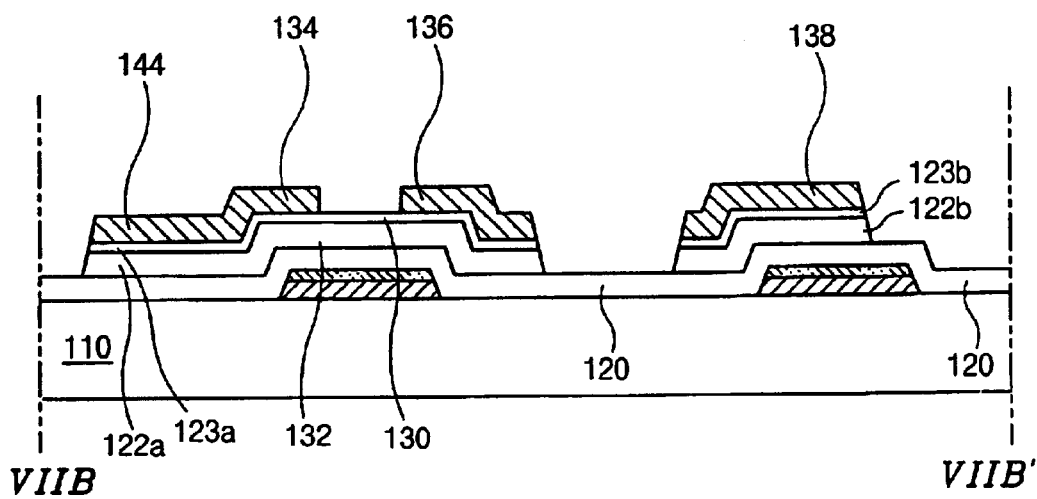
Figure 8E:
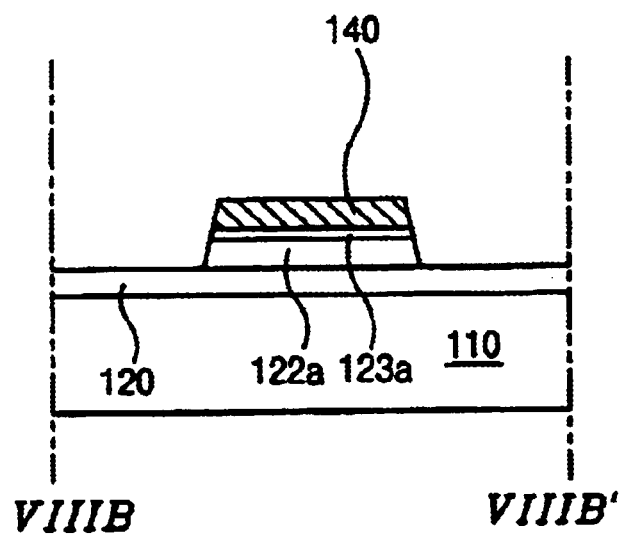
Figure 9E:
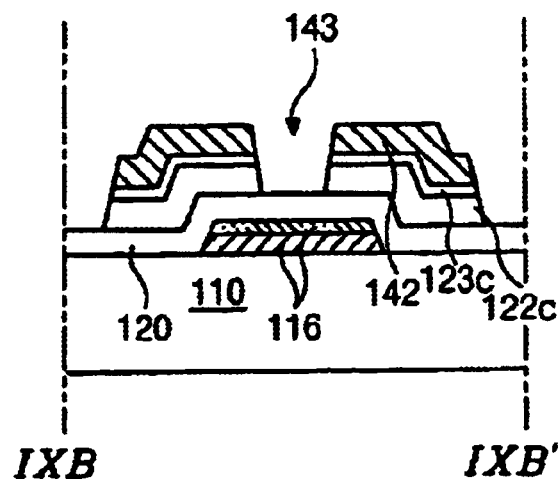

Next, as illustrated in FIGS. 7E, 8E and 9E, the remaining photoresist patterns 126a, 126b, 126c and 126d of FIGS. 7D, 8D and 9D are removed.

The data line 144 is formed in a second direction and crosses the gate line 112 to define a pixel region P. The data pad 140 is disposed at one end of the data line 144. The source electrode 134 is connected to the data line 144 and the drain electrode 136 is spaced apart from the source electrode 134 over the gate electrode 114. The capacitor electrode 138 overlaps the gate line 112. The gate pad buffer pattern 142 covers the gate pad 116 and has the hole 143 corresponding to the middle portion of the gate pad 116 as stated above. The gate pad buffer pattern 142 beneficially covers edges of the gate pad 116 to prevent the gate pad 116 from being damaged by an etchant during a process for opening the gate pad 116 later. If the gate pad 116 is exposed to the etchant, the gate pad 116 may have poor properties in contacting the substrate 110. However, the gate pad buffer pattern 142 may be omitted for simple processes.

As illustrated in FIG. 6C, FIGS. 7F to 7H, FIGS. 8F to 8H, and FIGS. 9F to 9H, a pixel electrode 146, a gate pad terminal 142, and a data pad terminal 148 are formed through a third mask process, and subsequently a passivation layer 150 is formed.

The third mask process will be described in detail hereinafter with reference to the drawings.

Figure 7F:
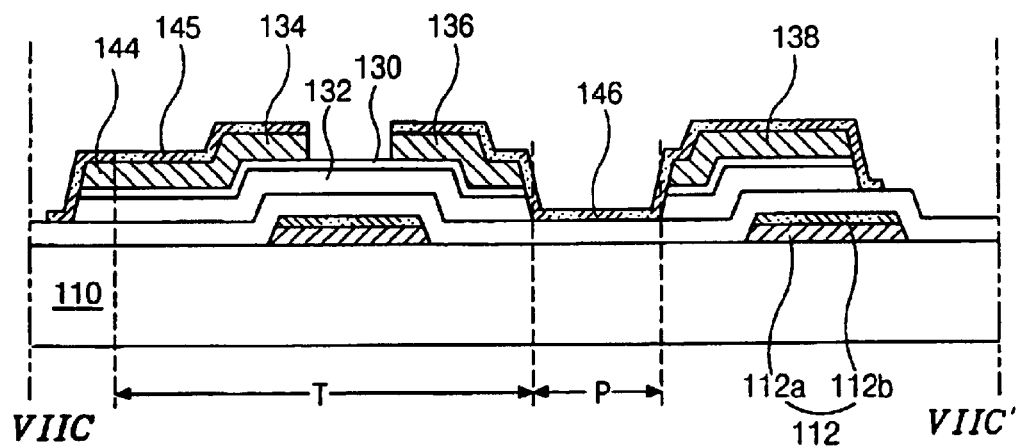
Figure 8F:
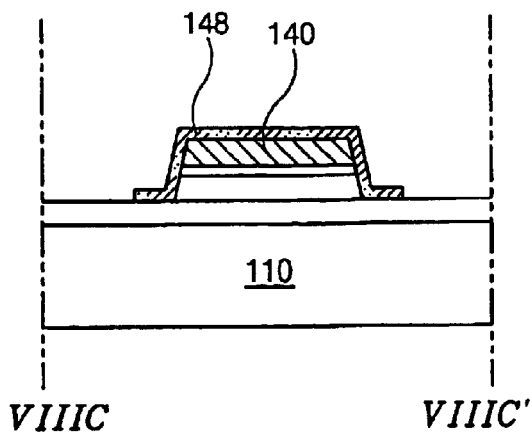
Figure 9F:
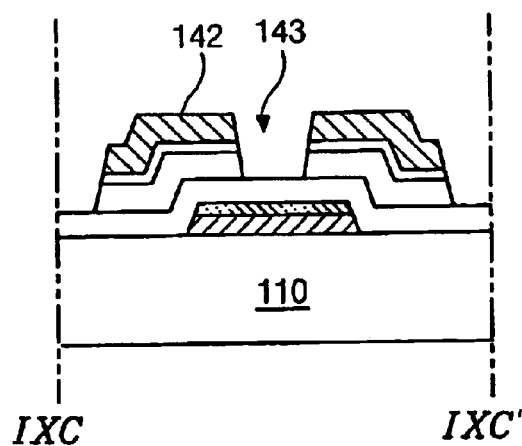

In FIGS. 7F, 8F, and 9F, a pixel electrode 146, a data buffer pattern 145 and a data pad terminal 148 are formed on the substrate 110 including the data line 144, the source electrode 134, the drain electrode 136, the capacitor electrode 138, the data pad 140, and the gate pad buffer pattern 142 thereon by depositing a transparent conductive material and patterning it through a third mask process. The pixel electrode 146 is disposed in the pixel region P. The pixel electrode 146 contacts the drain electrode 136 and the capacitor electrode 138, and covers them. The data buffer pattern 145 covers the data line 144 and the source electrode 134 and the data pad terminal 148 covers the data pad 140. The data pad terminal 148 is connected to the data buffer pattern 145. Here, the data line 144, the source electrode 134, the drain electrode 136, the capacitor electrode 138 and the data pad 140 may be damaged because the transparent conductive material is formed directly thereon. Thus, the data buffer pattern 145 protects the data line 144 and the source electrode 134 during the third mask process. The buffer pattern 145 may be omitted if the data line 144, the source electrode 134, the drain electrode 136, the capacitor electrode 138 and the data pad 140 may not be damaged.

Figure 7G:
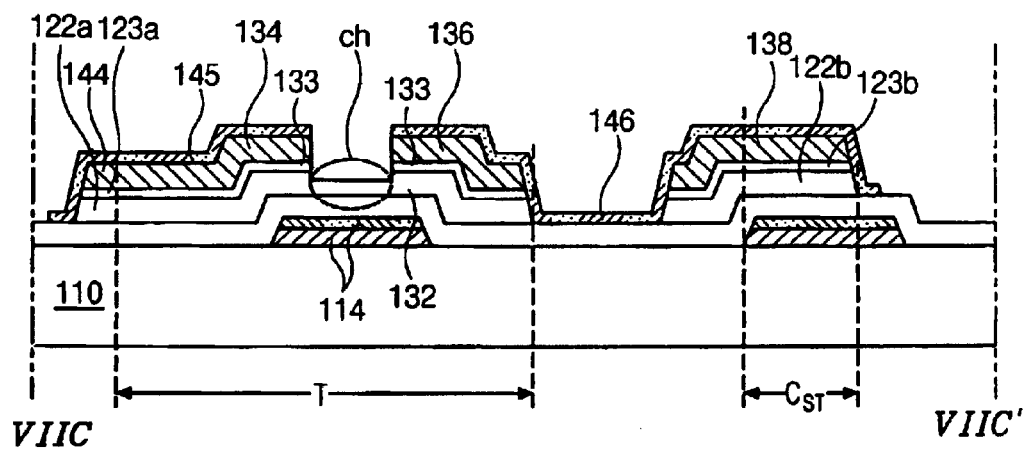
Figure 8G:
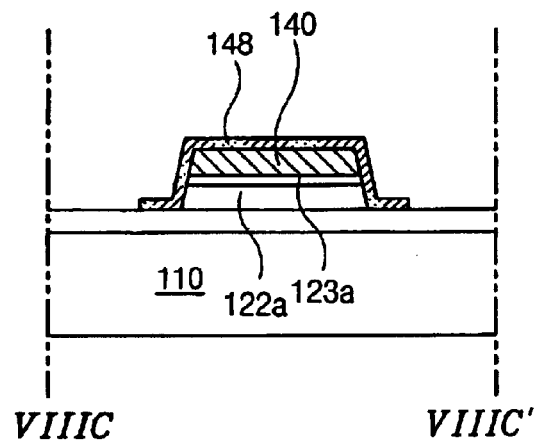
Figure 9G:
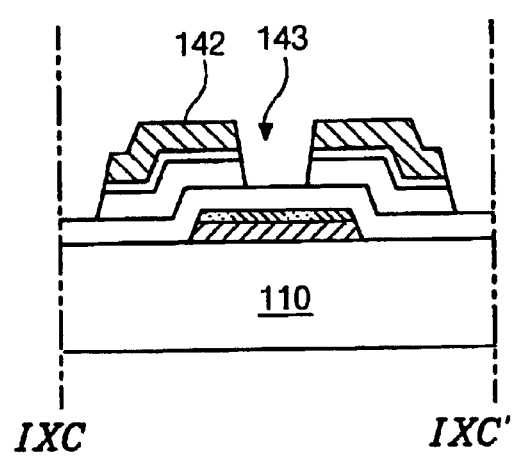

As illustrated in FIGS. 7G, 8G and 9G, the doped amorphous silicon pattern 130 of FIG. 7F exposed between the source electrode 134 and the drain electrode 136 is removed. Thus, an ohmic contact layer 133 is completed and the active layer 132 is exposed. At this time, the active layer 132 may be partially etched. The exposed active layer 132 becomes a channel ch of the thin film transistor T. Like this, the channel ch beneficially is formed after forming the pixel electrode 146 because the channel ch may be damaged during the third mask process if the channel ch is formed before the pixel electrode 146.

As stated above, the pixel electrode 146 contacts the capacitor electrode 138 and the capacitor electrode 138 overlaps the gate line 112 to form a storage capacitor $C_{ST}$.

Figure 7H:
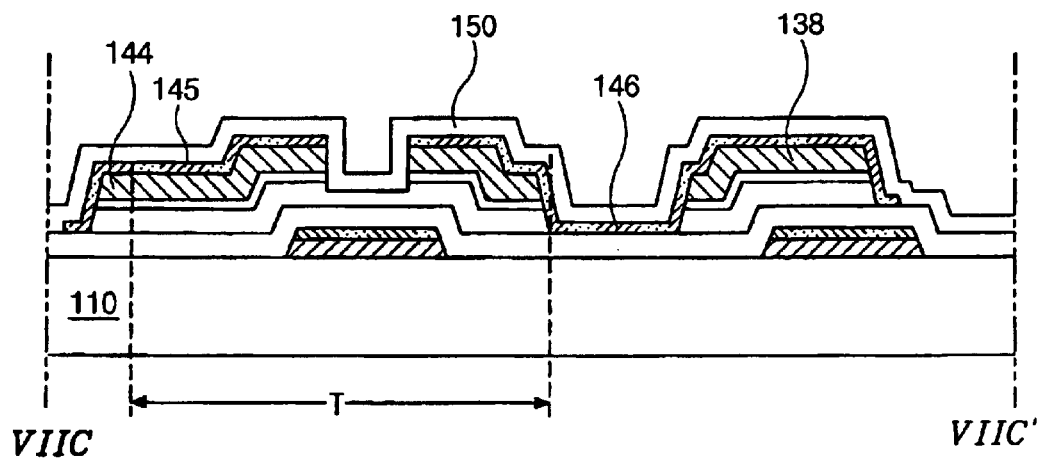
Figure 8H:
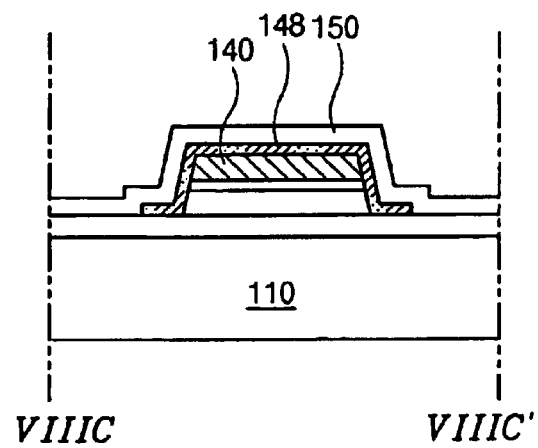
Figure 9H:
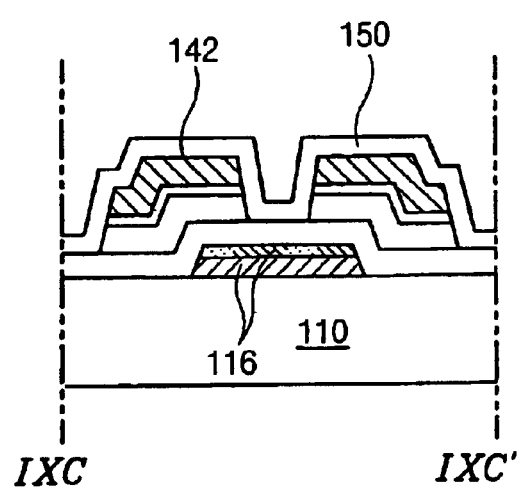

Next, as illustrated in FIGS. 7H, 8H and 9H, a passivation layer 150 is formed on an entire surface of the substrate 110, where the pixel electrode 146, the data buffer pattern 145 and the data pad terminal 148 are formed, by depositing or coating an insulating material. The insulating material beneficially includes silicon, and may be selected from one of silicon nitride (SiNx) and silicon oxide (SiOx). Meanwhile, the passivation layer 150 may be omitted and an alignment layer, which is formed on the top of the substrate 110 and arrange liquid crystal molecules, may act as the passivation layer.

The gate pad and the data pad are opened after forming a liquid crystal panel that includes attaching the array substrate and a color filter substrate and providing liquid crystal materials into a gap between the array substrate and the color filter substrate. Providing the liquid crystal materials into the gap between the array substrate and the color filter substrate includes injecting or applying the liquid crystal.

Figure 10:
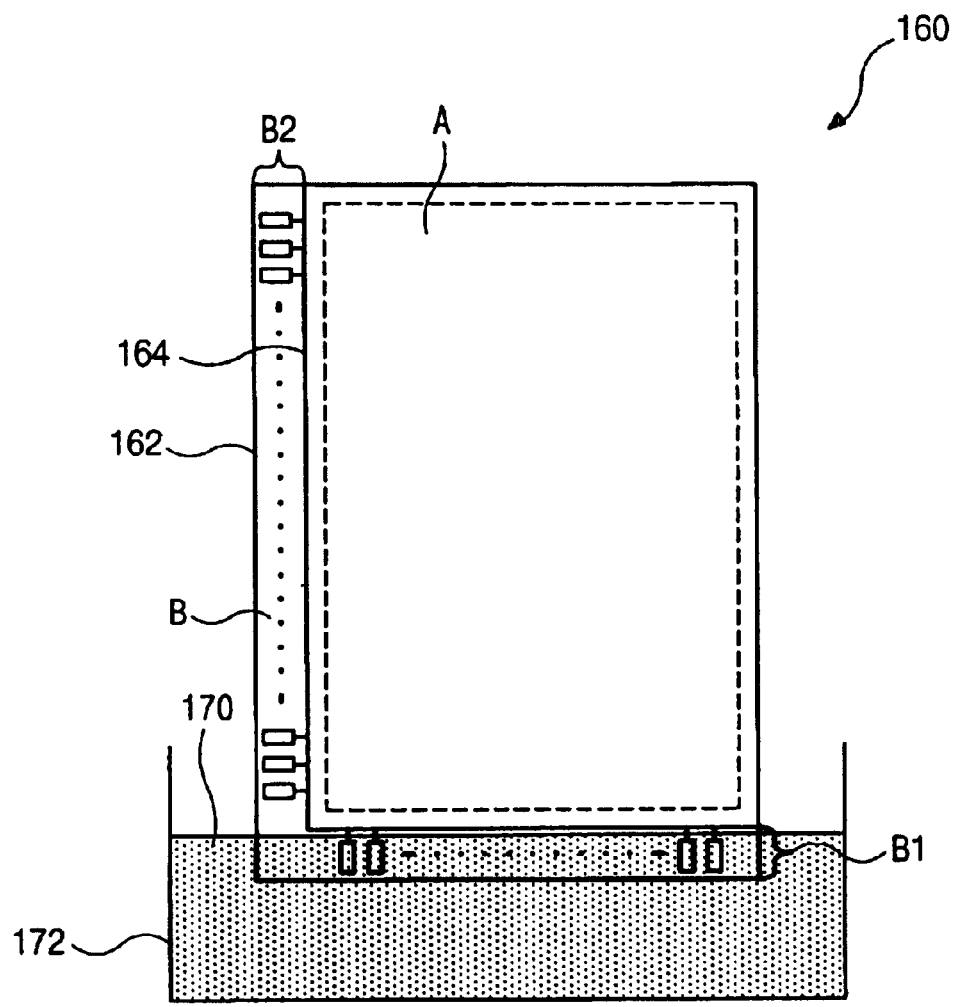
FIG. 10 is a schematic view illustrating a pad open process of a liquid crystal display device according to the present invention.

FIG. 10 illustrates a process for opening pad portions of a liquid crystal display device according to the present invention. In FIG. 10, a liquid crystal panel 160 including a first substrate 162 and a second substrate 164 has a display area A and a non-display area B. The first substrate 162 may be an array substrate and may have a gate pad portion B1 and a data pad portion B2 in the non-display area B. The second substrate 164, which may be a color filter substrate, is smaller than the first substrate 162 to expose the pad portions B1 and B2. Gate pads in the gate pad portion B1 and data pads in the data pad portion B2 may have the same structures as the first embodiment mentioned above. Although not shown in the figure, a seal pattern is formed between the first substrate 162 and the second substrate 164, enclosing the display area A. In addition, a liquid crystal layer is interposed in the seal pattern between the first and second substrates 162 and 164.

The gate pad portion B1 of the liquid crystal panel 160 is dipped into an etchant 170 in a container 172, and subsequently the data pad portion B2 is dipped. The etchant 170 selectively removes only insulating materials. Thus, an insulating layer (not shown) in the gate and data pad portions B1 and B2, which may be the passivation layer 150 of the first embodiment, is removed. Here, if the insulating layer includes silicon, the etchant may include fluoride acid (HF). Instead of this wet etching method using the etchant, The insulating layer may be removed by a dry etching method using plasma or a method using a laser.

Figure 11A:
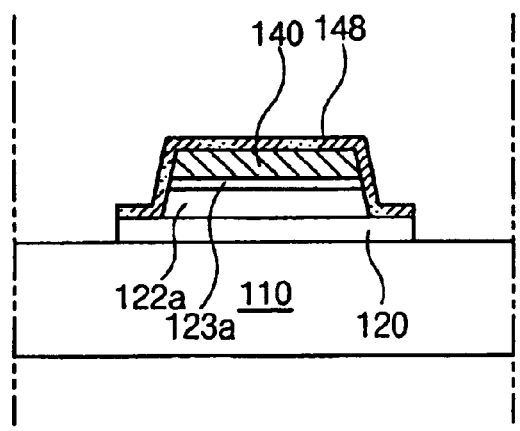
FIGS. 11A and 11B are cross-sectional views of pad portions after the process of FIG. 10.
Figure 11B:
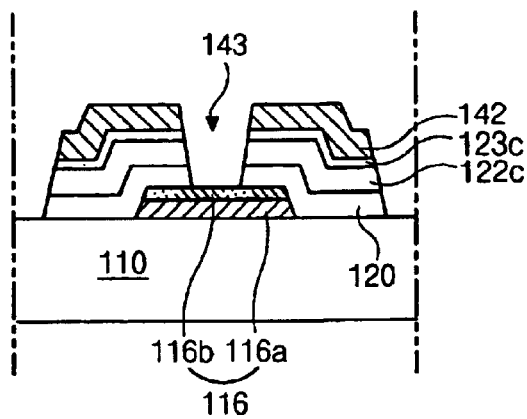

FIGS. 11A and 11B illustrate cross-sections of the pad portions after the process of FIG. 10, and correspond to the next step of FIGS. 8H and 9H, respectively.

In FIG. 11A, the gate insulating layer 120, the amorphous silicon layer 122a, the doped amorphous silicon layer 123a, the data pad 140 and the data pad terminal 148 are formed on the substrate 110, and the passivation layer 150 of FIG. 8H is removed through the process of FIG. 10, thereby exposing the data pad terminal 148. During the process of FIG. 10, the data pad terminal 148 acts as an etching mask, and the gate insulating layer 120 exposed by the data pad terminal 148 is also removed.

In FIG. 11B, the gate pad 116 including the first layer 116a and the second layer 116b is formed on the substrate 110, and the gate insulating layer 120 covers the gate pad 116. The amorphous silicon layer 122c, the doped amorphous silicon layer 123c and the gate pad buffer pattern 142 are formed on the gate insulating layer 120. The passivation layer 150 of FIG. 9H is removed with the gate insulating layer 120 through the process of FIG. 10, and thus, the gate pad buffer pattern 142 and the gate pad 116 are exposed. Here, the second layer 116b of the gate pad 116, which is made of a transparent conductive material, is exposed via the hole 143.

In the first embodiment of the present invention, through the gate line 112, the gate electrode 114 and the gate pad 116 has a double-layered structure, the gate line 112, the gate electrode 114 and the gate pad 116 may be a single layer.

FIGS. 12A to 12D, FIGS. 13A to 13D, and FIGS. 14A to 14D illustrate a method of manufacturing an array substrate for a liquid crystal display (LCD) device according to a second embodiment of the present invention.

Figure 12A:
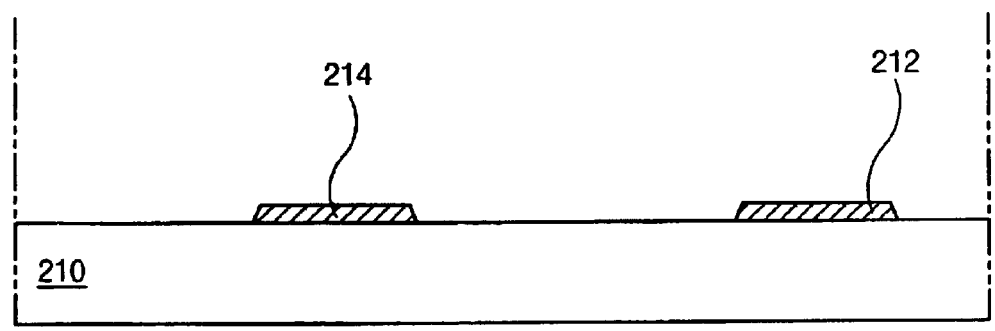
FIGS. 12A to 12D, FIGS. 13A to 13D, and FIGS. 14A to 14D are cross-sectional views illustrating a method of manufacturing an array substrate for a liquid crystal display (LCD) device according to a second embodiment of the present invention.
Figure 13A:
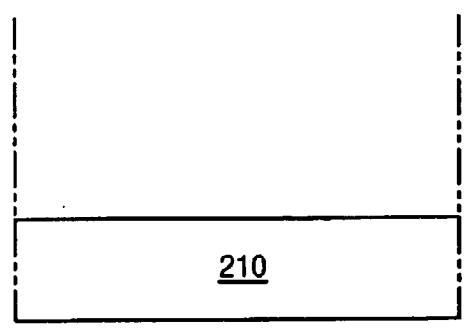
Figure 14A:
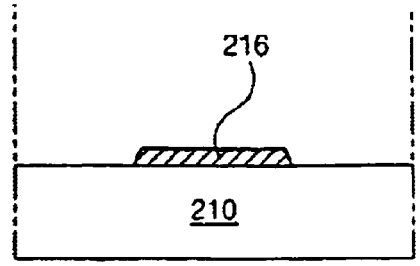

In FIGS. 12A, 13A and 14A, a gate line 212, a gate electrode 214 and a gate pad 216 are formed on a substrate 210 by depositing a first metal layer and patterning it through a first mask process. Although not shown in the figure, the gate line 212 is formed in a first direction, the gate electrode 214 is extended from the gate line 212, and the gate pad 216 is disposed at one end of the gate line 212. A part of the gate line 212 acts as one electrode of a storage capacitor.

The first metal layer is a single layer and may be selected from a metal material having a relatively low resistivity, such as aluminum-neodymium (AlNd). Therefore, the gate line 212, the gate electrode 214 and the gate pad 216 do not include a transparent conductive material.

Figure 12B:
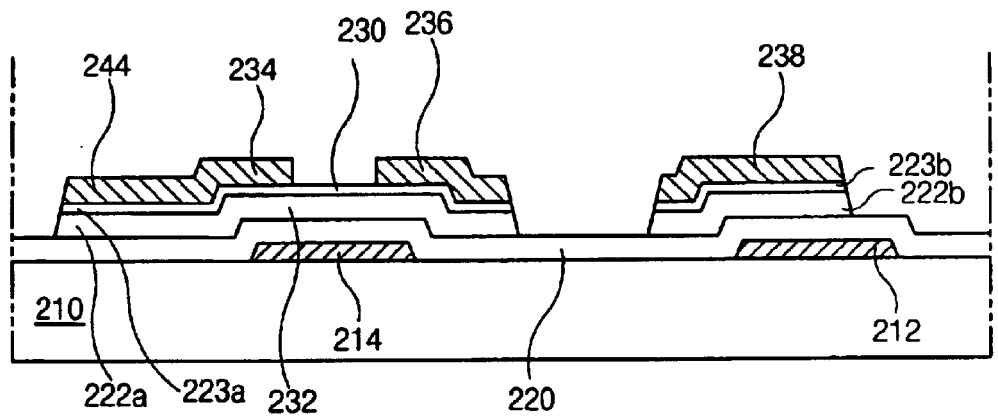
Figure 13B:
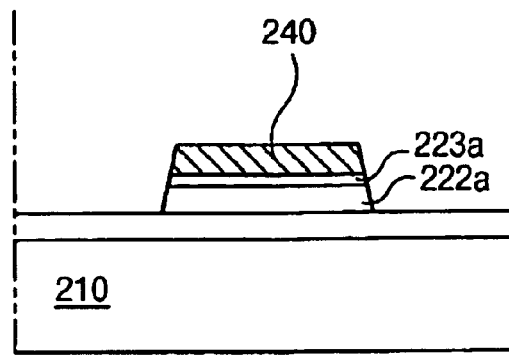
Figure 14B:
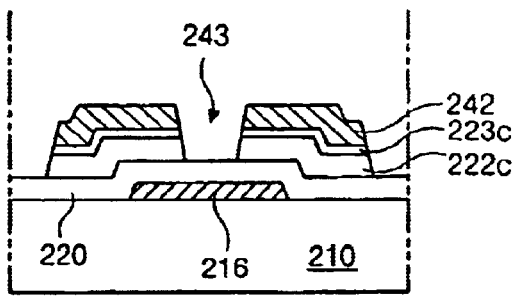

As illustrated in FIGS. 12B, 13B and 14B, a gate insulating layer 220, an active layer 232, a doped amorphous silicon pattern 230, a data line 244, a source electrode 234, a drain electrode 236, a capacitor electrode 238, a data pad 240 and a gate pad buffer pattern 242 are formed on the substrate including the gate line 212, the gate electrode 214, and the gate pad 216 through a second mask process.

The active layer 232 and the doped amorphous silicon pattern 230 are disposed over the gate electrode 214. The source electrode 234 is connected to the data line 244 and the drain electrode 236 is spaced apart from the source electrode 234 over the gate electrode 214. The doped amorphous silicon pattern 230 is exposed between the source and drain electrodes 234 and 236. The capacitor electrode 238 overlaps the gate line 212 and the gate pad buffer pattern 242 covers the gate pad 216. The gate pad buffer pattern 242 has a hole 243 corresponding to the middle portion of the gate pad 216. Amorphous silicon layers 222a, 222b and 222c and doped amorphous silicon layers 223a, 223b and 223c are located under the data line 244 and the data pad 240, the capacitor electrode 238 and the gate pad buffer pattern 242, respectively.

The second mask process is the same process as FIGS. 7B to 7E, FIGS. 8B to 8E and FIGS. 9B to 9E.

Figure 12C:
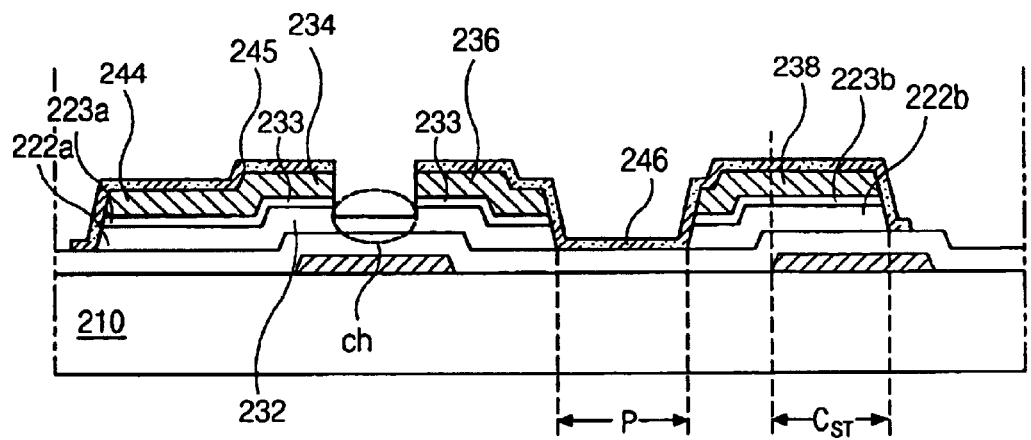
Figure 13C:
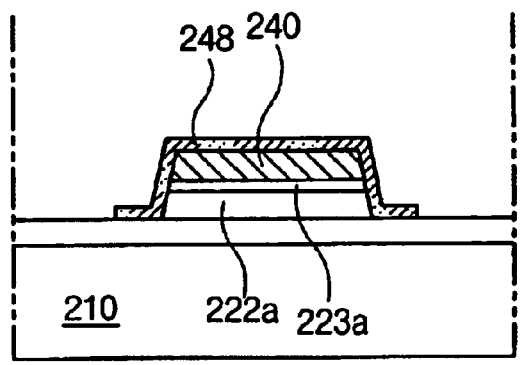
Figure 14C:
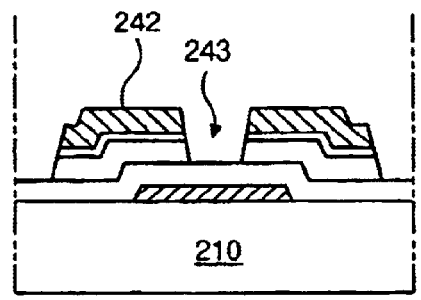

Next, in FIGS. 12C, 13C and 14C, a pixel electrode 246, a data buffer pattern 245 and a data pad terminal 248 are formed on the substrate 210 including the data line 244, the source electrode 234, the drain electrode 236, the capacitor electrode 238, the data pad 240, and the gate pad buffer pattern 242 thereon by depositing a transparent conductive material and patterning it through a third mask process. The pixel electrode 246 is disposed in a pixel region P. The pixel electrode 246 contacts the drain electrode 236 and the capacitor electrode 238, and covers them. The data buffer pattern 245 covers the data line 244 and the source electrode 234, and the data pad terminal 248 covers the data pad 240.

Subsequently, the doped amorphous silicon pattern 230 of FIG. 12B exposed between the source electrode 234 and the drain electrode 236 is removed. Thus, an ohmic contact layer 233 is completed and the active layer 232 is exposed. At this time, the active layer 232 may be partially etched. The exposed active layer 232 becomes a channel ch of a thin film transistor. Like this, the channel ch beneficially is formed after forming the pixel electrode 246 because the channel ch may be damaged during the third mask process if the channel ch is formed before the pixel electrode 246.

As stated above, the pixel electrode 246 contacts the capacitor electrode 238, and the capacitor electrode 238 overlaps the gate line 212 to form a storage capacitor $C_{ST}$.

Figure 12D:
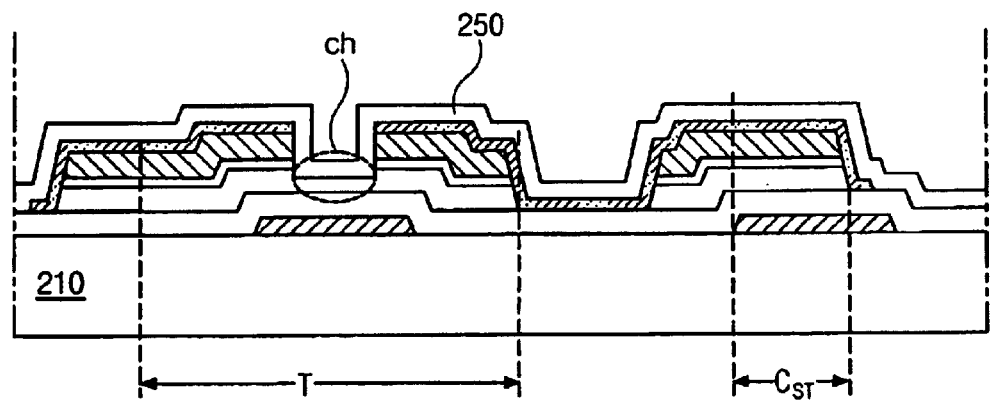
Figure 13D:
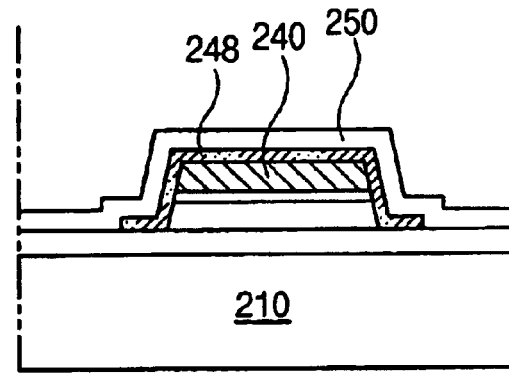
Figure 14D:
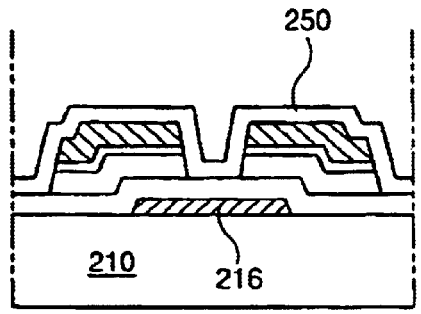

As illustrated in FIGS. 12D, 13D and 14D, a passivation layer 250 is formed on an entire surface of the substrate 210, where the pixel electrode 246, the data buffer pattern 245 and the data pad terminal 248 are formed, by depositing or coating an insulating material. The insulating material beneficially includes silicon, and may be selected from one of silicon nitride (SiNx) and silicon oxide (SiOx).

The gate pad 216 and the data pad terminal may be opened through the pad open process of the first embodiment.

In the second embodiment, since the gate pad 216 does not include a transparent conductive material layer, there is no transparent conductive layer between the gate pad 216 and an outer circuit (not shown), which is connected to the gate pad 216 later, after the pad open process.

Generally, because pad portions of a liquid crystal display device are connected to the outer circuit by a TAB (tape automatic bonding) method, a transparent conductive layer has been formed on gate and data pads to prevent the pads from being exposed to the atmosphere in rework processes and to improve contact properties with terminals of the outer circuit.

A COG (chip on glass) method, in which there is no additional transparent conductive material layer between the pads and the outer circuit, may not be used to connect the pads and the outer circuit, recently. Thus, the exposed gate pad 216 may not be the transparent conductive material. That is, in the gate pad portion, the gate pad 216 made of an opaque metal material is exposed and is connected to the outer circuit. On the other hand, in the data pad portion, the data pad terminal 248 made of a transparent conductive material is exposed and is connected to the outer circuit.

FIGS. 15, 16, 17 and 18 illustrate an array substrate for a liquid crystal display (LCD) device according to a third embodiment of the present invention. The array substrate of the third embodiment has the same structure as the first embodiment except for the data buffer pattern on the data line.

Figure 15:
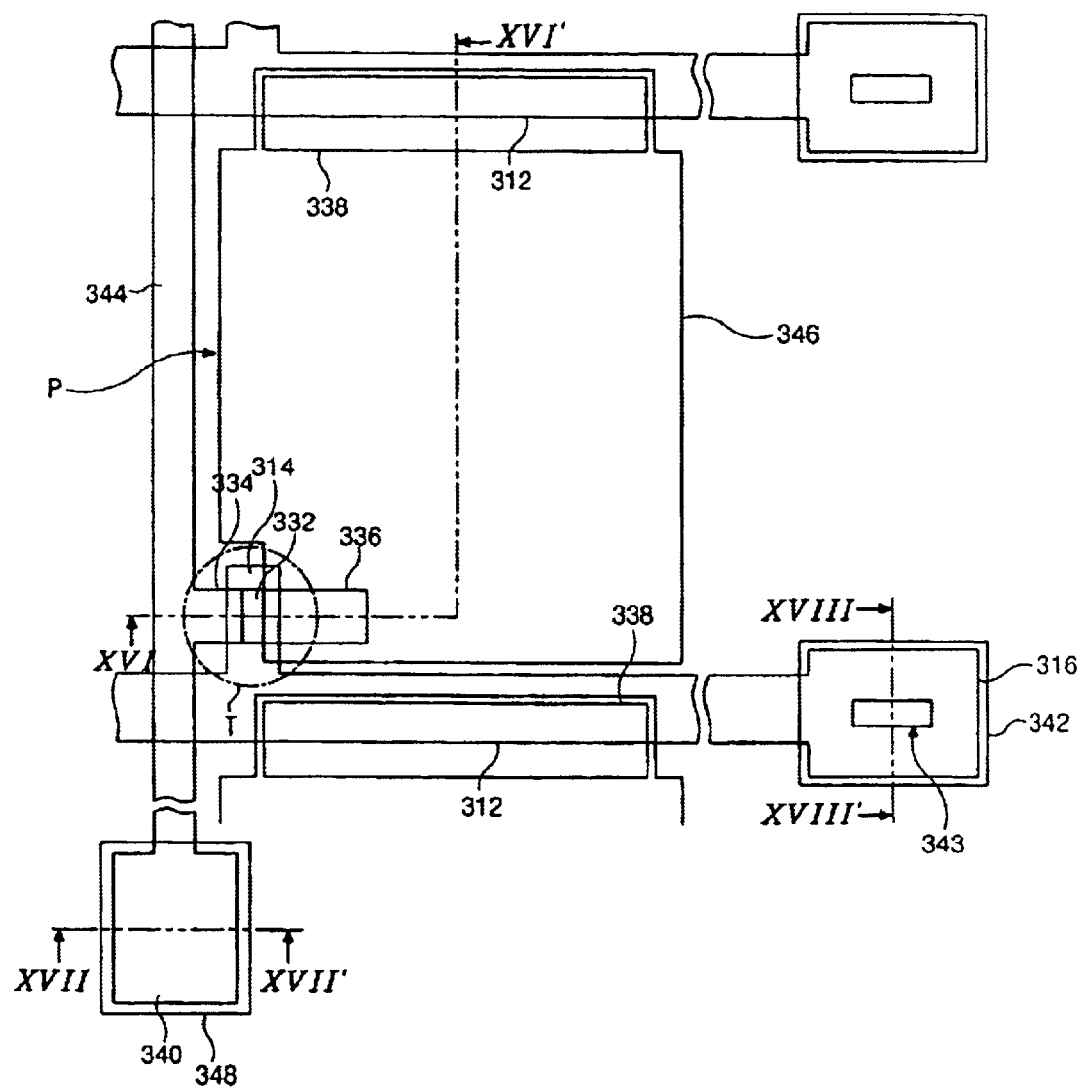
FIG. 15 is a plan view of an array substrate according to a third embodiment of the present invention.

FIG. 15 is a plan view of the array substrate according to the third embodiment of the present invention. In FIG. 15, a gate line 312 and a data line 344 cross each other to define a pixel region P, and a thin film transistor T including a gate electrode 314, an active layer 332, a source electrode 334 and a drain electrode 336 is formed at the crossing of the gate and data lines 312 and 344. A pixel electrode 346 is formed in the pixel region P and is connected to the drain electrode 336 and a capacitor electrode 338. The capacitor electrode 338 overlaps the gate line 312. A gate pad 316 is formed at one end of the gate line 312, and a data pad 340 is formed at one end of the data line 344. A data pad terminal 348 of an island shape covers the data pad 340. A gate pad buffer pattern 342, which includes a hole 343 corresponding to the middle portion of the gate pad 316, covers the gate pad 316.

Figure 16:
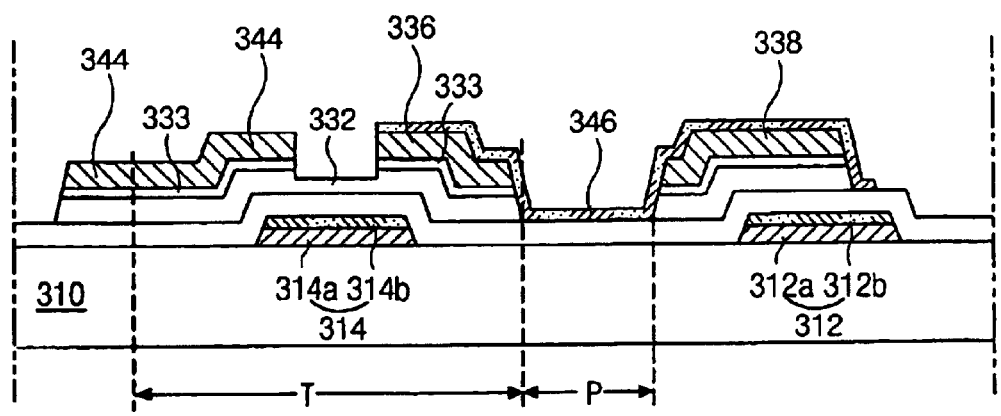
FIGS. 16, 17 and 18 are cross-sectional views along the lines XVI–XVI', XVII–XVII' and XVIII–XVIII' of FIG. 15, respectively.
Figure 17:
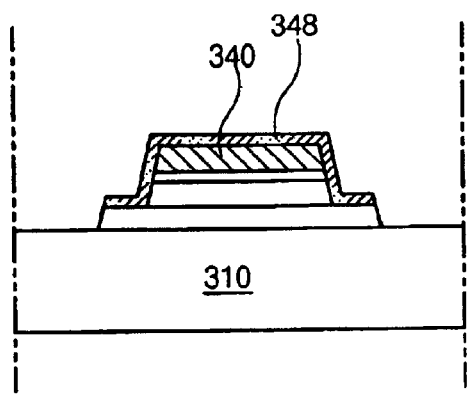
Figure 18:
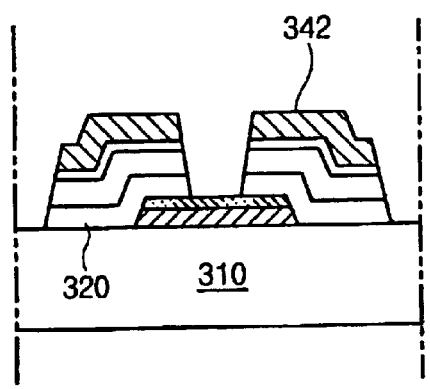

FIGS. 16, 17 and 18 are cross-sectional views along the lines XVI–XVI', XVII–XVII' and XVIII–XVIII' of FIG. 15, respectively, a pad open process of FIG. 10.

As shown in FIGS. 16, 17 and 18, a pixel electrode 346 and a data pad terminal 348, which are made of a transparent conductive material, are formed on the substrate 310 including the data line 344, the source electrode 334, the drain electrode 336, the capacitor electrode 338, the data pad 340, and the gate pad buffer pattern 342 thereon. The pixel electrode 346 contacts the drain electrode 336 and the capacitor electrode 338, and covers them. The data pad terminal 348 covers the data pad 340.

In the third embodiment, there is no transparent conductive pattern on the data line 344 and the source electrode 334.

FIG. 19, FIGS. 20A to 20C, FIGS. 21A to 21C, and FIGS. 22A to 22C illustrate an array substrate for a liquid crystal display (LCD) device according to a fourth embodiment of the present invention. The array substrate of the fourth embodiment has the same structure as the first embodiment except for the capacitor electrode over the gate line.

Figure 19:
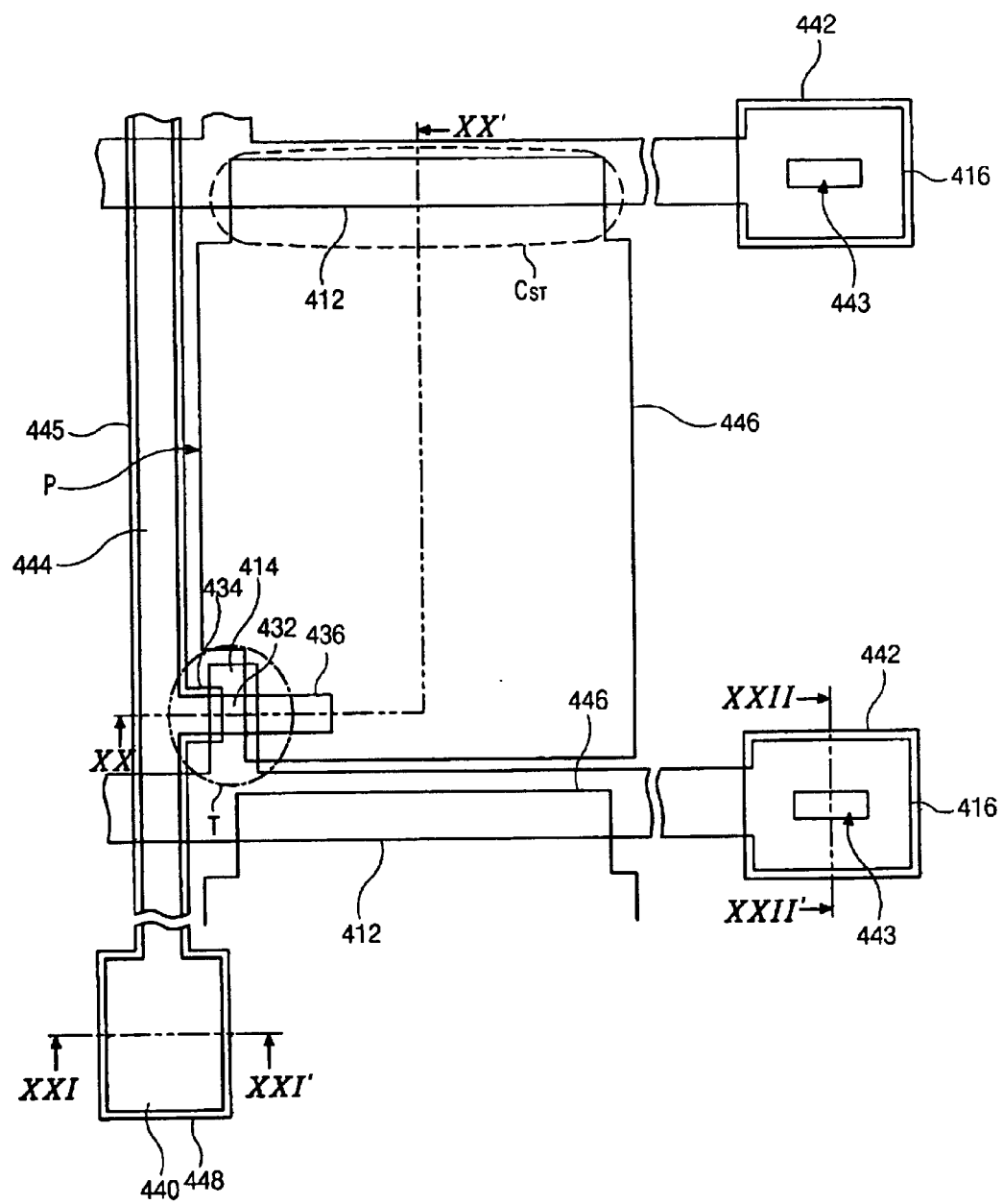
FIG. 19 is a plan view of an array substrate according to a fourth embodiment of the present invention.

FIG. 19 is a plan view of the array substrate according to the fourth embodiment of the present invention. In FIG. 19, a gate line 412 and a data line 444 cross each other to define a pixel region P, and a thin film transistor T including a gate electrode 414, an active layer 432, a source electrode 434 and a drain electrode 436 is formed at the crossing of the gate and data lines 412 and 444. The gate electrode 414 is extended from the gate line 412 and the source electrode 434 is extended from the data line 444. The drain electrode 436 is spaced apart from the source electrode over the gate electrode 414. The active layer 432 is exposed between the source electrode 434 and the drain electrode 436. A pixel electrode 446 is formed in the pixel region P and is connected to the drain electrode 436. The pixel electrode 446 overlaps the gate line 412 to form a storage capacitor $C_{ST}$. A gate pad 416 is formed at one end of the gate line 412, and a data pad 440 is formed at one end of the data line 444. A gate pad buffer pattern 442, which includes a hole 443 corresponding to the middle portion of the gate pad 416, covers the gate pad 416. A data buffer pattern 445, which is made of the same material as the pixel electrode 446, covers the data line 444 and the source electrode 434. The data pad terminal 448 covers the data pad 440 and is connected to the data buffer pattern 445.

Figure 20A:
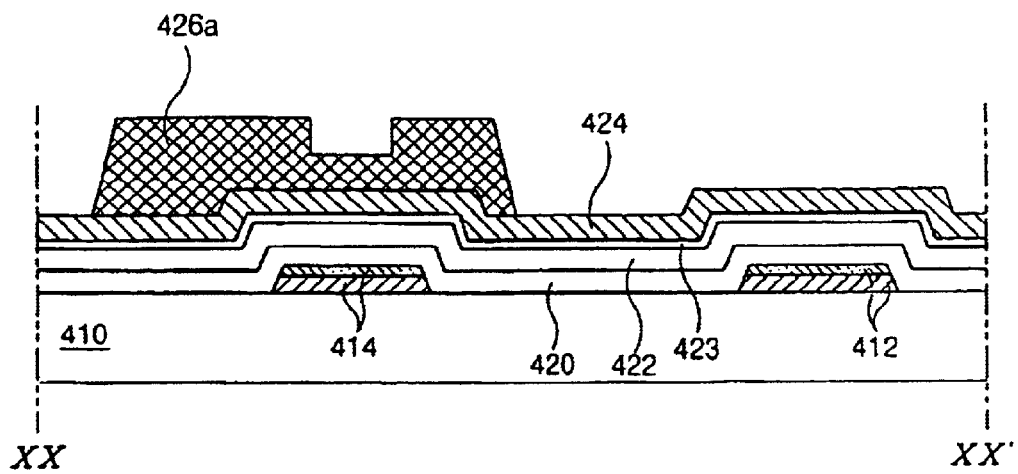
FIGS. 20A to 20C, FIGS. 21A to 21C, and FIGS. 22A to 22C are cross-sectional views illustrating a method of manufacturing the array substrate device according to the fourth embodiment of the present invention.
Figure 20B:
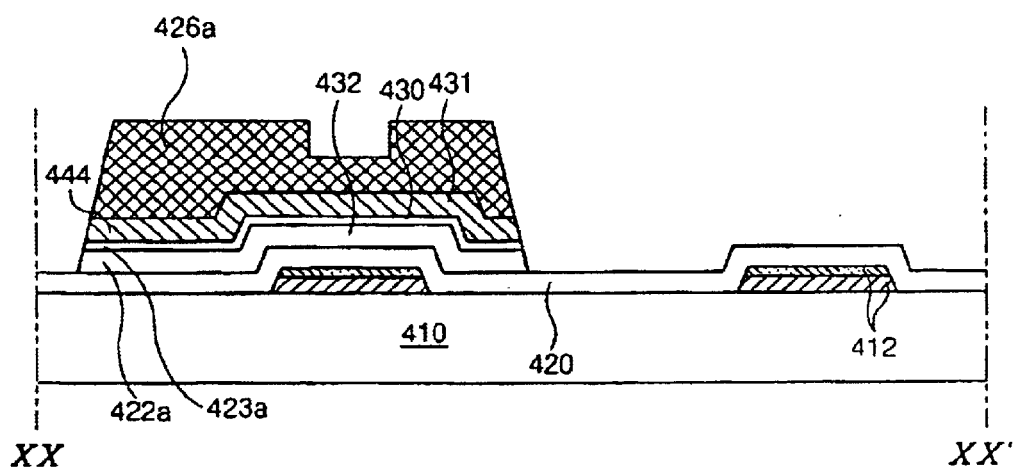
Figure 20C:
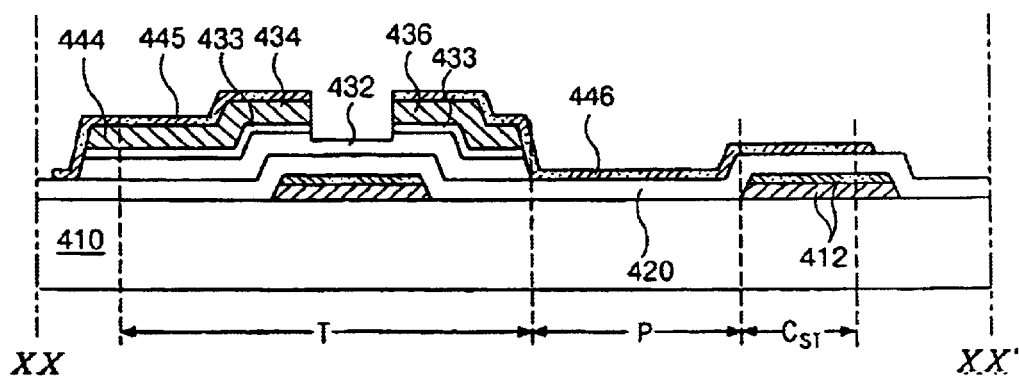

FIGS. 20A to 20C, FIGS. 21A to 21C, and FIGS. 22A to 22C are cross-sectional views illustrating a method of manufacturing the array substrate device according to the fourth embodiment of the present invention. FIGS. 20A to 20C correspond to cross-sections along the line XX–XX' of FIG. 19, FIGS. 21A to 21C correspond to cross-sections along the line XXI–XXI' of FIG. 19, and FIGS. 22A to 22C correspond to cross-sections along the line XXII–XXII' of FIG. 19.

Figure 21A:
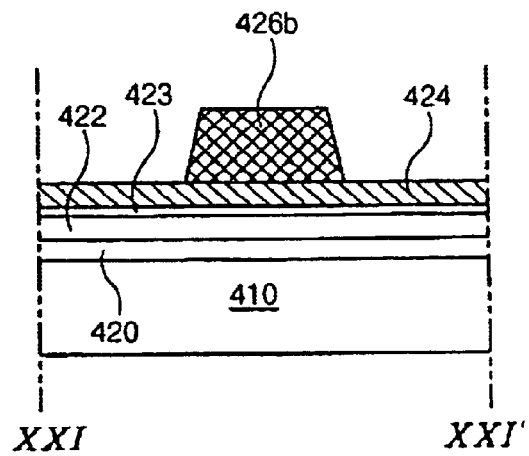
Figure 22A:
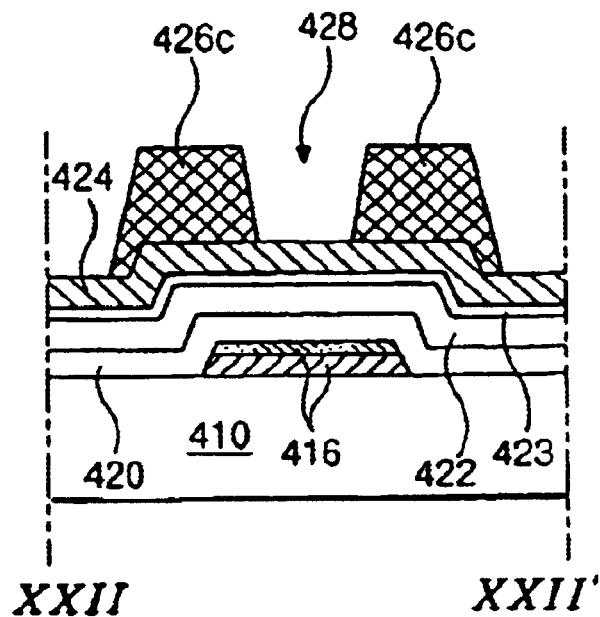

In FIGS. 20A, 21A and 22A, a gate line 412, a gate electrode 414 and a gate pad 416 are formed on a substrate 410 through a first mask process. Next, a gate insulating layer 420, an amorphous silicon layer 422, a doped amorphous silicon layer 423 and a metal layer 424 are subsequently deposited on the substrate 410 including the gate line 412, the gate electrode 414 and the gate pad 416 thereon, and first, second and third photoresist patterns 426a, 426b and 426c are formed on the metal layer 424. The first photoresist pattern 426a corresponds to the gate electrode 414, the second photoresist pattern 426b corresponds to the data pad 440, which will be formed later, and the third photoresist pattern 426c corresponds to the gate pad 416.

Although not shown in the figures, the first photoresist pattern 426a and the second photoresist pattern 426b are connected to each other. That is, the second photoresist pattern 426b is disposed at one end of the first photoresist pattern 426a. The first photoresist pattern 426a covers the gate electrode 414 and has a first thickness and a second thickness, wherein the second thickness is thinner than the first thickness and corresponds to the middle portion of the gate electrode 414 due to diffraction exposure. The second and third photoresist patterns 426b and 426c have the same thickness as the first thickness of the first photoresist pattern 426a. The third photoresist pattern 426c also includes an opening 428 corresponding to the middle portion of the gate pad 416.

Figure 21B:
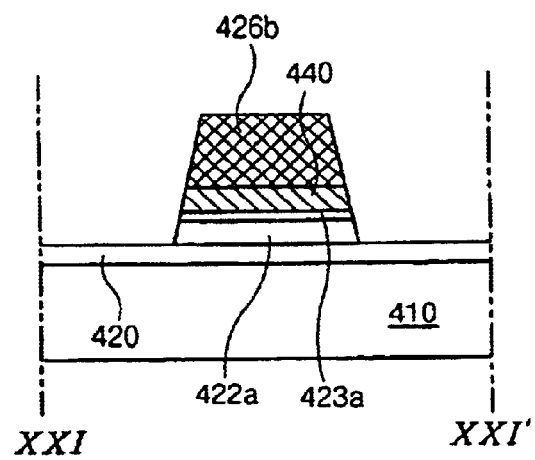
Figure 22B:
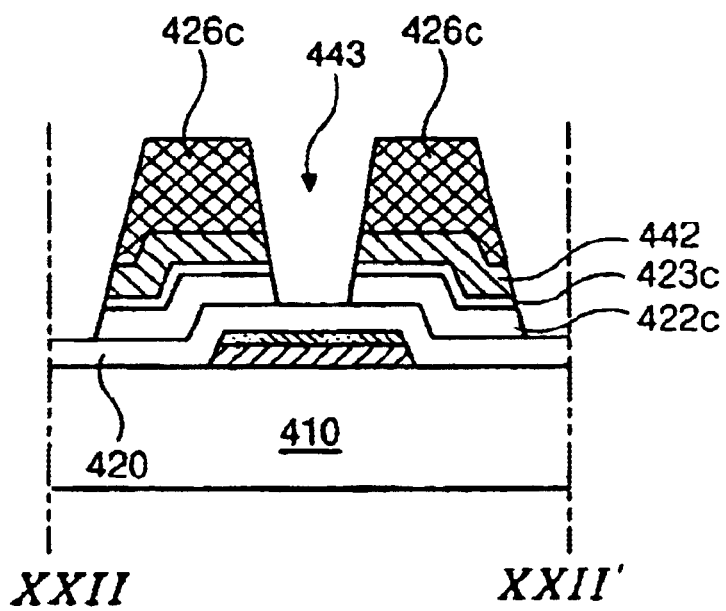

As illustrated in FIGS. 20B, 21B and 22B, the metal layer 424, the doped amorphous silicon layer 423 and the amorphous silicon layer 422 of FIGS. 20A, 21A and 22A are etched by using the first, second and third photoresist patterns 426a, 426b and 426c as etching masks, and thus a data line 444, a source/drain pattern 431, a data pad 440, a doped amorphous silicon pattern 430, an active layer 432, and a gate pad buffer pattern 442 are formed. Here, the metal layer 424, the doped amorphous silicon layer 423 and the amorphous silicon layer 422 over the gate line 412 are removed.

At this time, there exist amorphous silicon layers 422a and 422c and doped amorphous silicon layers 423a and 423c under the data line 444, the data pad 440, and the gate pad buffer pattern 442. The gate pad buffer pattern 442 has a hole 443 through the doped amorphous silicon layer 423c and the amorphous silicon layer 422c.

Source and drain electrodes are formed through the process of FIGS. 7D, 8D and 9D (described above), and the remaining photoresist patterns are removed.

The active layer 432, the data line 444, the source electrode 434, the drain electrode 436, the data pad 440, and the gate pad buffer pattern 442 are formed through a second mask process.

Figure 21C:
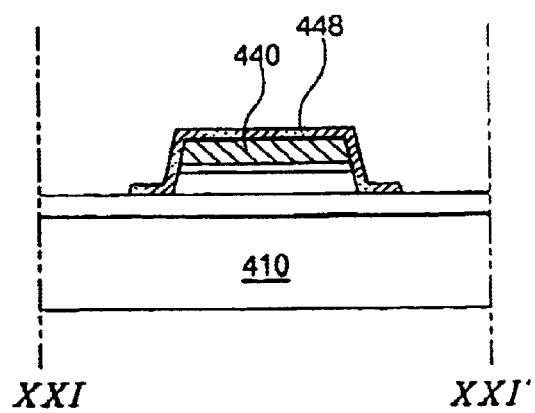
Figure 22C:
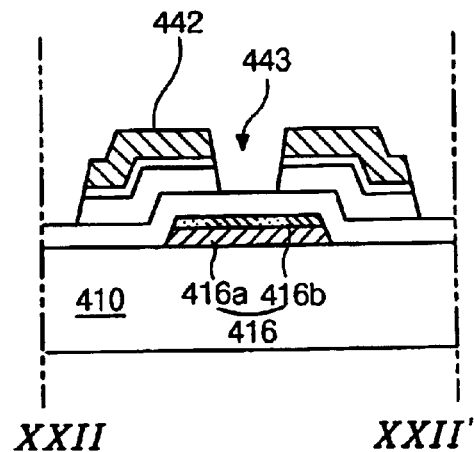

As illustrated in FIGS. 20C, 21C and 22C, a pixel electrode 446, a data buffer pattern 445 and a data pad terminal 448 are formed on the substrate 410 including the data line 444, the source electrode 434, the drain electrode 436, the data pad 440, and the gate pad buffer pattern 442 thereon by depositing a transparent conductive material and patterning it through a third mask process. The pixel electrode 446 is disposed in a pixel region P and contacts the drain electrode 436. The pixel electrode overlaps the gate line 412 to form a storage capacitor $C_{ST}$. The data buffer pattern 445 covers the data line 444 and the source electrode 434 and the data pad terminal 448 covers the data pad 440. The data pad terminal 448 is connected to the data buffer pattern 445.

Next, the doped amorphous silicon pattern 430 of FIG. 20B exposed between the source and the drain electrodes is removed. Thus, an ohmic contact layer 433 is completed and the active layer 432 is exposed. At this time, the active layer 432 may be partially etched. The exposed active layer 432 becomes a channel of a thin film transistor T.

Although not shown in the figures, a passivation layer is formed on an entire surface of the substrate 410 including the pixel electrode 446, the data buffer pattern 445 and the data pad terminal 448 thereon.

The gate and data pad portions are exposed through the pad open process of FIG. 10 after forming a liquid crystal panel, wherein the gate insulating layer 420 on the gate electrode 416 is also removed, thereby exposing a second layer 416b of the gate electrode 416.

FIGS. 23A to 23F, FIGS. 24A to 24F, and FIGS. 25A to 25F illustrate a method of manufacturing an array substrate according to a fifth embodiment of the present invention.

Figure 23A:
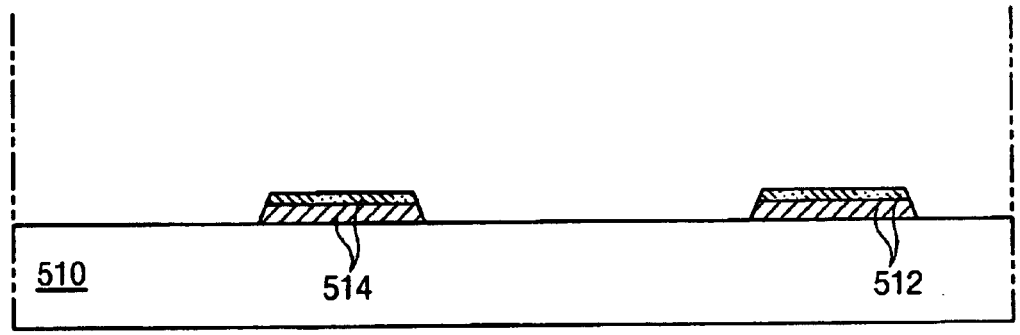
FIGS. 23A to 23F, FIGS. 24A to 24F, and FIGS. 25A to 25F are cross-sectional views illustrating a method of manufacturing an array substrate according to a fifth embodiment of the present invention.
Figure 24A:
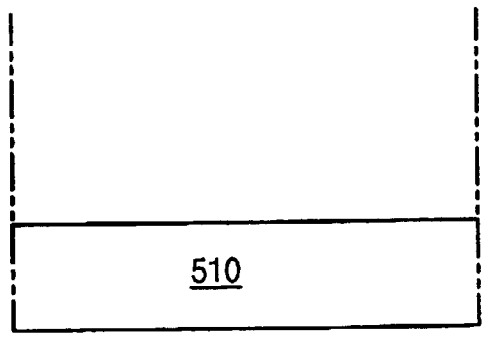
Figure 25A:
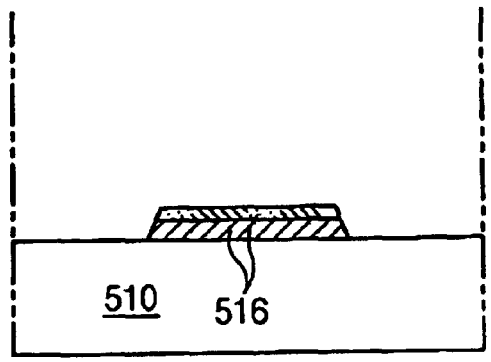

In FIGS. 23A, 24A and 25A, a gate line 512, a gate electrode 514 and a gate pad 516 are formed on a substrate 510 by depositing a first metal layer and patterning it through a first mask process. The first metal layer has a double-layered structure. A lower layer of the first metal layer is selected from a metal material having a relatively low resistivity and an upper layer of the first metal layer is selected from a transparent conductive material.

Figure 23B:
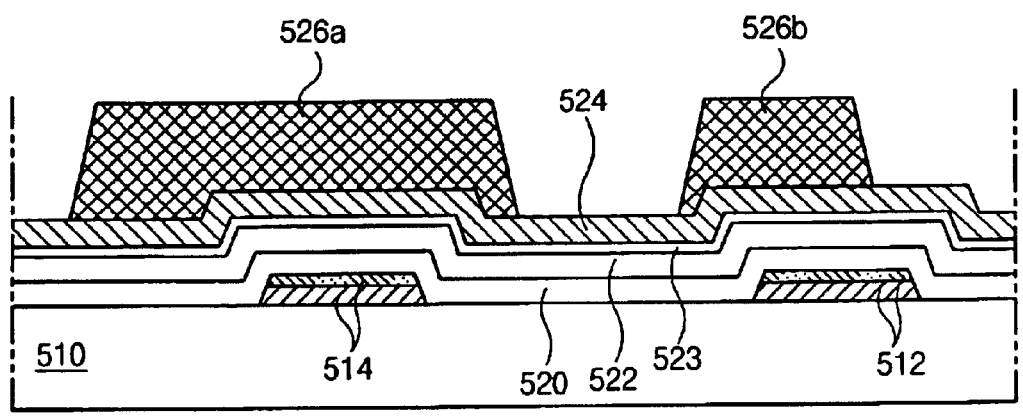
Figure 24B:
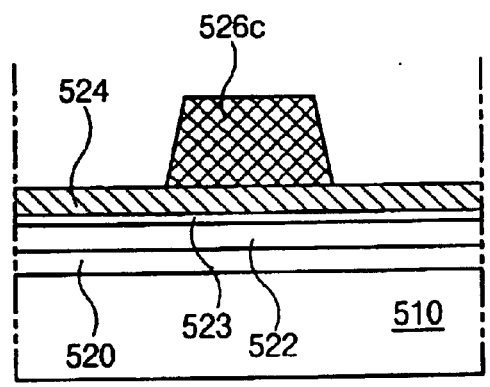
Figure 25B:
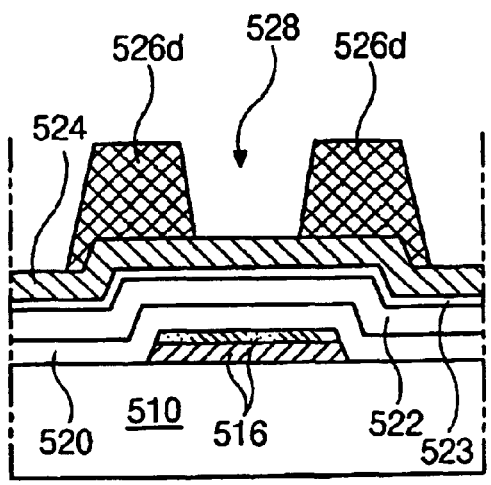

As illustrated in FIGS. 23B, 24B and 25B, a gate insulating layer 520, an amorphous silicon layer 522, a doped amorphous silicon layer 523 and a second metal layer 524 are subsequently deposited on the substrate 510 including the gate line 512, the gate electrode 514 and the gate pad 516 thereon. Next, first, second, third and fourth photoresist patterns 526a, 526b, 526c and 526d are formed on the second metal layer 524 by coating a photoresist layer and exposing and developing the photoresist layer through a second mask process. The first photoresist pattern 526a corresponds to the gate electrode 514, the second photoresist pattern 526b corresponds to the gate line 512, the third photoresist pattern 526c corresponds to a data pad, which will be formed later, and the fourth photoresist pattern 526d corresponds to the gate pad 516. Although not shown in the figures, the first photoresist pattern 526a and the third photoresist pattern 526c are connected to each other. That is, the third photoresist pattern 526c is disposed at one end of the first photoresist pattern 526a. The first, second, third and fourth photoresist patterns 526a, 526b, 526c and 526d have the same thickness. The fourth photoresist pattern 526d includes an opening 528 corresponding to the middle portion of the gate pad 516.

Figure 23C:
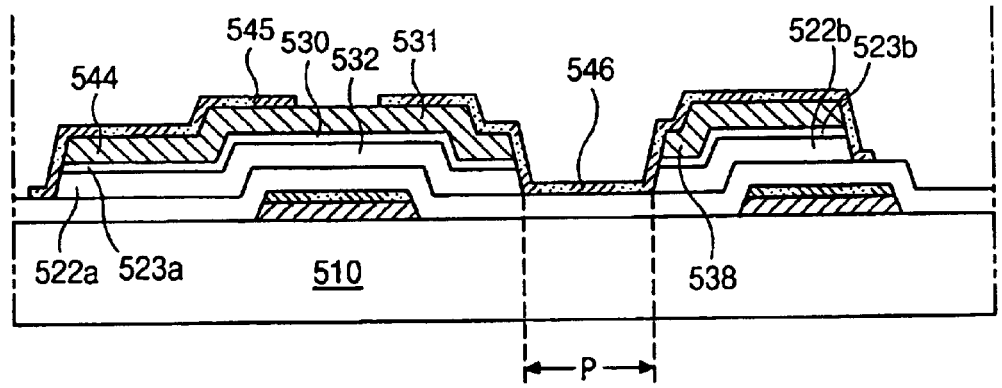
Figure 24C:
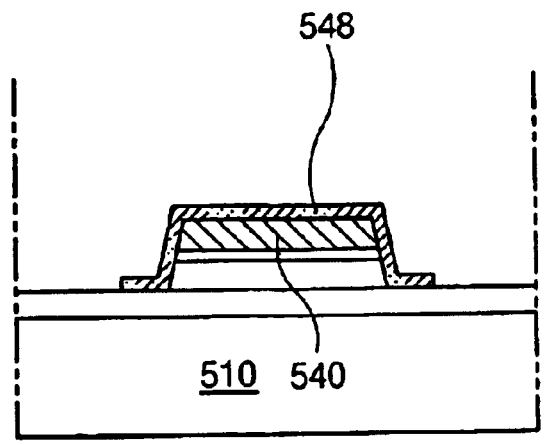
Figure 25C:
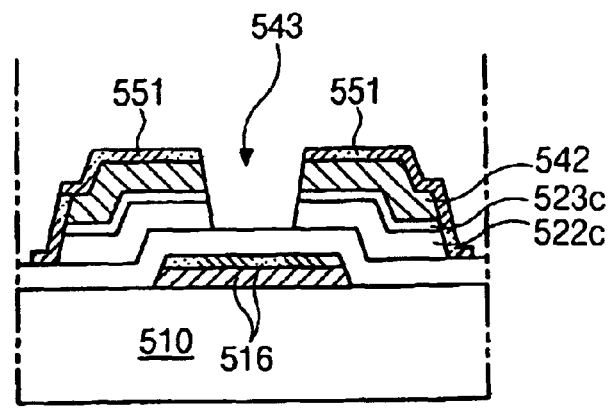

As shown in FIGS. 23C, 24C and 25C, the second metal layer 524, the doped amorphous silicon layer 523 and the amorphous silicon layer 522 of FIGS. 23B, 24B and 25B are etched by using the first, second, third and fourth photoresist patterns 526a, 526b, 526c and 526d of FIGS. 23B, 24B and 25B as etching masks, and thus a data line 544, a source/drain pattern 531, a capacitor electrode 538, a data pad 540, a doped amorphous silicon pattern 530, an active layer 532, and a first gate pad buffer pattern 542 are formed. Here, there exist amorphous silicon layers 522a, 522b and 522c and doped amorphous silicon layers 523a, 523b and 523c under the data line 544 and the data pad 540, the capacitor electrode 538, and the first gate pad buffer pattern 542. The first gate pad buffer pattern 542 has a hole 543 corresponding to the middle portion of the gate pad 516.

Next, the first, second, third and fourth photoresist patterns 526a, 526b, 526c and 526d of FIGS. 23B, 24B and 25B are removed, and a pixel electrode 546, a data buffer pattern 545, a data pad terminal 548 and a second gate pad buffer pattern 551 are formed by depositing a transparent conductive material and patterning it through a third mask process. The pixel electrode 546 is disposed in a pixel region P.

Figure 23D:
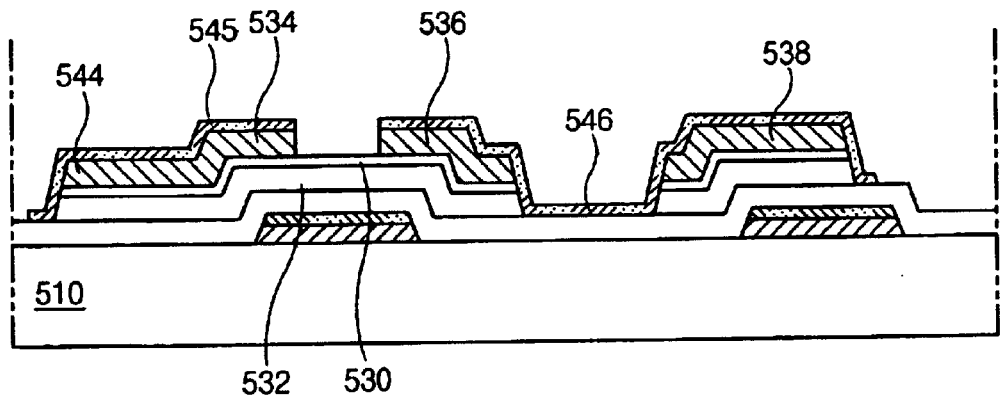
Figure 24D:
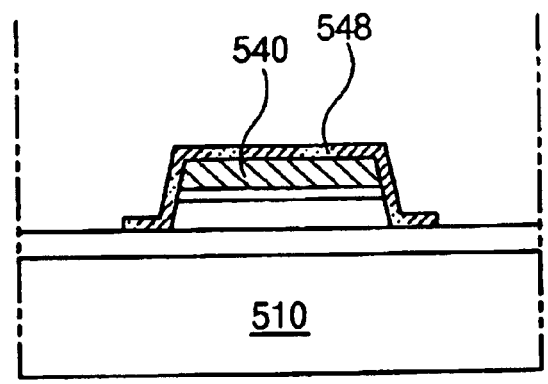
Figure 25D:
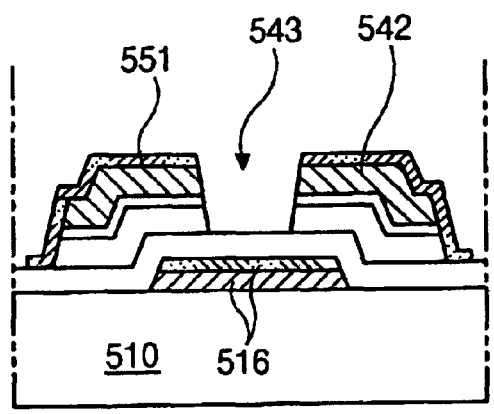

As illustrated in FIGS. 23D, 24D and 25D, the source/drain pattern 531 of FIG. 23C is removed by using the data buffer pattern 545 and the pixel electrode 546 as an etching mask, thereby forming a source electrode 534 and a drain electrode 536 and exposing the doped amorphous silicon pattern 530.

Figure 23E:
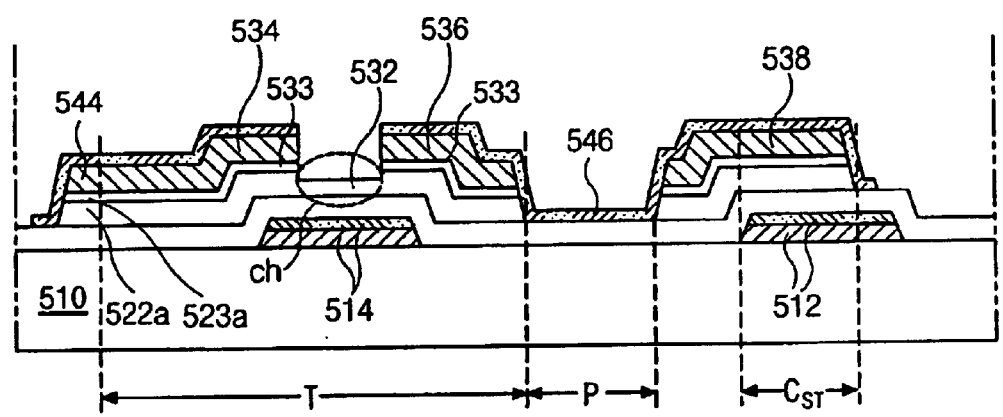
Figure 24E:
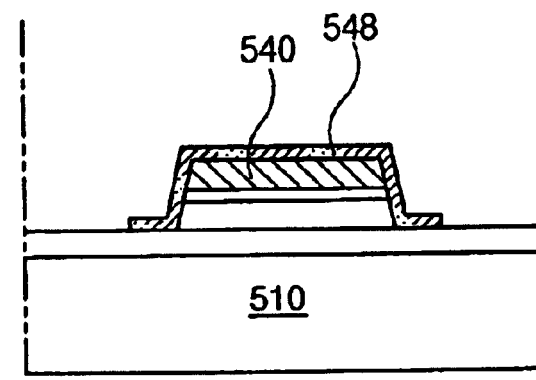
Figure 25E:
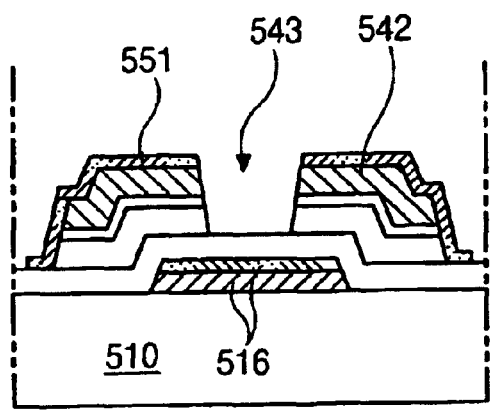

Next, as illustrated in FIGS. 23E, 24E and 25E, the doped amorphous silicon pattern 530 of FIG. 23D is removed by using the source and the drain electrodes 534 and 536 as an etching mask. Thus, an ohmic contact layer 533 is completed and the active layer 532 is exposed. At this time, the active layer 532 may be partially etched. The exposed active layer 532 becomes a channel ch of a thin film transistor T.

The pixel electrode 546 contacts the drain electrode 536 and the capacitor electrode 538. The gate electrode 514, the active layer 532, the source electrode 534 and the drain electrode 536 constitute the thin film transistor T. The capacitor electrode 538 overlaps the gate line 512 to form a storage capacitor $C_{ST}$. The data buffer pattern 545 covers the data line 544 and the source electrode 534, and the data pad terminal 548 covers the data pad 540. The data pad terminal 548 is connected to the data buffer pattern 545.

Figure 23F:
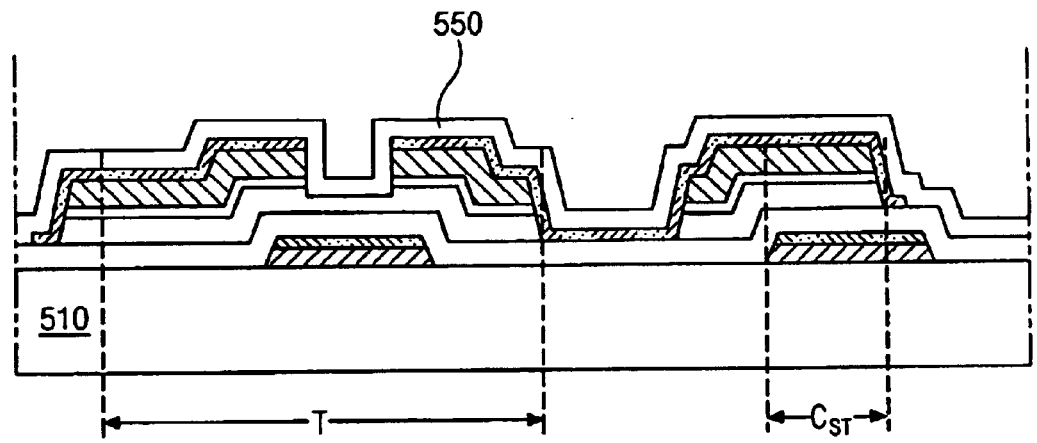
Figure 24F:
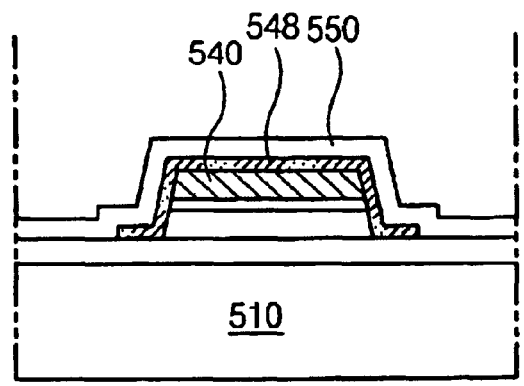
Figure 25F:
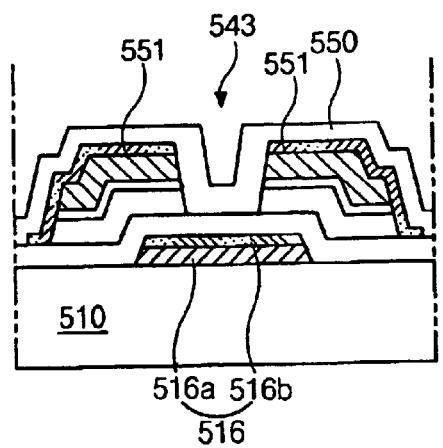

As shown in FIGS. 23F, 24F and 25F, a passivation layer 550 is formed on an entire surface of the substrate 510 including the thin film transistor T, the pixel electrode 546, the storage capacitor $C_{ST}$, and the data pad terminal 548 thereon by depositing or coating an insulating material.

Next, the gate and data pad portions are exposed through the pad open process of FIG. 10 after forming a liquid crystal panel. Therefore, the data pad terminal 548 and the gate pad 516 are exposed.

FIGS. 26A to 26C, FIGS. 27A to 27C, and FIGS. 28A to 28C illustrate a method of manufacturing an array substrate according to a sixth embodiment of the present invention.

Figure 26A:
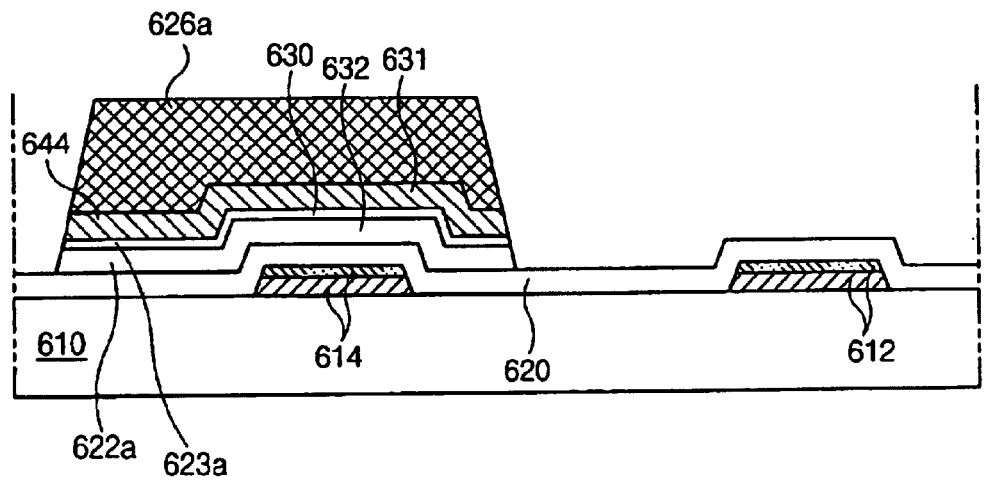
FIGS. 26A to 26C, FIGS. 27A to 27C, and FIGS. 28A to 28C are cross-sectional views illustrating a method of manufacturing an array substrate according to a sixth embodiment of the present invention.
Figure 27A:
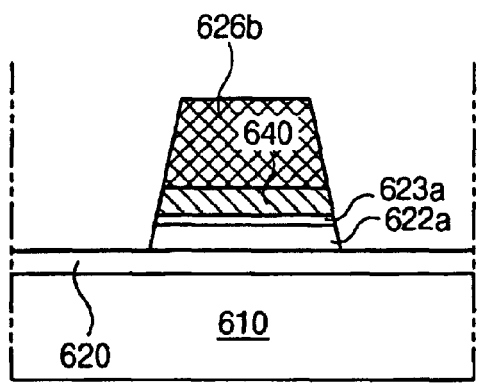
Figure 28A:
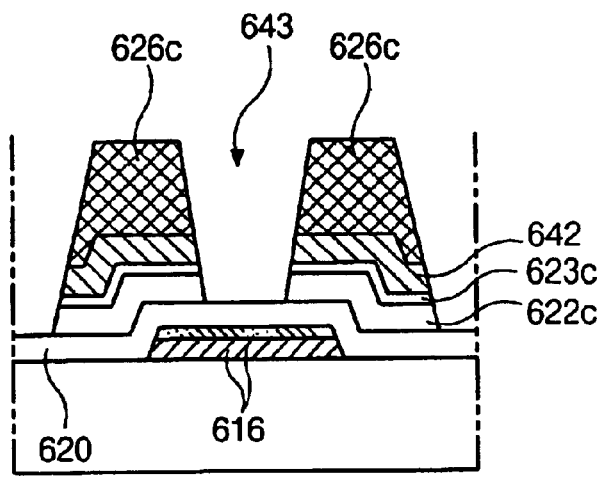

As illustrated in FIGS. 26A, 27A and 28A, a gate line 612, a gate electrode 614 and a gate pad 616 are formed on a substrate 610 by depositing a first metal layer and patterning it through a first mask process. Next, a gate insulating layer 620, an amorphous silicon layer, a doped amorphous silicon layer and a second metal layer are subsequently deposited on the substrate 610, and first, second and third photoresist patterns 626a, 626b and 626c are formed on the second metal layer by coating a photoresist layer and exposing and developing the photoresist layer through a second mask process. The first photoresist pattern 626a corresponds to the gate electrode 614, the second photoresist pattern 626b corresponds to a data pad, which will be formed later, and the third photoresist pattern 626c corresponds to the gate pad 616. Although not shown in the figures, the first photoresist pattern 626a and the second photoresist pattern 626b are connected to each other. That is, the second photoresist pattern 626b is disposed at one end of the first photoresist pattern 626a. The first, second and third photoresist patterns 626a, 626b and 626c have the same thickness. The third photoresist pattern 626c includes an opening corresponding to the middle portion of the gate pad 616.

Next, the second metal layer, the doped amorphous silicon layer and the amorphous silicon layer are etched by using the first, second and third photoresist patterns 626a, 626b and 626c as etching masks, and thus a data line 644, a source/drain pattern 631, a data pad 640, a doped amorphous silicon pattern 630, an active layer 632, and a first gate pad buffer pattern 642 are formed. Here, there exist amorphous silicon layers 622a and 622c and doped amorphous silicon layers 623a and 623c under the data line 644 and the data pad 540 and the first gate pad buffer pattern 642, respectively. The first gate pad buffer pattern 642 has a hole 643 corresponding to the middle portion of the gate pad 616.

Figure 26B:
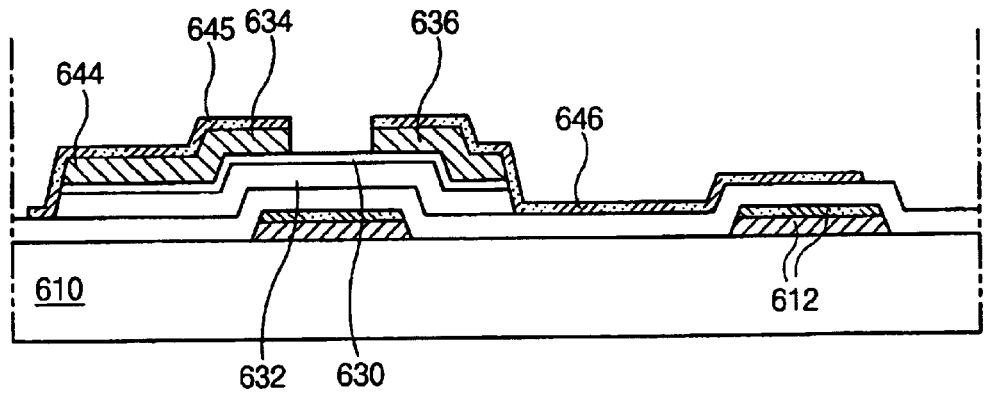
Figure 27B:
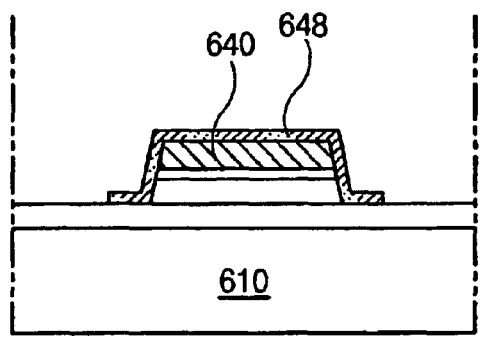
Figure 28B:
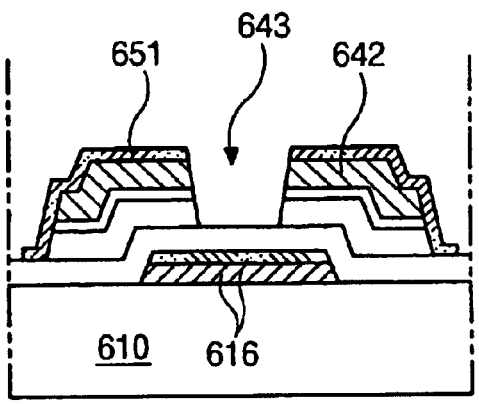

As illustrated in FIGS. 26B, 27B and 28B, the first, second and third photoresist patterns 626a, 626b and 626c of FIGS. 26A, 27A and 28A are removed, and a pixel electrode 646, a data buffer pattern 645, a data pad terminal 648 and a second gate pad buffer pattern 651 are formed by depositing a transparent conductive material and patterning it through a third mask process. Subsequently, the source/drain pattern 631 of FIG. 26A is patterned by using the data buffer pattern 645 and the pixel electrode 646 as an etching mask, thereby forming a source electrode 634 and a drain electrode 636 and exposing the doped amorphous silicon pattern 630.

Figure 26C:
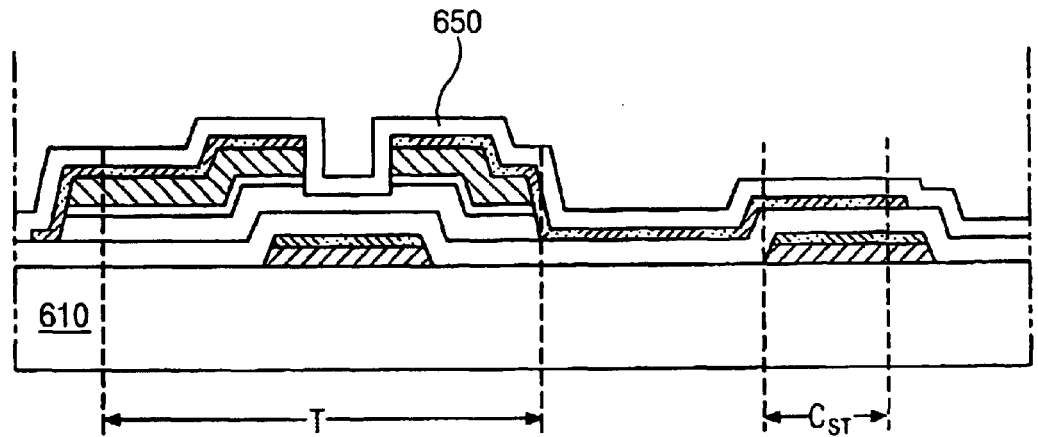
Figure 27C:
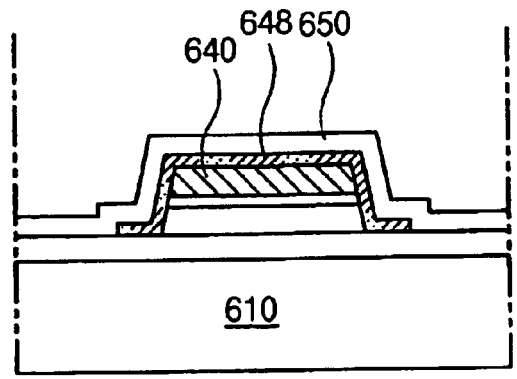
Figure 28C:
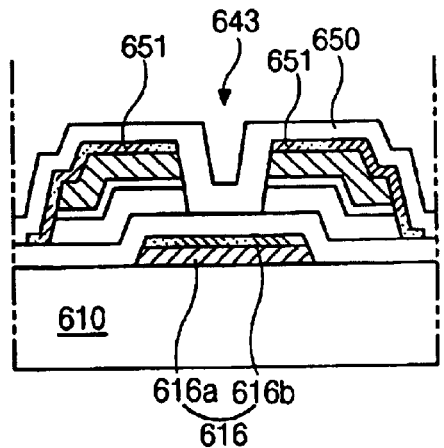

As illustrated in FIGS. 26C, 27C and 28C, the doped amorphous silicon pattern 630 of FIG. 26B is etched by using the source and the drain electrodes 634 and 636 as an etching mask. Next, a passivation layer 650 is formed on an entire surface of the substrate 610 including a thin film transistor T, the pixel electrode 646, a storage capacitor $C_{ST}$, and the data pad terminal 648 thereon by depositing or coating an insulating material, wherein the storage capacitor $C_{ST}$ includes the pixel electrode 646 and the gate line 612.

The array substrate of the sixth embodiment will go through the pad open process after attaching with a color filter substrate.

FIGS. 29A to 29F, FIGS. 30A to 30F, and FIGS. 31A to 31F illustrate a method of manufacturing an array substrate according to a seventh embodiment of the present invention.

Figure 29A:
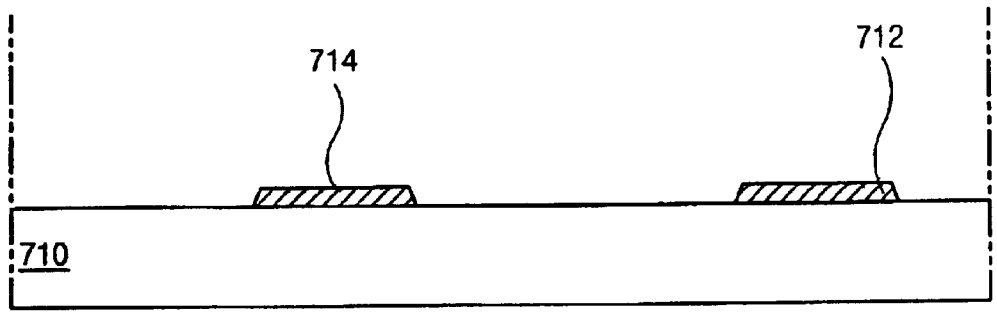
FIGS. 29A to 29F, FIGS. 30A to 30F, and FIGS. 31A to 31F are cross-sectional views illustrating a method of manufacturing an array substrate according to a seventh embodiment of the present invention.
Figure 30A:
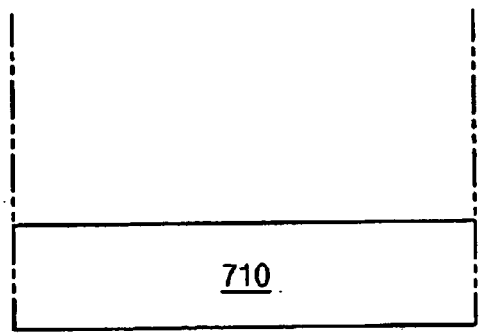
Figure 31A:
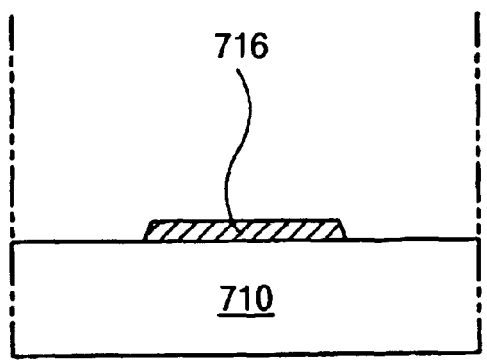

In FIGS. 29A, 30A and 31A, a gate line 712, a gate electrode 714 and a gate pad 716 are formed on a substrate 710 by depositing a first metal layer and patterning it through a first mask process. The first metal layer may be a single layer having a relative low resistivity.

Figure 29B:
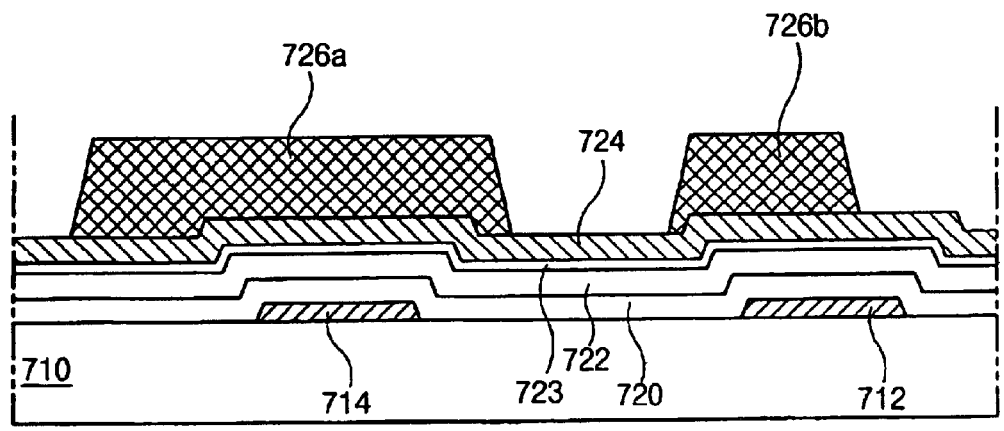
Figure 30B:
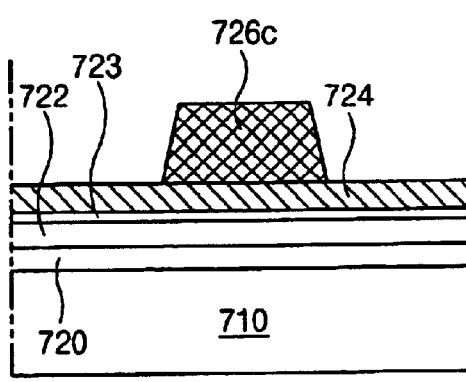
Figure 31B:
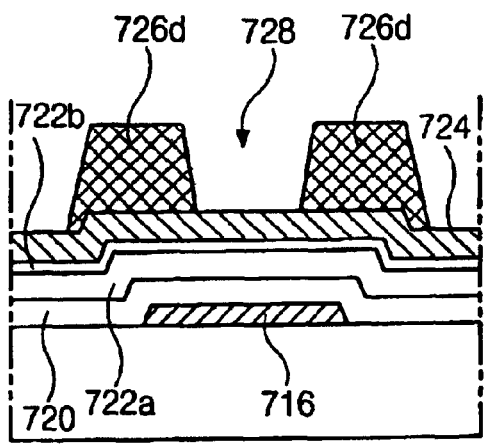

As illustrated in FIGS. 29B, 30B and 31B, a gate insulating layer 720, an amorphous silicon layer 722, a doped amorphous silicon layer 723 and a second metal layer 724 are subsequently deposited on the substrate 710 including the gate line 712, the gate electrode 714 and the gate pad 716 thereon. Next, first, second, third and fourth photoresist patterns 726a, 726b, 726c and 726d are formed on the second metal layer 724 by coating a photoresist layer and exposing and developing the photoresist layer through a second mask process. The first photoresist pattern 726a corresponds to the gate electrode 714, the second photoresist pattern 726b corresponds to the gate line 714, the third photoresist pattern 726c corresponds to a data pad, which will be formed later, and the fourth photoresist pattern 726d corresponds to the gate pad 716. Although not shown in the figures, the first photoresist pattern 726a and the third photoresist pattern 726c are connected to each other. That is, the third photoresist pattern 726c is disposed at one end of the first photoresist pattern 726a. The first, second, third and fourth photoresist patterns 726a, 726b, 726c and 726d have the same thickness. The fourth photoresist pattern 726d includes an opening 728 corresponding to the middle portion of the gate pad 716.

Figure 29C:
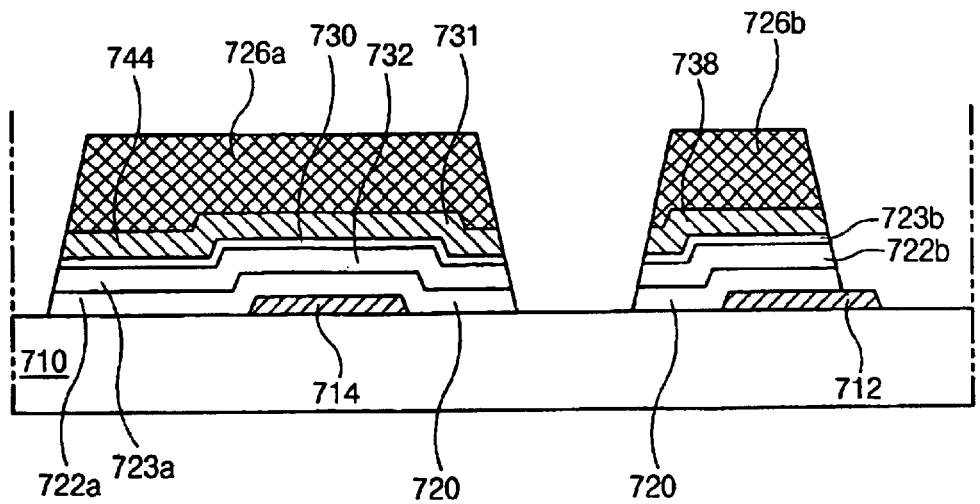
Figure 30C:
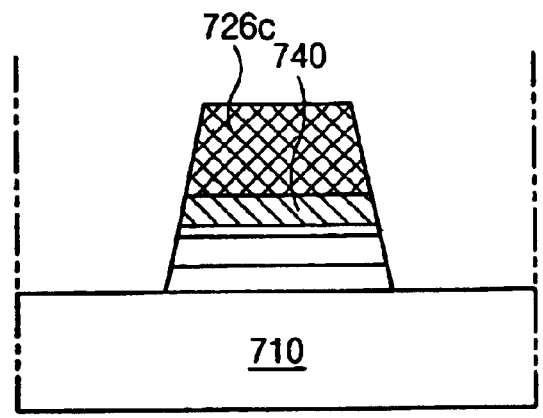
Figure 31C:
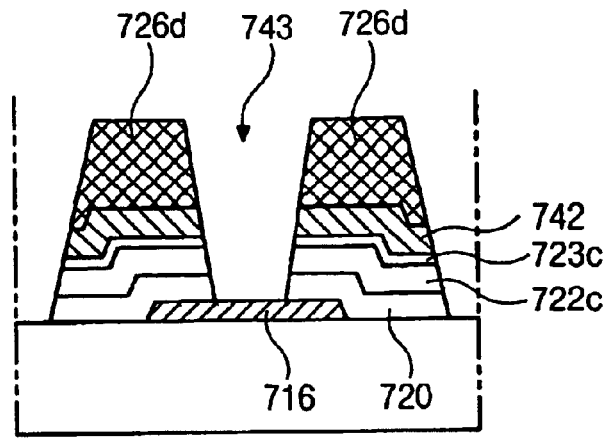

As shown in FIGS. 29C, 30C and 31C, the second metal layer 724, the doped amorphous silicon layer 723 and the amorphous silicon layer 722 of FIGS. 29B, 30B and 31B are etched by using the first, second, third and fourth photoresist patterns 726a, 726b, 726c and 726d as etching masks, and thus a data line 744, a source/drain pattern 731, a capacitor electrode 738, a data pad 740, a doped amorphous silicon pattern 730, an active layer 732, and a gate pad buffer pattern 742 are formed. Here, there exist amorphous silicon layers 722a, 722b and 722c and doped amorphous silicon layers 723a, 723b and 723c under the data line 744 and the data pad 740, the capacitor electrode 738, and the first gate pad buffer pattern 742. At this time, the gate insulating layer 720 is also etched and the gate pad 716 is exposed by a contact hole 743 formed in the gate pad buffer pattern 742, the doped amorphous silicon layer 723c, the amorphous silicon layer 722c and the gate insulating layer 720.

Figure 29D:
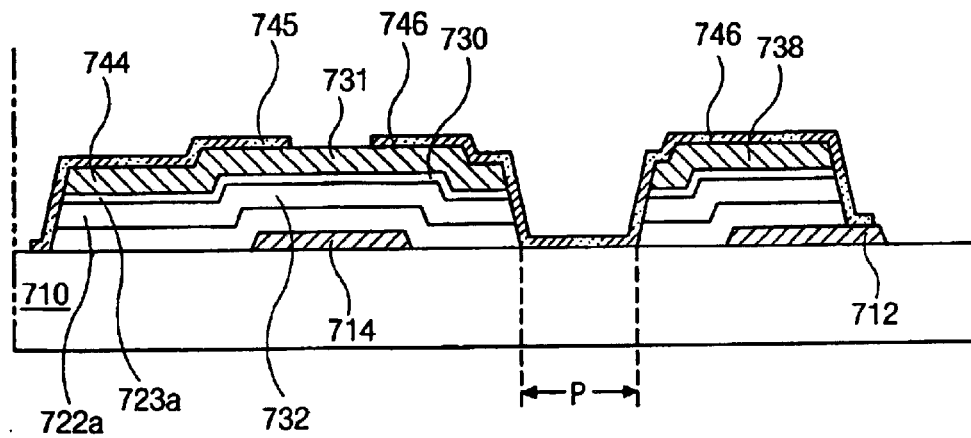
Figure 30D:
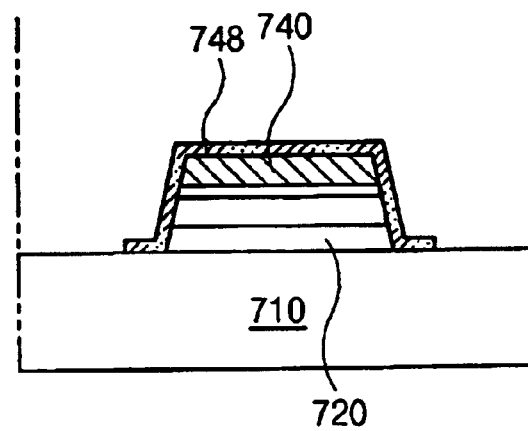
Figure 31D:
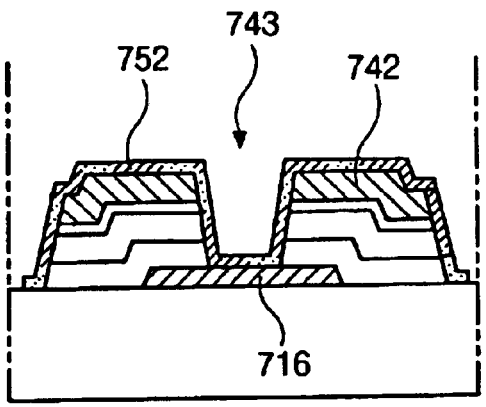

Next, as illustrated in FIGS. 29D, 30D and 31D, the first, second, third and fourth photoresist patterns 726a, 726b, 726c and 726d of FIGS. 29C, 30C and 31C are removed, and a pixel electrode 746, a data buffer pattern 745, a data pad terminal 748 and a gate pad terminal 752 are formed by depositing a transparent conductive material and patterning it through a third mask process. The pixel electrode 746 is disposed in a pixel region P.

Figure 29E:
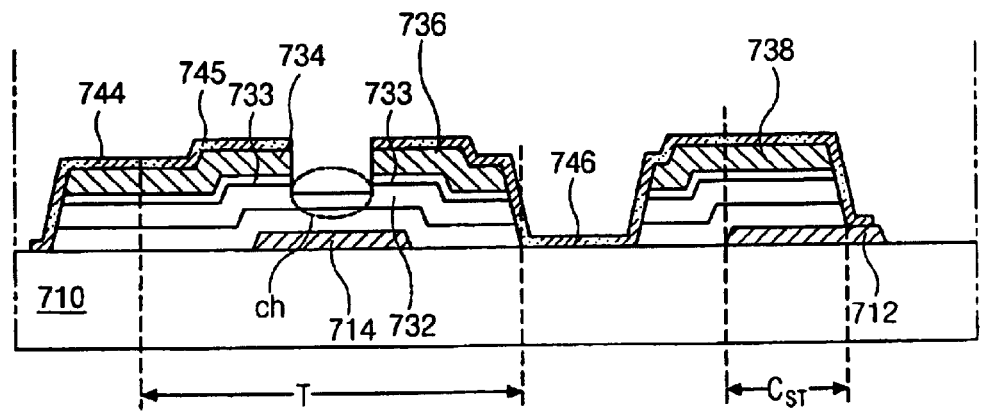
Figure 30E:
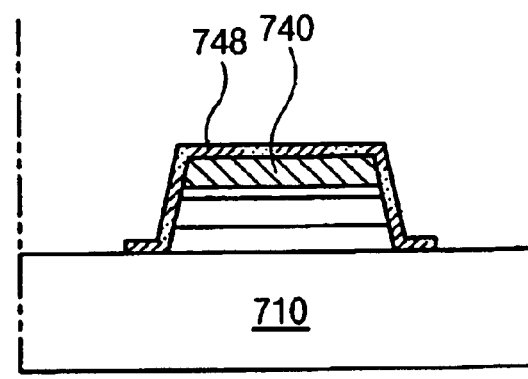
Figure 31E:
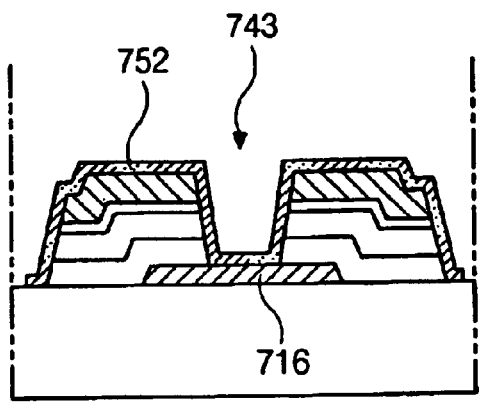

As illustrated in FIGS. 29E, 30E and 31E, the source/drain pattern 731 and the doped amorphous silicon pattern 730 of FIG. 29D are removed by using the data buffer pattern 745 and the pixel electrode 746 as an etching mask, thereby forming a source electrode 734, a drain electrode 736 and an ohmic contact layer 733 and exposing the active layer 732. At this time, the active layer 732 may be partially removed. The exposed active layer 732 becomes a channel ch of a thin film transistor T.

The pixel electrode 746 contacts the drain electrode 736 and the capacitor electrode 738, and covers them. The gate electrode 714, the active layer 732, the source electrode 734 and the drain electrode 736 constitute the thin film transistor T. The capacitor electrode 738 overlaps the gate line 712 to form a storage capacitor $C_{ST}$. The data buffer pattern 745 covers the data line 744 and the source electrode 734, and the data pad terminal 748 covers the data pad 740. The data pad terminal 748 is connected to the data buffer pattern 745. In addition, the gate pad terminal 752 is connected to the gate pad 716 through the contact hole 743.

Figure 29F:
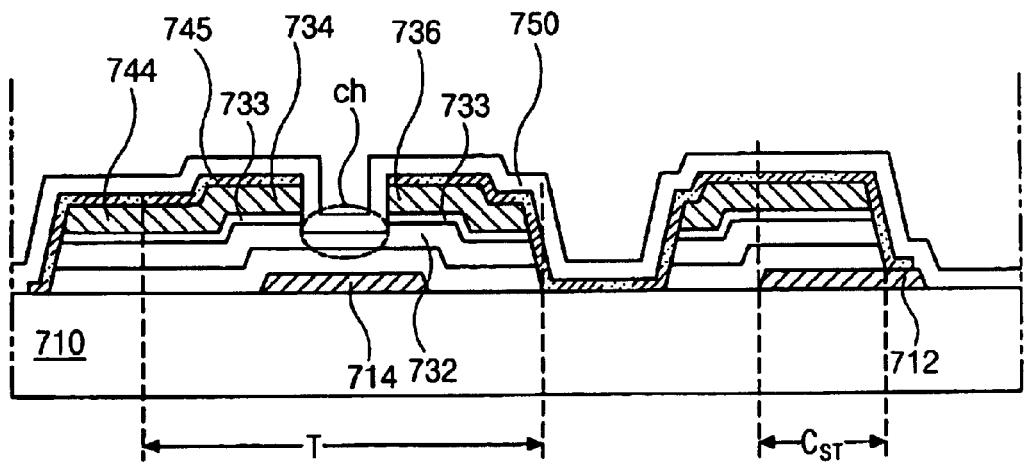
Figure 30F:
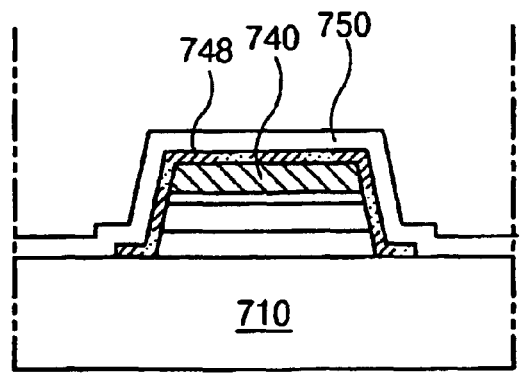
Figure 31F:
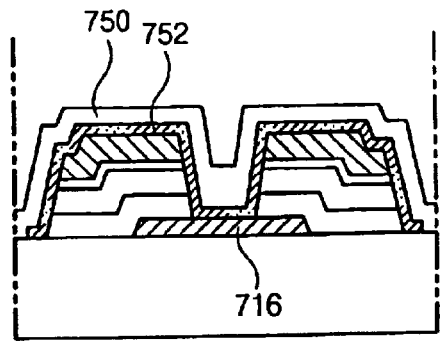

As shown in FIGS. 29F, 30F and 31F, a passivation layer 750 is formed on an entire surface of the substrate 710 including the thin film transistor T, the pixel. electrode 746, the storage capacitor $C_{ST}$, the data pad terminal 748 and the gate pad terminal 752 thereon by depositing or coating an insulating material.

Next, the gate and data pad portions are exposed through the pad open process of FIG. 10 after forming a liquid crystal panel. At this time, only the passivation layer 750 in the gate and data pad portions may be removed, and thus the data pad terminal 748 and the gate pad terminal 752 may be exposed.

FIGS. 32A to 32G, FIGS. 33A to 33G, and FIGS. 34A to 34G illustrate a method of manufacturing an array substrate according to an eighth embodiment of the present invention.

Figure 32A:
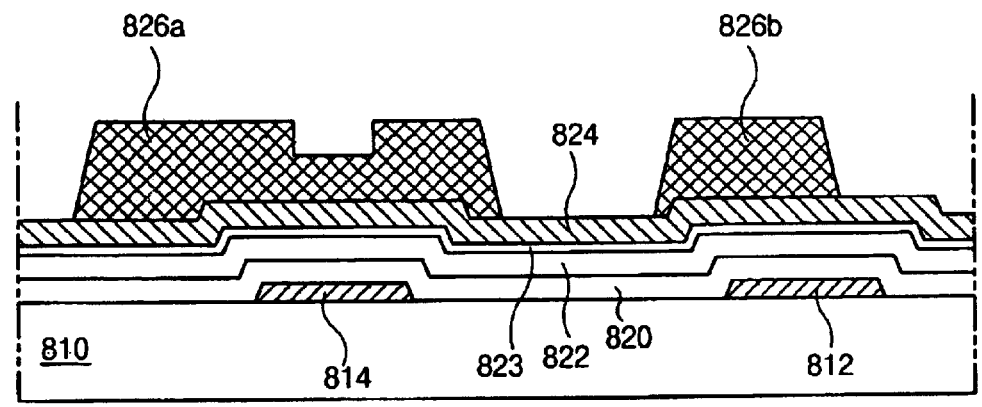
FIGS. 32A to 32G, FIGS. 33A to 33G, and FIGS. 34A to 34G are cross-sectional views illustrating a method of manufacturing an array substrate according to an eighth embodiment of the present invention.
Figure 33A:
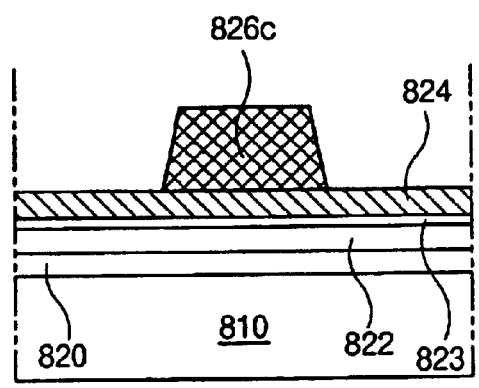
Figure 34A:
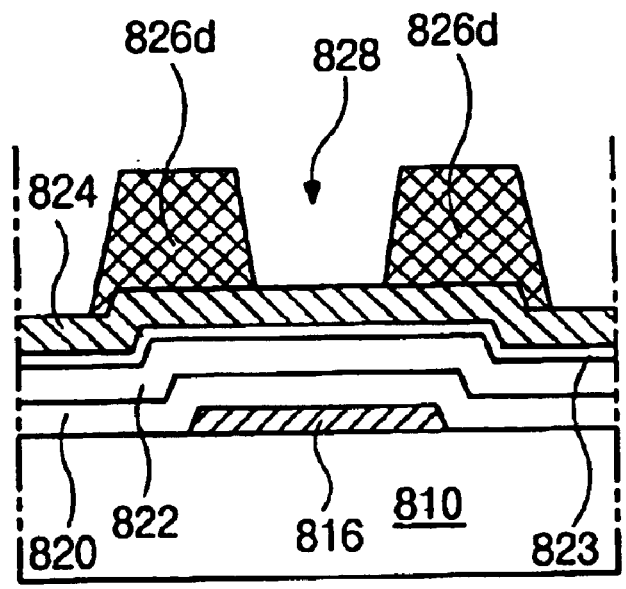

As shown in FIGS. 32A, 33A and 34A, a gate line 812, a gate electrode 814 and a gate pad 816 are formed on a substrate 810 by depositing a first metal layer and patterning it through a first mask process. The first metal layer may be a single layer having a relatively low resistivity. A gate insulating layer 820, an amorphous silicon layer 822, a doped amorphous silicon layer 823 and a second metal layer 824 are subsequently deposited on the substrate 810 including the gate line 812, the gate electrode 814 and the gate pad 816 thereon. Next, a photoresist layer is coated on the second metal layer 824, and the photoresist layer is exposed to light and developed through a second mask process, thereby forming first, second, third and fourth photoresist patterns 826a, 826b, 826c and 826d.

The first photoresist pattern 826a corresponds to the gate electrode 814, the second photoresist pattern 826b corresponds to the gate line 814, the third photoresist pattern 826c corresponds to a data pad, which will be formed later, and the fourth photoresist pattern 826d corresponds to the gate pad 816. Although not shown in the figures, the first photoresist pattern 826a and the third photoresist pattern 826c are connected to each other. That is, the third photoresist pattern 826c is disposed at one end of the first photoresist pattern 826a. The first photoresist pattern 826a covers the gate electrode 814 and has a first thickness and a second thickness, wherein the second thickness is thinner than the first thickness and corresponds to the middle portion of the gate electrode 814 due to diffraction exposure. The second, third and the fourth photoresist patterns 826b, 826c and 826d have the same thickness as the first thickness of the first photoresist pattern 826a. The fourth photoresist pattern 826d also includes an opening 828 corresponding to the middle portion of the gate pad 816.

In the diffraction exposure, a halftone mask or a slit mask is used, and thus an expected portion of the photoresist layer is selectively formed thinner than other portions without an additional mask process.

Figure 32B:
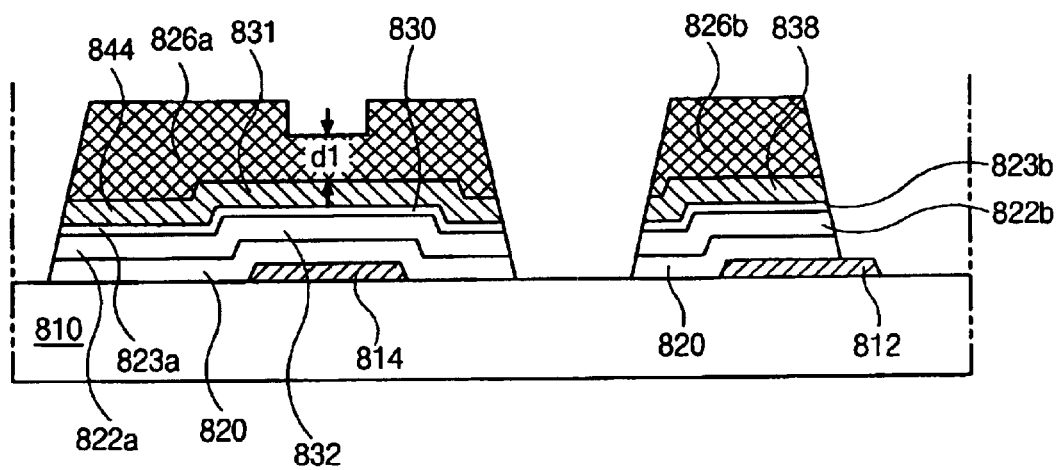
Figure 33B:
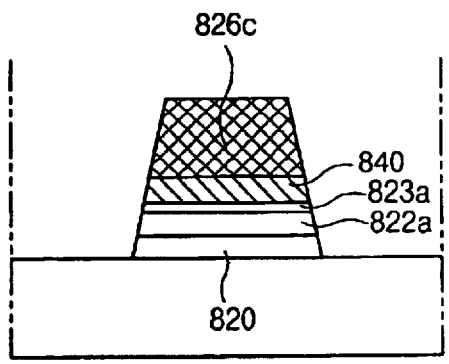
Figure 34B:
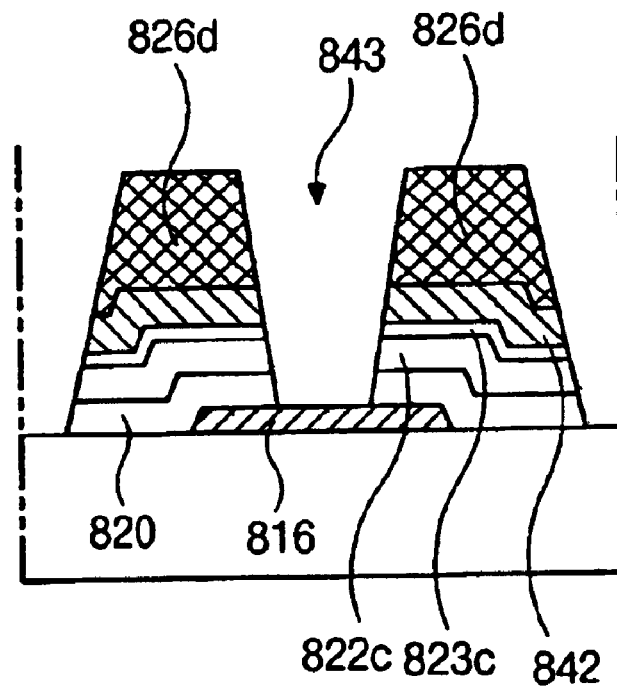

As illustrated in FIGS. 32B, 33B and 34B, the second metal layer 824, the doped amorphous silicon layer 823 and the amorphous silicon layer 822 are patterned by using the first, second, third and fourth photoresist patterns 826a, 826b, 826c and 826d as an etching mask, and thus a data line 844, a source/drain pattern 831, a capacitor electrode 838, a data pad 840, a doped amorphous silicon pattern 830, an active layer 832, and a gate pad buffer pattern 842 are formed. Here, there exist amorphous silicon layers 822a, 822b and 822c and doped amorphous silicon layers 823a, 823b and 823c under the data line 844 and the data pad 840, the capacitor electrode 838, and the gate pad buffer pattern 842.

At this time, the gate insulating layer 820 is also etched and the gate pad 816 is exposed by a contact hole 843 formed in the gate pad buffer pattern 842, the doped amorphous silicon layer 823c, the amorphous silicon layer 822c and the gate insulating layer 820.

Figure 32C:
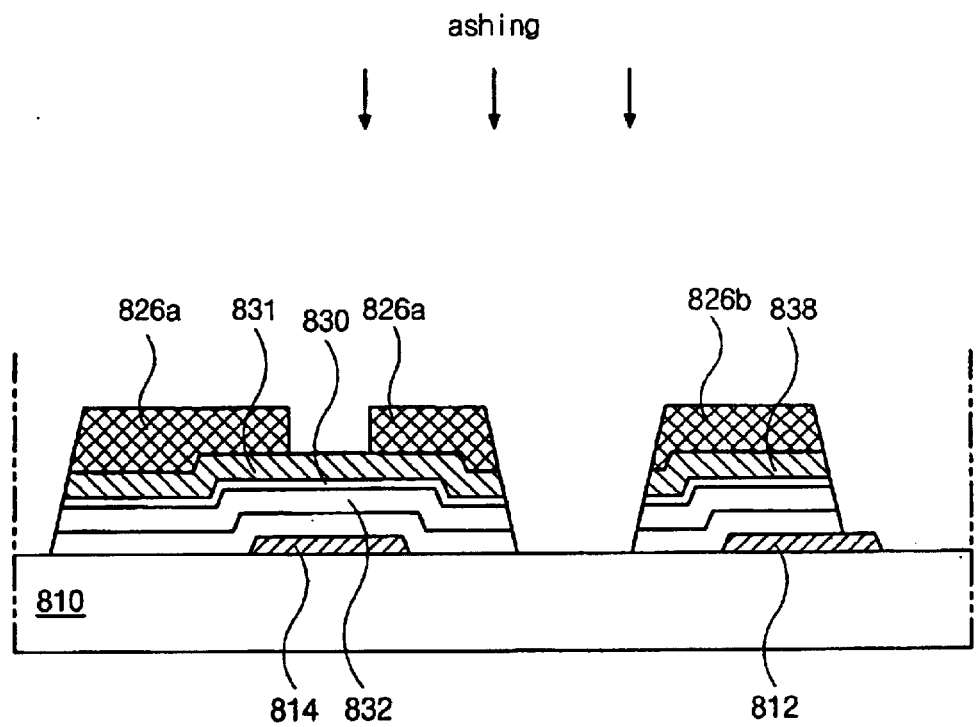
Figure 33C:
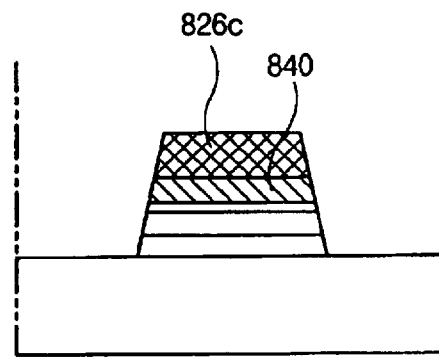
Figure 34C:
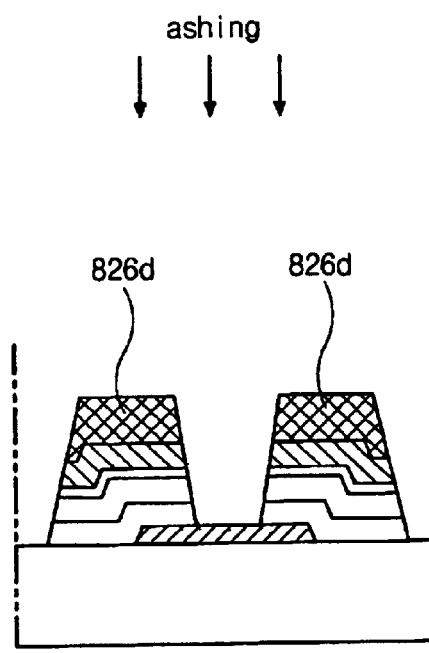

As illustrated in FIGS. 32C, 33C and 34C, the second thickness d1 of the first photoresist pattern 826a of FIG. 32B is removed through an ashing process, and thus the middle portion of the source/drain pattern 831 of FIG. 32C is exposed. At this time, the first, second, third and fourth photoresist patterns 826a, 826b, 826c and 826d having the first thickness are also removed partially and the first, second, third and fourth photoresist patterns 826a, 826b, 826c and 826d are thinned.

Figure 32D:
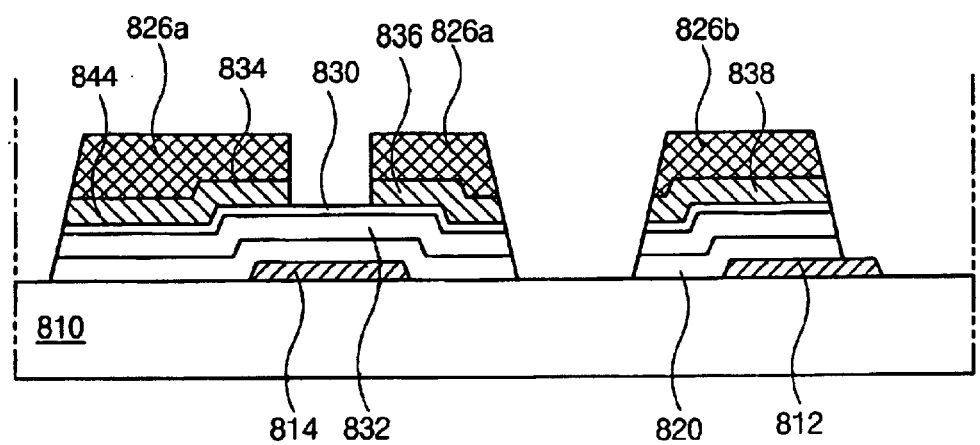
Figure 33D:
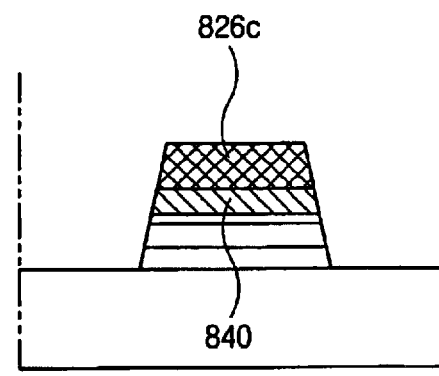
Figure 34D:
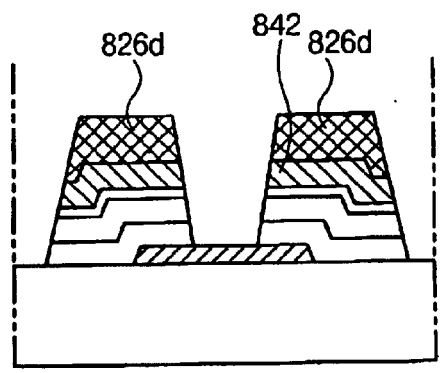

Next, as illustrated in FIGS. 32D, 33D and 34D, the exposed source/drain pattern 831 of FIG. 32C is removed, thereby forming a source electrode 834 and a drain electrode 836 and exposing the doped amorphous silicon pattern 830.

The data pad 840 is disposed at one end of the data line 844. The source electrode 834 is connected to the data line 844 and the drain electrode 836 is spaced apart from the source electrode 834 over the gate electrode 814. The capacitor electrode 838 overlaps the gate line 812.

Figure 32E:
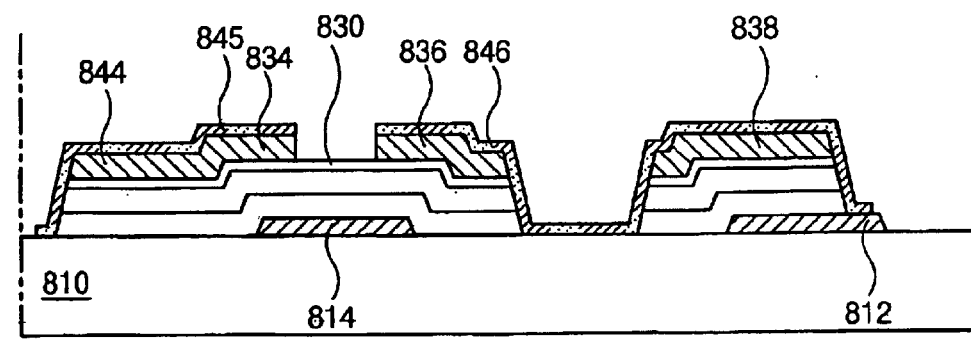
Figure 33E:
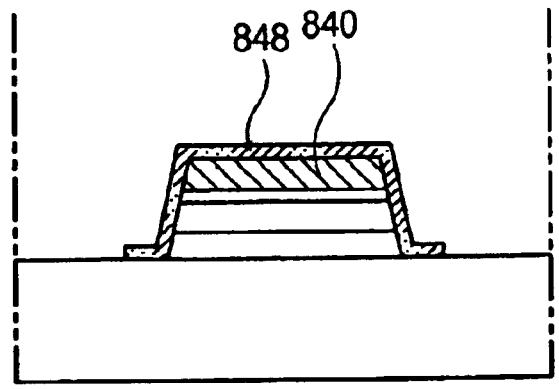
Figure 34E:
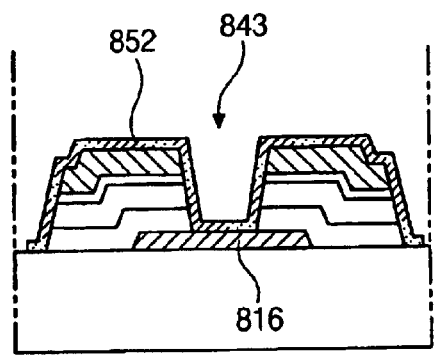

As shown in FIGS. 32E, 33E and 34E, the remaining photoresist patterns 826a, 826b, 826c and 826d are removed, and a pixel electrode 846, a data buffer pattern 845, a data pad terminal 848 and a gate pad terminal 852 are formed on the substrate 810 including the data line 844, the source electrode 834, the drain electrode 836, the capacitor electrode 838, the data pad 840, and the gate pad buffer pattern 842 thereon by depositing a transparent conductive material and patterning it through a third mask process. The pixel electrode 846 contacts the drain electrode 836 and the capacitor electrode 838, and covers them. The data buffer pattern 845 covers the data line 844 and the source electrode 834 and the data pad terminal 848 covers the data pad 840. The data pad terminal 848 is connected to the data buffer pattern 845. The gate pad terminal 852 is connected to the gate pad 816 through the contact hole 843.

Figure 32F:
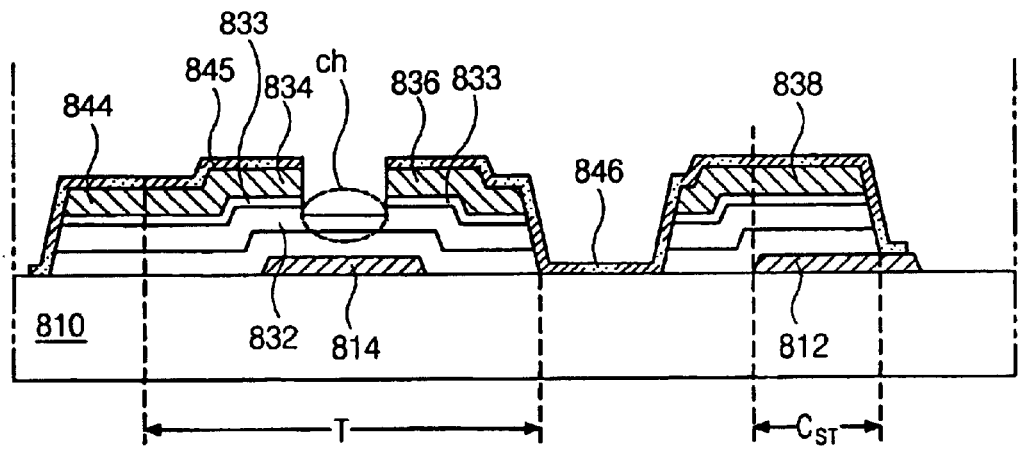
Figure 33F:
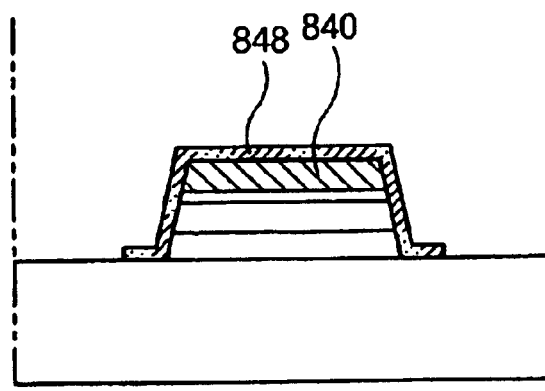
Figure 34F:
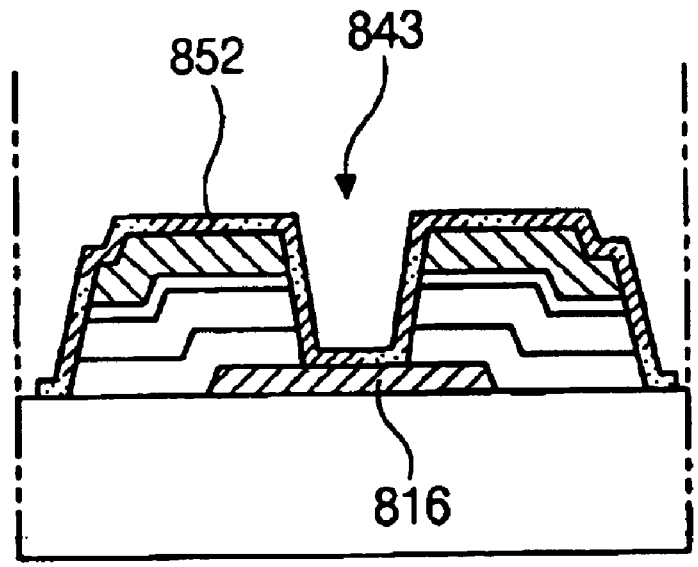

As illustrated in FIGS. 32F, 33F and 34F, the doped amorphous silicon pattern 830 of FIG. 32E exposed between the source electrode 834 and the drain electrode 836 is removed. Thus, an ohmic contact layer 833 is completed and the active layer 832 is exposed. At this time, the active layer 832 may be partially etched. The exposed active layer 832 becomes a channel ch of a thin film transistor T. As stated above, the pixel electrode 846 contacts the capacitor electrode 838 and the capacitor electrode 838 overlaps the gate line 812 to form a storage capacitor $C_{ST}$.

Figure 32G:
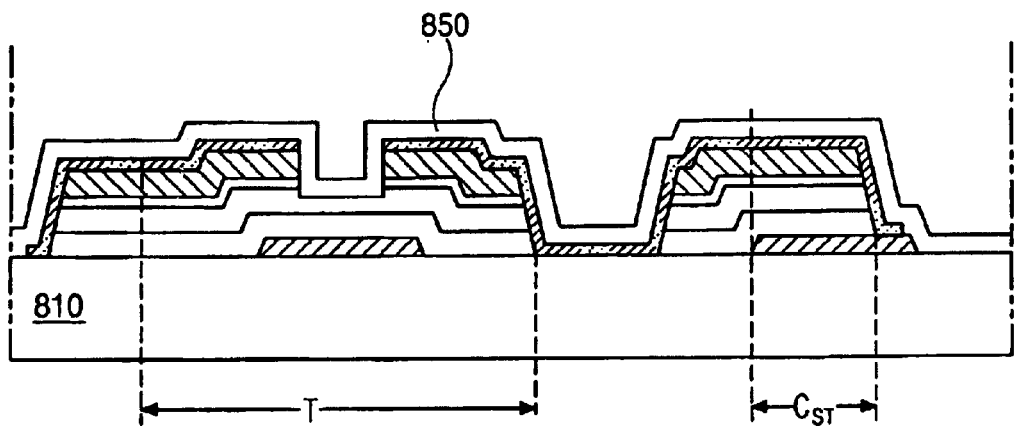
Figure 33G:
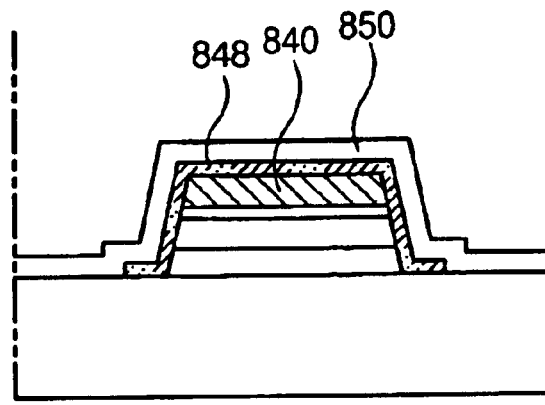
Figure 34G:
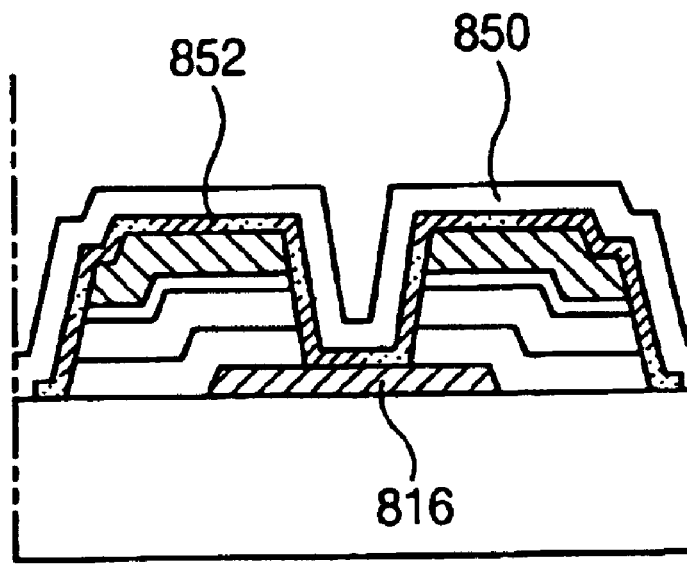

Next, as illustrated in FIGS. 32G, 33G and 34G, a passivation layer 850 is formed on an entire surface of the substrate 810 including the thin film transistor T, the pixel electrode 846, the storage capacitor $C_{ST}$, the data pad terminal 848 and the gate pad terminal 852 thereon by depositing or coating an insulating material.

The gate and data pad portions may be exposed through the pad open process of FIG. 10 after forming a liquid crystal panel. At this time, only the passivation layer 50 in the gate and data pad portions may be removed, and thus the data pad terminal 848 and the gate pad terminal 852 may be exposed The array substrate of the present invention is manufactured using, three masks. Therefore, the manufacturing method of the array substrate according to the present invention decreases the processes and the cost, and increases productivity.

It will be apparent to those skilled in the art that various modifications and variations can be made in the fabrication and application of the present invention without departing from the spirit or scope of the invention. Thus, it is intended that the present invention cover the modifications and variations of this invention provided they come within the scope of the appended claims and their equivalents.

What is claimed is:

1. A method of manufacturing a liquid crystal display device, comprising:

forming a gate line, a gate pad and a gate electrode on a first substrate through a first mask process;

forming a data line, a data pad, a source electrode, a drain electrode and an active layer on the first substrate including the gate line, the gate pad and the gate electrode through a second mask process; forming a pixel electrode and a data pad terminal on the first substrate including the data line, the data pad, the source electrode and the drain electrode through a third mask process;

forming a passivation layer on an entire surface of the first substrate including the pixel electrode and the data pad terminal;

attaching the first substrate including the passivation layer with a second substrate, wherein a gate pad portion including the gate pad and a data pad portion including the data pad are exposed by the second substrate;

providing a liquid crystal material into a gap between the first and second substrates; and removing the passivation layer in the gate and data pad portions exposed by the second substrate.

2. The method of claim 1, wherein providing a liquid material includes injecting the liquid crystal material.

3. The method of claim 1, wherein providing a liquid crystal material includes applying the liquid crystal material.

4. The method according to claim 1, wherein removing the passivation layer in the gate and data pad portions includes dipping the liquid crystal display device into an etchant.

5. The method according to claim 4, wherein the passivation layer is made of one of silicon nitride and silicon oxide.

6. The method according to claim 5, wherein the etchant includes fluoride acid (HF).

7. The method according to claim 1, wherein the second mask process includes:

forming a gate insulating layer on the first substrate including the gate line, the gate electrode and the gate pad;

depositing an amorphous silicon layer, a doped amorphous silicon layer and a metal layer over the gate insulating layer;

providing a photoresist pattern having first and second thicknesses over the second metal layer, wherein the second thickness is smaller than the first thickness;

selectively removing portions of the metal layer, the doped amorphous silicon layer and the amorphous silicon layer according to the photoresist pattern;

removing a portion of the photoresist pattern having the second thickness;

selectively etching the metal layer exposed by removing the portion of the photoresist pattern having the second thickness; and removing the remaining photoresist pattern.

8. The method according to claim 7, wherein the third mask process includes selectively etching the doped amorphous silicon layer exposed by the selective etching of the metal layer exposed by removing the photoresist pattern having the second thickness.

9. The method according to claim 7, wherein the second mask process further includes selectively removing the gate insulating layer.

10. The method according to claim 1, wherein the third mask process includes forming a data buffer pattern covering the data line and the source electrode.

11. The method according to claim 1, wherein the gate line, the gate electrode and the gate pad include aluminum.

12. The method according to claim 11, wherein the gate line, the gate electrode and the gate pad further include a transparent conductive material layer.

13. The method according to claim 1, wherein an amorphous silicon layer and a doped amorphous silicon layer are formed under the data line and the data pad.

14. The method according to claim 1, wherein the second mask process includes a a capacitor electrode over the gate line.

15. The method according to claim 14, wherein the pixel electrode contacts the capacitor electrode, whereby the capacitor electrode forms a storage capacitor with the gate line.

16. The method according to claim 14, wherein an amorphous silicon layer and a doped amorphous silicon layer are formed under the capacitor electrode.

17. The method according to claim 1, wherein the second mask process further includes a gate pad buffer pattern over the gate pad, the gate pad buffer pattern including a hole corresponding to a middle portion of the gate pad.

18. The method according to claim 17, wherein an amorphous silicon layer and a doped amorphous silicon layer are formed under the gate pad buffer pattern.

19. The method according to claim 17, wherein the third mask process further includes a gate pad terminal connected to the gate pad through the hole corresponding to the middle portion of the gate pad.

20. The method according to claim 1, wherein the second mask process uses a slit mask.

21. The method according to claim 1, wherein the second mask process uses a halftone mask.

22. A method of manufacturing a liquid crystal display device, comprising:

forming a gate line, a gate pad and a gate electrode on a first substrate through a first mask process;

forming a data line, a data pad, a source/drain pattern and an active layer on the first substrate including the gate line, the gate pad and the gate electrode through a second mask process;

forming a pixel electrode, a data buffer pattern and a data pad terminal on the first substrate including the data line, the data pad, the source/drain pattern through a third mask process, and patterning the source/drain pattern by using the pixel electrode and the data buffer pattern as a mask, thereby forming a source electrode and a drain electrode;

forming a passivation layer on an entire surface of the first substrate including the pixel electrode, the data buffer pattern and the data pad terminal;

attaching the first substrate including the passivation layer with a second substrate, wherein a gate pad portion including the gate pad and a data pad portion including the data pad are exposed by the second substrate;

providing a liquid crystal material into a gap between the first and second substrates; and removing the passivation layer in the gate and pad portions exposed by the second substrate.

23. The method according to claim 21, wherein providing a liquid crystal material includes one of injecting and applying the liquid crystal material.

24. The method according to claim 22, wherein removing the passivation layer in the gate and data pad portions includes dipping the liquid crystal display device into an etchant.

25. The method according to claim 24, wherein the passivation layer is made of one of silicon nitride and silicon oxide.

26. The method according to claim 25, wherein the etchant includes fluoride acid (HF).

27. The method according to claim 22, wherein the second mask process includes:

forming a gate insulating layer on the first substrate including the gate line, the gate electrode and the gate pad;

depositing an amorphous silicon layer, a doped amorphous silicon layer and a metal layer over the gate insulating layer;

providing a photoresist pattern over the metal layer;

selectively removing portions of the metal layer, the doped amorphous silicon layer and the amorphous silicon layer according to the photoresist pattern; and removing the remaining photoresist pattern.

28. The method according to claim 27, wherein the third mask process includes selectively etching the doped amorphous silicon layer using the source and drain electrodes as a mask.

29. The method according to claim 27, wherein the second mask process further includes a step of selectively removing the gate insulating layer.

30. The method according to claim 22, wherein the gate line, the gate electrode and the gate pad include aluminum.

31. The method according to claim 30, wherein the gate line, the gate electrode and the gate pad further include a transparent conductive material layer.

32. The method according to claim 22, wherein an amorphous silicon layer and a doped amorphous silicon layer are formed under the data line and the data pad.

33. The method according to claim 22, wherein the second mask process includes a capacitor electrode over the gate line.

34. The method according to claim 33, wherein the pixel electrode contacts the capacitor electrode, whereby the capacitor electrode forms a storage capacitor with the gate line.

35. The method according to claim 33, wherein an amorphous silicon layer and a doped amorphous silicon layer are formed under the capacitor electrode.

36. The method according to claim 33, wherein the second mask process further includes forming a gate pad buffer pattern over the gate pad, the gate pad buffer pattern including a hole corresponding to a middle portion of the gate pad.

37. The method according to claim 36, wherein an amorphous silicon layer and a doped amorphous silicon layer are formed under the gate pad buffer pattern.

38. The method according to claim 36, wherein the third mask process further includes forming a gate pad terminal connected to the gate pad through the hole corresponding to the middle portion of the gate pad.

* * * * *